United States Patent
Drowley et al.

(10) Patent No.: US 11,728,415 B2
(45) Date of Patent: Aug. 15, 2023

(54) METHOD FOR REGROWN SOURCE CONTACTS FOR VERTICAL GALLIUM NITRIDE BASED FETS

(71) Applicant: NEXGEN POWER SYSTEMS, INC., Santa Clara, CA (US)

(72) Inventors: Clifford Drowley, Santa Clara, CA (US); Andrew P. Edwards, Santa Clara, CA (US); Subhash Srinivas Pidaparthi, Santa Clara, CA (US); Shahin Sharifzadeh, Santa Clara, CA (US)

(73) Assignee: Nexgen Power Systems, Inc., Santa Clara, CA (US)

( * ) Notice: Subject to any disclaimer, the term of this patent is extended or adjusted under 35 U.S.C. 154(b) by 0 days.

(21) Appl. No.: 17/211,562

(22) Filed: Mar. 24, 2021

(65) Prior Publication Data
US 2021/0305404 A1 Sep. 30, 2021

Related U.S. Application Data

(60) Provisional application No. 63/000,968, filed on Mar. 27, 2020.

(51) Int. Cl.
*H01L 29/66* (2006.01)
*H01L 29/78* (2006.01)
(Continued)

(52) U.S. Cl.
CPC ...... *H01L 29/6681* (2013.01); *H01L 29/0847* (2013.01); *H01L 29/2003* (2013.01); *H01L 29/66522* (2013.01); *H01L 29/785* (2013.01)

(58) Field of Classification Search
CPC .......... H01L 21/02694; H01L 21/0415; H01L 21/046; H01L 21/0465; H01L 21/047; H01L 21/2056; H01L 21/2215; H01L 21/2252; H01L 21/2253; H01L 21/265; H01L 21/266; H01L 21/26553; H01L 21/26586; H01L 21/28044; H01L 21/28061; H01L 21/28079; H01L 21/28088; H01L 21/3006; H01L 21/2654; H01L 21/31155; H01L 21/3245; H01L 21/47576; H01L 21/4763; H01L 21/7682;
(Continued)

(56) References Cited

U.S. PATENT DOCUMENTS 10,461,186 B1 * 10/2019 Zhang ............. H01L 21/823871
10,916,638 B2 * 2/2021 Cheng ............... H01L 21/76805
(Continued)

*Primary Examiner* — Natalia A Gondarenko
(74) *Attorney, Agent, or Firm* — Kilpatrick Townsend & Stockton LLP

(57) ABSTRACT

A method of forming an alignment contact includes: providing a III-nitride substrate; epitaxially growing a first III-nitride layer on the III-nitride substrate, wherein the first III-nitride layer is characterized by a first conductivity type; forming a plurality of III-nitride fins on the first III-nitride layer, wherein each the plurality of III-nitride fins is separated by one of a plurality of first recess regions, wherein the plurality of III-nitride fins are characterized by the first conductivity type; epitaxially regrowing a III-nitride source contact portion on each of the plurality of III-nitride fins; and forming a source contact structure on the III-nitride source contact portions.

12 Claims, 53 Drawing Sheets

(51) Int. Cl.
  *H01L 29/08* (2006.01)
  *H01L 29/20* (2006.01)

(58) Field of Classification Search
  CPC ....... H01L 21/76859; H01L 21/823814; H01L 21/82385; H01L 29/0653; H01L 29/32; H01L 29/2003; H01L 29/66462; H01L 29/66522; H01L 29/78681; H01L 29/7786; H01L 29/7787; H01L 29/7788; H01L 29/78621; H01L 29/41725–41791; H01L 29/4236; H01L 29/41775; H01L 29/66575–66598; H01L 2029/7863; H01L 29/0843; H01L 29/0891; H01L 29/1058; H01L 29/1066; H01L 29/452; H01L 29/475; H01L 29/6681; H01L 29/0847; H01L 29/785; H01L 29/36; H01L 29/045; H01L 29/0657; H01L 29/0684; H01L 29/66924; H01L 29/808; H01L 29/7781; H01L 21/823418; H01L 21/823431; H01L 21/823487; H01L 21/66666; H01L 21/66553; H01L 21/6653; H01L 27/088; H01L 27/0886; H01L 21/823885; H01L 21/823828; H01L 21/823807; H01L 21/823871; H01L 21/823412; H01L 21/31116; H01L 21/02255; H01L 29/66742; H01L 29/42392; H01L 29/78696; H01L 29/78642; H01L 29/7827; H01L 29/1037
  USPC ....... 438/327, 308, 349, 358, 378, 394, 912, 438/798; 257/401, 76, 194, 256, 288, 257/E29.246, E29.255, E29.312
  See application file for complete search history.

(56) References Cited

U.S. PATENT DOCUMENTS

| | | | |
|---|---|---|---|
| 2014/0264369 A1* | 9/2014 | Padmanabhan | H01L 27/1211 438/172 |
| 2017/0077228 A1* | 3/2017 | Lee | H01L 29/66795 |
| 2019/0131399 A1* | 5/2019 | Liu | H01L 29/167 |
| 2019/0385917 A1* | 12/2019 | Lee | H01L 21/823878 |
| 2021/0249529 A1* | 8/2021 | Su | H01L 29/205 |

* cited by examiner

METHOD FOR REGROWN SOURCE CONTACTS FOR VERTICAL GALLIUM NITRIDE BASED FETS

CROSS-REFERENCES TO RELATED APPLICATIONS

This application claims the benefit of priority to U.S. Provisional Patent Application No. 63/000,968, filed on Mar. 27, 2020, entitled "Method and System for Regrown Source Contacts for Vertical Gallium Nitride Based FETS," the disclosure of which is hereby incorporated by reference in its entirety for all purposes.

BACKGROUND OF THE INVENTION

Power electronics are widely used in a variety of applications, including power conversion, electric motor drives, switching power supplies, lighting, etc. Power electronic devices such as transistors are commonly used in such power switching applications. The operation of the present generation of power transistor devices, particularly with high voltage (>600V) handling capability, is hampered by slow switching speeds, and high specific on-resistance.

Thus, there is a need in the art for power transistor devices exhibiting low capacitance, a low, positive threshold voltage, and low specific on-resistance along with high breakdown voltage.

SUMMARY OF THE INVENTION

The present invention relates generally to vertical fin-based field effect transistor (FET) devices with an improved combination of leakage current, maximum electric field, and on-resistance for a given threshold voltage. Embodiments of the present invention provide novel vertical-fin-based FET devices and methods of fabricating such FET devices with improved specific on-resistance, leakage current, and breakdown voltage.

In one aspect of the present invention, a method for forming an alignment contact includes: providing a III-nitride substrate; epitaxially growing a first III-nitride layer on the III-nitride substrate, wherein the first III-nitride layer is characterized by a first conductivity type; forming a first hardmask layer on the first III-nitride layer; forming a plurality of III-nitride fins on the first III-nitride layer using the first hardmask layer as a mask, wherein each the plurality of III-nitride fins is separated by one of a plurality of first recess regions, wherein the plurality of III-nitride fins are characterized by the first conductivity type; epitaxially growing a III-nitride gate layer having a second conductivity type opposite to the first conductivity type in the plurality of first recess regions; forming a first dielectric layer on the first hardmask layer and the gate layer, wherein the first dielectric layer comprise a contact region aligned with each of the plurality of fins and a gate region aligned with the III-nitride gate layer; forming a photoresist layer on the gate region of the first dielectric layer; etching the contact region of the first dielectric layer using the photoresist layer as a mask to expose a upper surface of the first hardmask layer; removing the photoresist layer; removing the first hardmask layer to expose a upper surface of each of the plurality of III-nitride fins; and epitaxially regrowing a III-nitride source contact portion coupled to each of the plurality of III-nitride fins.

In one embodiment, epitaxial regrowth of the III-nitride source contact portion is a self-limiting process on top of each of the plurality of III-nitride fins. In an embodiment, the width of the contact region can be at least three times the width of each of the plurality of III-nitride fins. In a particular embodiment, the III-nitride source contact portion can be characterized by an isosceles triangle shape having a base angle in a range between 58 degrees and 65 degrees in a cross-section view. The III-nitride substrate can be an n-GaN substrate, the first III-nitride layer and the plurality of III-nitride fins can include n-GaN epitaxial layers, and the III-nitride gate layer can include a p-GaN epitaxial layer. In an embodiment, the III-nitride gate layer is disposed in the plurality of first recess regions between adjacent III-nitride fins of the plurality of III-nitride fins.

In an embodiment, the method also includes forming a first source metal layer overlying the III-nitride source contact portion and the first dielectric layer, forming a second source metal layer coupled to the first source metal layer, forming a third source metal layer coupled to the second source metal layer, forming a source metal mask layer having an opening aligned with the gate region of the first dielectric layer, etching the first, second and third source metal layer to expose an upper surface of the gate region of the first dielectric layer, etching the gate region of the first dielectric layer to expose a upper surface portion of the III-nitride gate layer, and removing the source metal mask layer.

In another aspect of the present invention, a method for forming an alignment contact includes: providing a III-nitride substrate; epitaxially growing a first III-nitride layer on the III-nitride substrate, wherein the first III-nitride layer is characterized by a first conductivity type; forming a plurality of III-nitride fins on the first III-nitride layer, wherein each the plurality of III-nitride fins is separated by one of a plurality of first recess regions, wherein the plurality of III-nitride fins are characterized by the first conductivity type; epitaxially regrowing a III-nitride source contact portion on each of the plurality of III-nitride fins; and forming a source contact structure on the III-nitride source contact portions.

In another aspect of the present invention, a method for forming an alignment contact includes: providing a III-nitride substrate; epitaxially growing a first III-nitride layer on the III-nitride substrate, wherein the first III-nitride layer is characterized by a first conductivity type; forming a first hardmask layer on the first III-nitride layer; forming a plurality of III-nitride fins on the first III-nitride layer using the first hardmask layer as a mask, wherein each of the plurality of III-nitride fins are separated by one of a plurality of first recess regions, wherein the plurality of III-nitride fins are characterized by the first conductivity type; epitaxially growing a III-nitride gate layer having a second conductivity type opposite to the first conductivity type in the plurality of first recess regions; forming a first dielectric layer on the first hardmask layer and the III-nitride gate layer, wherein the first dielectric layer comprise a contact region aligned with each of the plurality of fins and a gate region aligned with the III-nitride gate layer; forming a photoresist layer on the gate region of the first dielectric layer; etching the contact region of the first dielectric layer using the photoresist layer as a mask to form a second recess region, wherein a upper surface of each of the plurality of the III-nitride fins and a portion of upper surface of the III-nitride gate layer surrounding each of the plurality of III-nitride fins are exposed from a bottom surface of the second recession region; removing the photoresist layer; epitaxially regrowing a III-nitride source contact portion in the second recess region; and removing the first dielectric layer.

In another aspect of the present invention, a method for forming an alignment contact includes: providing a III-nitride substrate; epitaxially growing a first III-nitride layer on the III-nitride substrate, wherein the first III-nitride layer is characterized by a first conductivity type; forming a plurality of III-nitride fins on the first III-nitride layer, wherein each of the plurality of III-nitride fins is separated by one of a plurality of first recess regions, wherein the plurality of III-nitride fins are characterized by the first conductivity type; epitaxially growing a III-nitride gate layer having a second conductivity type opposite to the first conductivity type in the plurality of first recess regions; epitaxially growing a second III-nitride layer overlying the plurality of the III-nitride fins and the III-nitride gate layer, wherein the second III-nitride layer is characterized by a first dopant concentration; epitaxially growing a third III-nitride layer coupled to the second III-nitride layer, wherein the third III-nitride layer is characterized by a second dopant concentration greater than the first dopant concentration; forming a first source metal layer coupled to the third III-nitride layer; forming a second source metal layer coupled to the first source metal layer; forming a third source metal layer coupled to the second source metal layer; forming a source metal mask layer having an opening aligned with a portion of the III-nitride gate layer; etching the first, second and third source metal layer to expose an upper surface portion of the third III-nitride layer; etching the third III-nitride layer and the second III-nitride layer and a portion of the III-nitride gate layer; and removing the source metal mask layer.

In one embodiment, the method further includes epitaxially growing a undoped III-nitride cap layer coupled to the III-nitride gate layer.

In one embodiment, etching the third III-nitride layer and the second III-nitride layer and the portion of the III-nitride gate layer, may include etching away the undoped III-nitride cap layer in the III-nitride gate layer. In some embodiments, the III-nitride substrate comprises an n-GaN substrate, the first III-nitride layer comprise an n-GaN epitaxial layer, and the plurality of III-nitride fins comprise n-GaN epitaxial layers.

In another aspect of the present invention, a transistor includes: a III-nitride substrate; a first III-nitride layer on the III-nitride substrate, wherein the first III-nitride layer is characterized by a first conductivity type; a plurality of III-nitride fins on the first III-nitride layer, wherein each of the plurality of III-nitride fins is separated by one of a plurality of first recess regions, wherein the plurality of III-nitride fins are characterized by the first conductivity type; a III-nitride gate layer having a second conductivity type opposite to the first conductivity type in the plurality of first recess regions; and a regrown III-nitride source contact portion coupled to each of the plurality of III-nitride fins, wherein the III-nitride source contact portion is characterized by the first conductivity type.

In one embodiment, the growth of the regrown III-nitride source contact portion is self-limiting on top of each of the plurality of III-nitride fins.

Numerous benefits are achieved by way of the present invention over conventional techniques. For example, embodiments of the present invention provide methods and systems that utilize a graded doping region as a landing zone for etching of the vertical fin, thereby minimizing the impact of etch depth variation in the etch process on the on-resistance and gate-to-source capacitance of the FET. Moreover, other embodiments provide a self-aligned source contact to reduce or eliminate alignment issues in the contact formation process and thereby minimize parasitic capacitances. Additionally, some embodiments utilize an epitaxially-regrown gate layer on the graded doping region including a ternary III-V compound on a binary III-V compound substrate.

The difference between the lattice constant of the ternary III-V compound gate layer and the binary III-V compound substrate and the induced strain generates a polarization charge which results in a two-dimensional electron gas (2DEG) at the interface with the gate layer. The 2DEG enables a current to first flow substantially in the horizontal direction along the lateral bottom surface of the gate layer, then in the vertical direction through the drift region, thereby reducing spreading resistance in the device and reducing the device specific on resistance. By controlling the etch depth into the graded doping region, the drain-source ON resistance, the threshold voltage, the electric field, and the drain-source leakage current can kept within a desired range. Additionally, some embodiments include applications to merged p-i-n/Schottky (MPS) diodes and to vertical MOSFETs. In particular, the use of an epitaxially regrown ternary III-V compound as the p-type region in an MPS diode can reduce the on-voltage of the diode. The graded doping region landing zone has similar advantages for vertical MOSFETs as for vertical JFETs, and the self-aligned source contact can also be applied to vertical MOSFET structures. These and other embodiments of the invention along with many of its advantages and features are described in more detail in conjunction with the text below and attached figures.

BRIEF DESCRIPTION OF THE DRAWINGS

The accompanying drawings form a part of the present disclosure, that describe exemplary embodiments of the present invention. The drawings together with the specification will explain the principles of the invention.

DETAILED DESCRIPTION OF SPECIFIC EMBODIMENTS

Embodiments of the present disclosure will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

Embodiments of the present disclosure relate to vertical-fin-based field effect transistor (FET) devices. More particular, the present disclosure relates to vertical fin-based FET devices with improved leakage current, maximum electric field, and on-resistance for a given threshold voltage. Merely by way of example, the present disclosure relates to methods and vertical transistor devices with a graded doping zone in the doped drift region, and a regrown epitaxial gate layer in direct contact with the graded doping zone. Many advantages can be obtained by having the epitaxially regrown gate layer on the graded doping zone, such as improved on-resistance, maximum electric field, and current flow first in the lateral direction along the bottom interface layer of the gate layer than in the vertical direction through the drift layer toward the substrate.

Figure 1:
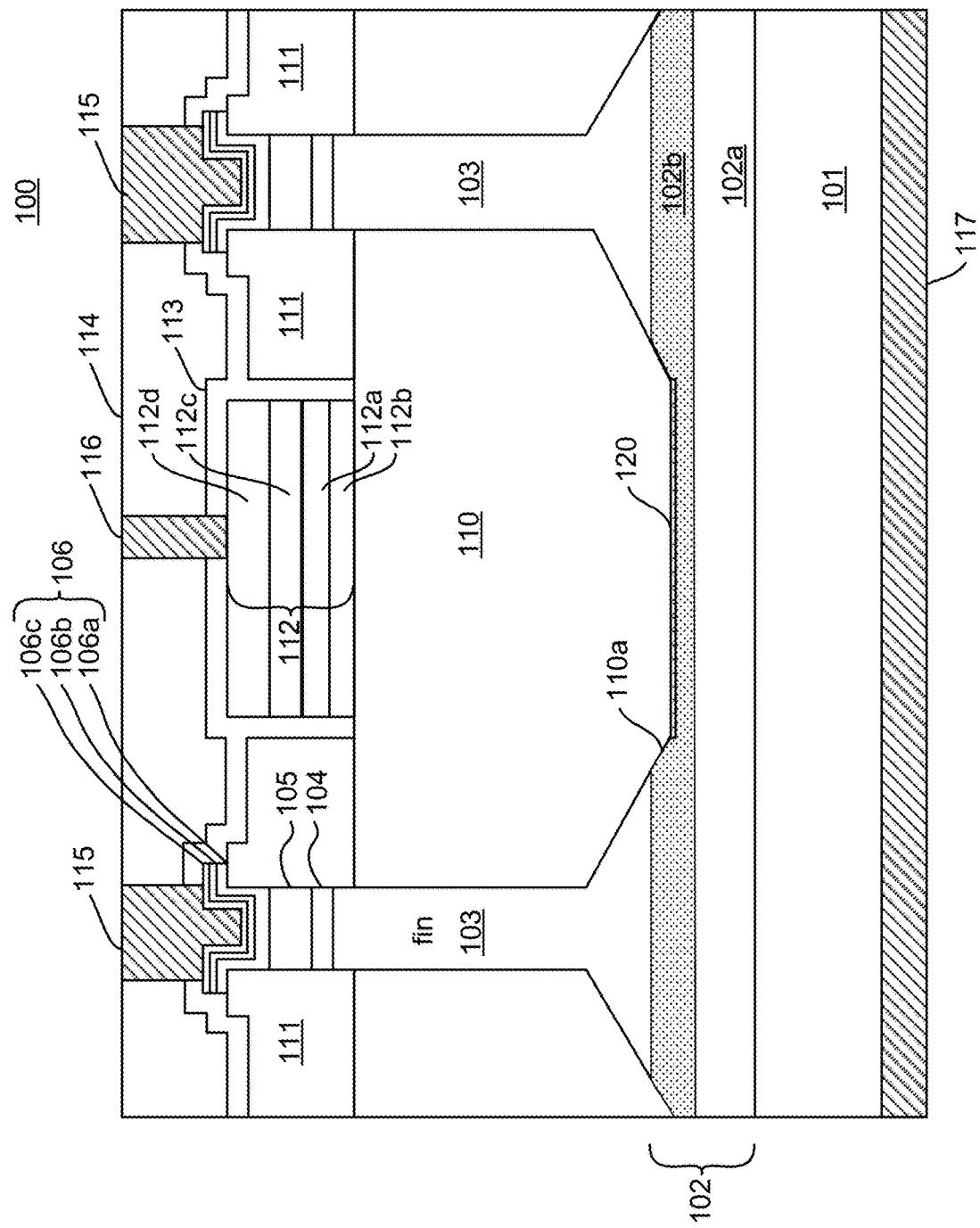
FIG. 1 is a cross-sectional view of a vertical-fin-based field effect transistor (FET) device according to an embodiment of the present disclosure.

FIG. 1 is a cross-sectional view of a vertical fin-based field effect transistor device 100 according to an embodiment of the present disclosure. The terms "FET," "FinFET," and "vertical fin-based FET" are used interchangeable herein. Referring to FIG. 1, FET device 100 may include a semiconductor substrate 101, a drift layer 102 including a uniformly doped region 102a on semiconductor substrate 101 and a graded doping region 102b on uniformly doped region 102a, and a plurality of fins 103 protruding from graded doping region 102b. In one embodiment, each of the fins 103 may include a heavily doped layer 104 disposed in an upper portion of the fin and a metal layer 105 including materials including a refractory metal, refractory metal compound or refractory metal alloy layer (e.g., a TiN layer) disposed on heavily doped layer 104. FET device 100 may also include a source contact structure 106 on metal layer 105 (e.g., TiN). Source contact structure 106 may include a titanium (Ti) layer 106a on metal layer 105 (e.g., TiN), an aluminum (Al) layer 106b on titanium (Ti) layer 106a, and a barrier metal layer (e.g., molybdenum (Mo), titanium (Ti), tantalum (Ta), or similar) 106c on aluminum (Al) layer 106b.

FET device 100 may further include a gate layer 110 having a bottom portion in direct contact with graded doping region 102b, an insulating layer 111, for example, a dielectric (e.g., silicon dioxide or silicon nitride) layer disposed on gate layer 110 and surrounding fins 103, a gate contact structure 112 disposed on gate layer 110, a first interlayer dielectric layer 113 disposed on insulating layer 111 and gate contact structure 112, and a second interlayer dielectric layer 114 disposed on first interlayer dielectric layer 113. In one embodiment, gate contact structure 112 may include a nickel (Ni) layer 112a disposed on gate layer 110, a first gold (Au) layer 112b disposed on nickel (Ni) layer 112a, a barrier metal (e.g., molybdenum (Mo), titanium (Ti), tantalum (Ta), or similar) layer 112c disposed on first gold (Au) layer 112b, and a second gold (Au) layer 112d disposed on barrier layer 112c.

FET device 100 may also include a first via contact 115 extending through first and second interlayer dielectric layers 113, 114 and in contact with source contact structure 106, a second via contact 116 extending through first and second interlayer dielectric layers 113, 114 and in contact with gate contact structure 112, and a drain metal contact 117 on the bottom surface of semiconductor substrate 101. As used herein, the terms "drift layer" and "drift region" are used interchangeably, the terms "doped layer" and "doped region" are used interchangeably, and the terms "graded doping region" and "graded doping layer" are used interchangeably.

In some embodiments, semiconductor substrate 101 may include an N+ doped III-nitride material, fins 103 may include an N doped III-nitride material having a first dopant concentration, uniformly doped region 102a of drift layer 102 may include an N doped III-nitride material having a second dopant concentration lower than the first dopant concentration, and graded doping region 102b having a third dopant concentration that linearly increases from the second dopant concentration to the first dopant concentration.

In one embodiment, the first dopant concentration is about $7.5 \times 10^{16}$ atoms/cm$^3$ and the second dopant concentration is about $1 \times 10^{16}$ atoms/cm$^3$.

In one embodiment, the drift region has a thickness of about 12 μm, the graded doping region has a thickness of about 0.3 μm, and the semiconductor fin has a height in a range between about 0.7 μm and 0.8 μm and a width of about 0.2 μm.

In one embodiment, gate layer 110 may include an $In_xGa_{1-x}N$ layer, where 0<x<1, i.e., x is between 0 and 1 and is not equal to 0 or 1. In one embodiment, gate layer 110 is disposed in a recess region between two adjacent fins and has a portion 110a in contact with graded doping region 102b. The depth (or the thickness) of portion 110a of the gate layer may affect the threshold voltage, the conductance, the maximum electric field of the FET device. The effect of the depth (or thickness) of portion 110a embedded in the graded doping region will be described in more detail below.

In one embodiment, the FET device 100 may include a semiconductor substrate 101 that may include an N+ GaN material layer, a drain metal contact 117 disposed at its bottom surface, an N GaN drift layer 102 having a uniformly doped region 102a disposed on semiconductor substrate 101 and a graded doping region 102b disposed on the uniformly doped region 102a, and an epitaxial GaN layer disposed on the graded doping region and including a recess region for forming a plurality of fins 103. The FET device may also include a gate layer 110, for example, a p-type GaN gate layer, filling the recess region. The graded doping region 102b may function as a landing pad to ensure sufficient contact for gate layer 110. In one embodiment, the gate layer may include a ternary compound semiconductor layer (e.g., an $In_xGa_{1-x}N$ layer, where 0<x<1). In one embodiment, portion 110a of the gate layer 110 may have a depth (or thickness) of about 0.1 μm (+/−0.1 μm) extending into graded doping region 102b. The fins each may have a width of about 0.2 μm and are spaced from each other by a space of about 2.0 μm, i.e., the recess region or the gate layer filling the recess region between two adjacent fins has a lateral width of about 2.0 μm. The FET device may also include a two-dimensional electron gas (2DEG) layer 120 formed in an interface between gate layer 110 and graded doping region 102b. The surface area of gate layer 110 is large, so that a current flows laterally along 2DEG layer 120 before flowing vertically toward drain metal layer 117 in the direction of the substrate, thereby improving the conductance (reducing the on-resistance) of the FET device. In other words, the channel FET device has two portions, with a first portion being a lateral channel that controls the current flow through the 2DEG layer, which distributes the current efficiently in the drift region, and a second portion being a vertical channel which carries the current vertically through the drift region toward semiconductor substrate 101 and drain metal layer 117.

In one embodiment, each of the fins may include a metal layer 105 made of TiN and a multilayer source metal structure (e.g., stacked layers of Ti/Al or Ti/TiN/Al in which Ti is in contact with metal layer 105. The FET device may also include an insulating layer 111, e.g., a silicon dioxide or silicon nitride layer on gate layer 110. Insulating layer 111 includes an opening where a gate contact structure 112 (i.e., a gate electrode) is formed in contact with gate layer 110. Gate contact structure 112 (i.e., a gate electrode) has a multilayer structure of metals, e.g., Pd/Pt/Au, where Pd is in contact with gate layer 110, or Ni and Au, in which the Ni is deposited in contact with gate layer 110. Other embodiments can include other gate electrode metal structures known to those skilled in the art.

In one embodiment, each of the fins may include an upper portion having sidewalls parallel to each other and substantially perpendicular to the surface of the substrate and a lower portion having sidewalls non-parallel to each other and forming an angle other than 90 degrees with the surface of the substrate. The parallel sidewalls may define a non-polar plane, such as an m-plane.

In one embodiment, the 2DEG layer is induced by a polarization between the gate layer and the drift region in a c-plane, and the current flowing vertically through the drift region is along an m-plane.

Figure 2:
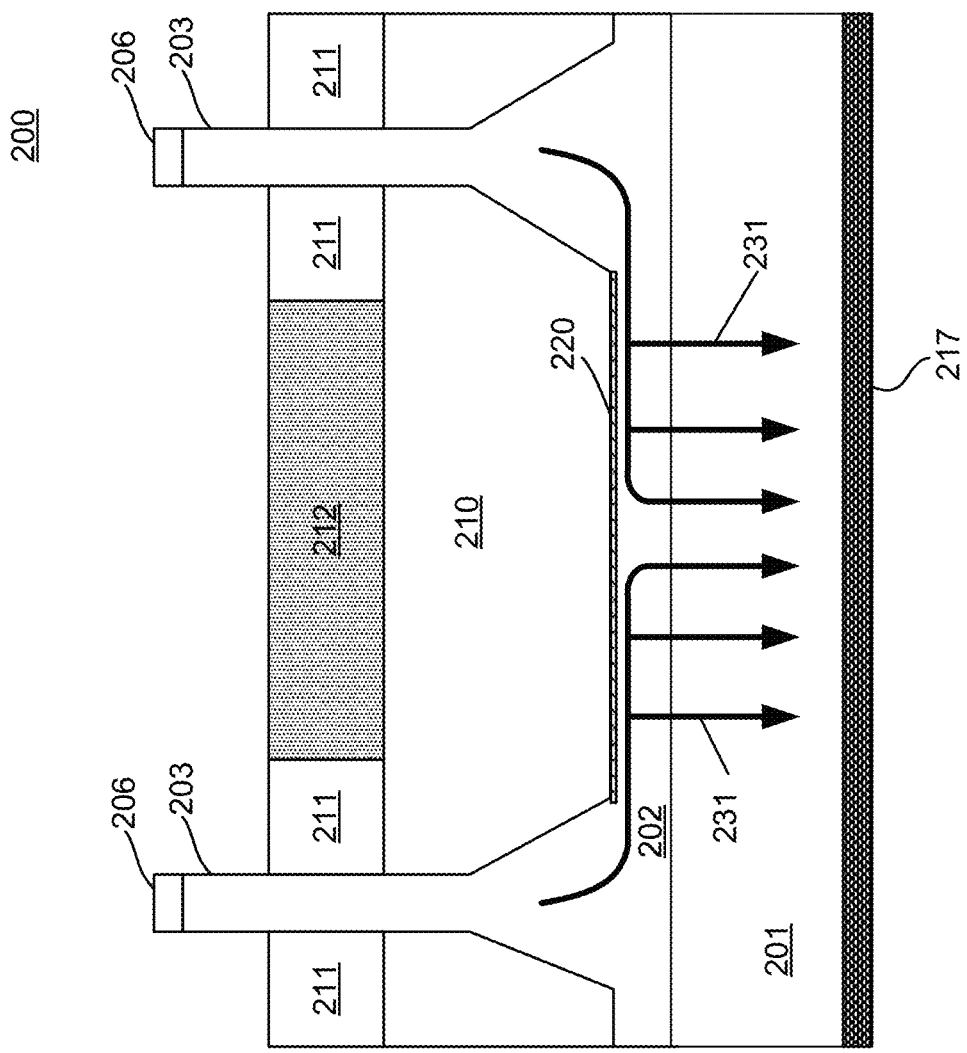
FIG. 2 is a simplified cross-sectional view of a vertical-fin-based FET device illustrating current flow from a lateral direction along a two-dimensional electron gas (2DEG) to a vertical direction toward the substrate according to an embodiment of the present disclosure.

FIG. 2 is a simplified cross-sectional view of a vertical FET device 200 illustrating a current flow from a lateral direction along a 2DEG to a vertical direction toward the substrate according to an embodiment of the present disclosure. Referring to FIG. 2, vertical FET device 200 may include a substrate 201, a drift layer 202 overlying substrate 201, a plurality of fins 203 protruding from a surface of drift layer 202, a gate layer 210 on drift layer 202 and surrounding the fins. FET device 20 may further include a gate electrode 212 on gate layer 210, and a dielectric layer (e.g., silicon dioxide) 211 on gate layer 210 and surrounding fins 203 and gate electrode 212. FET device 20 may also include a two-dimensional electron gas 220 where gate layer 220 meets drift layer 202 along the polar plane directions. FET device 20 may also include a source electrode 206 coupled to fins 203. FET device 20 is in an off-state when no electrical potential is applied to gate electrode 212.

When an electrical potential is applied to gate electrode 212, it modulates a continuous two-dimensional electron gas (2DEG) 220 that is electrically communicative with the drain electrode. The source current 231 flows laterally under gate layer 210 and vertically into drain electrode 217. In one embodiment, the fins each have a width of about 0.2 μm and are spaced apart by a distance of about 2.0 μm. A polarization-induced 2DEG 220 is formed in the interface between the gate layer and the graded doping region of the drift region, thereby distributing the current in the drift region to improve the conductance of the FET device.

Figure 3:
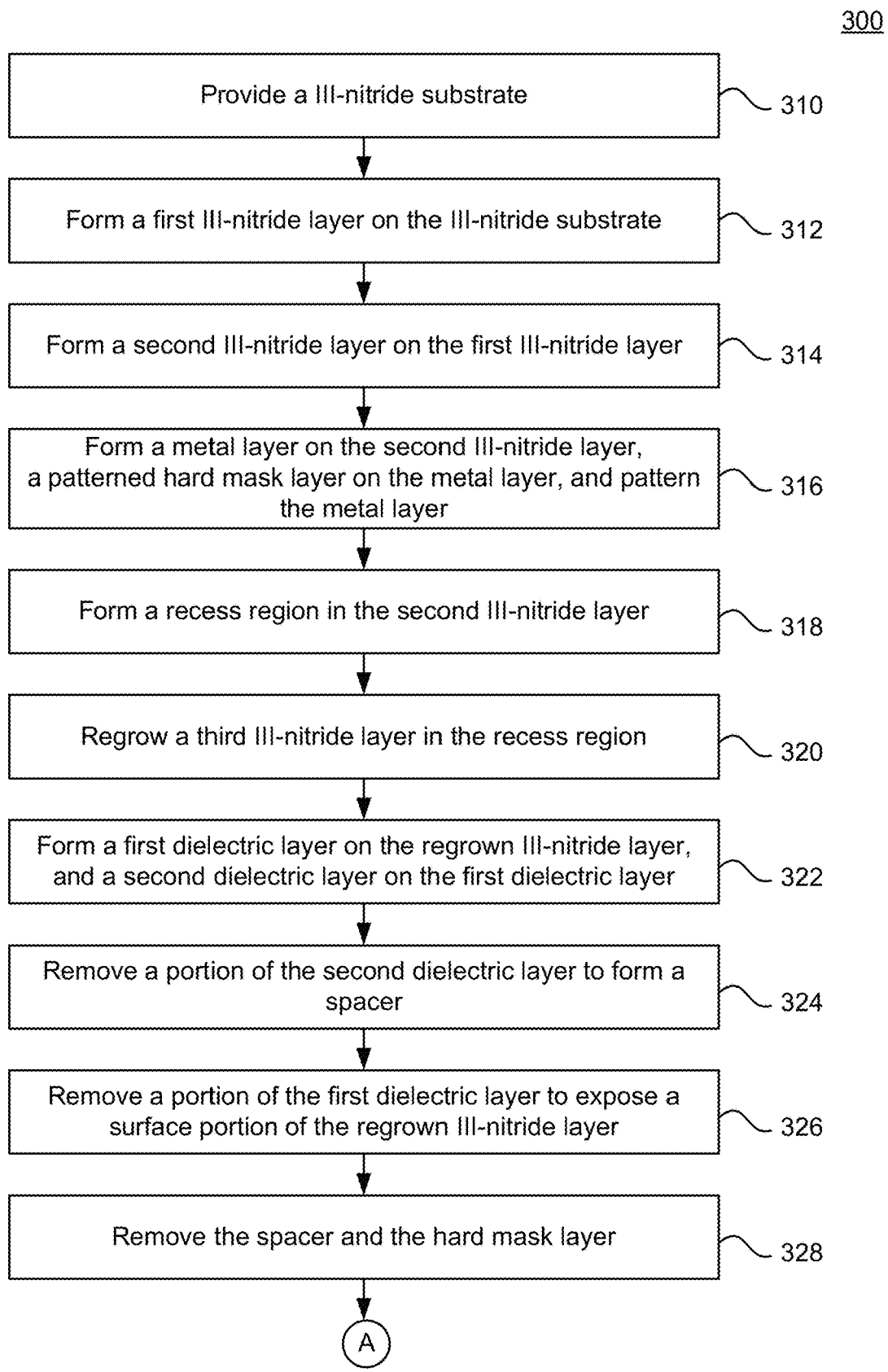
FIG. 3 is a simplified flowchart of a method of fabricating a vertical-fin-based FET device according to an embodiment of the present disclosure.
Figure 3:
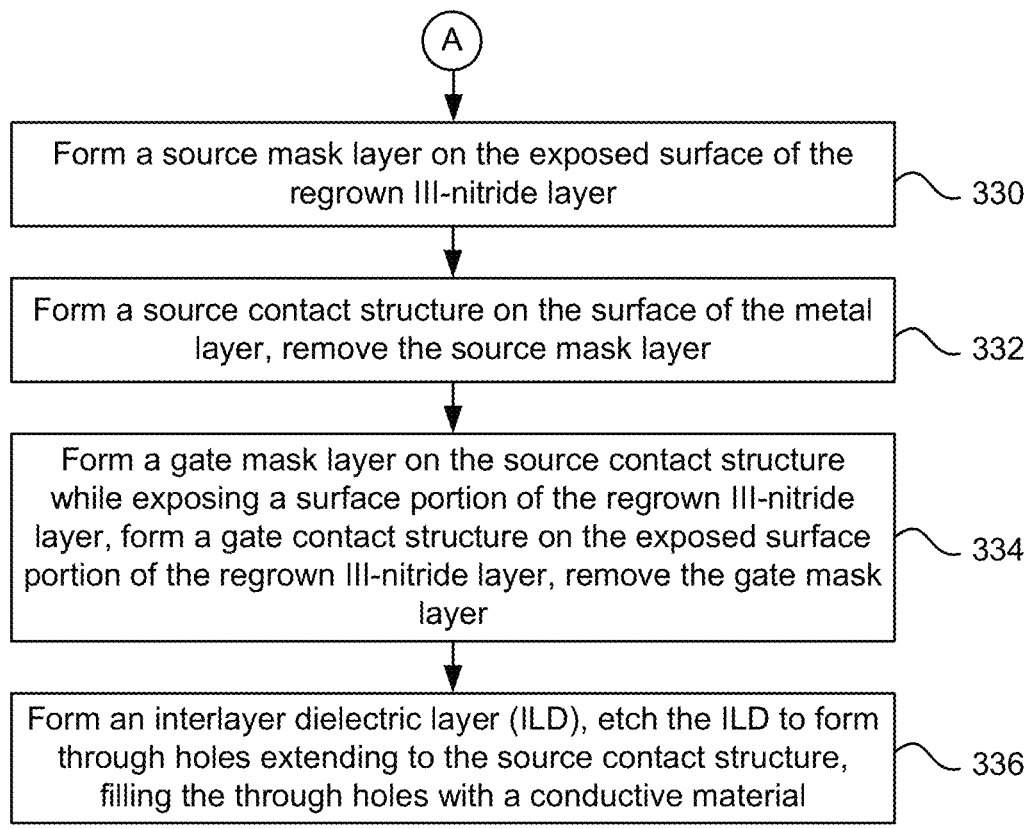

Embodiments of the present disclosure further provide a method of fabricating a vertical FET device. FIG. 3 is a simplified flowchart of a method 300 of fabricating a vertical FET device with a regrown gate layer according to an embodiment of the present disclosure. Referring to FIG. 3, a III-nitride substrate is provided (310). In an embodiment, the III-nitride substrate is an N+ GaN substrate having a resistivity in a range of about 0.020 ohm-cm. In one embodiment, the resistivity of the N+ GaN substrate may be from about 0.001 ohm-cm to 0.018 ohm-cm, preferably less than 0.016 ohm-cm, and more preferably, less than 0.012 ohm-cm. Method 300 also includes forming a first III-nitride epitaxial layer, for example, a 12 μm thick first III-nitride epitaxial layer (e.g., an N− GaN epitaxial layer) deposited on the III-nitride substrate (312). The first III-nitride epitaxial layer is epitaxially grown on the III-nitride substrate at a temperature between 950° C. and 1100° C. and is characterized by a first dopant concentration, e.g., N-type doping with a dopant concentration of about $1\times10^{16}$ atoms/cm$^3$. In some embodiments, the first III-nitride epitaxial layer is a drift layer including a uniformly doped region (layer) on the III-nitride substrate and a graded doping region (layer) on the uniformly doped region. In an embodiment, the uniformly doped region has a thickness of about 12 μm, and the graded doping region has a thickness of about 0.3 micron. In an embodiment, the surface of substrate 310 is miscut from the c-plane at an angle to facilitate high-quality epitaxial growth for high-voltage operation of the drift layer.

Method 300 further includes forming a second III-nitride epitaxial layer on the first III-nitride epitaxial layer (314). In an embodiment, the second III-nitride epitaxial layer is epitaxially grown on the first III-nitride epitaxial layer with a thickness of about 0.7 μm and is characterized by a second dopant concentration, e.g., N-type doping. The second dopant concentration is higher than the first dopant concentration in some embodiments. In an embodiment, the second dopant concentration is about $1.3\times10^{17}$ atoms/cm$^3$. Method 300 further includes forming a metal layer on the second III-nitride epitaxial layer and a patterned hardmask layer on the metal layer, and patterning the metal layer using the patterned hardmask layer as a mask (316). Method 300 further includes forming a recess region in the second III-nitride epitaxial layer using the patterned hardmask layer by an etch process, e.g., a reactive ion etching (RIE) process (318). Method 300 further includes regrowing a third III-nitride epitaxial layer in the recess region (320). The regrown III-nitride epitaxial layer may form a gate layer. In one embodiment, the regrown III-nitride epitaxial layer has a conductivity type opposite the conductivity type of the first and second III-nitride epitaxial layers.

Method 300 further includes forming a first dielectric layer on the regrown III-nitride epitaxial layer and on the patterned hardmask layer and a second dielectric layer on the first dielectric layer (322). Method 300 further includes removing a portion of the second dielectric layer to form a spacer on sidewalls of the first dielectric layer on opposite sides of an upper portion of the fins (324). Method 300 further includes removing a portion of the first dielectric layer to expose a surface portion of the regrown III-nitride epitaxial layer while leaving a portion of the first dielectric layer on opposite sides of the fins (326). Method 300 further includes removing the spacer and the hardmask layer while exposing a surface of the metal layer and keeping the portion of the first dielectric layer on opposite sides of the fins (328).

Method 300 further includes forming a source mask layer on the exposed surface portion of the regrown epitaxial III-nitride layer (330). Method 300 further includes forming a source contact structure on the surface of the metal layer and removing the source mask layer (332). Method 300 further includes forming a gate mask layer covering the source contact structure while exposing a surface portion of the regrown III-nitride epitaxial layer, forming a gate contact structure on the exposed surface portion of the regrown III-nitride epitaxial layer, and removing the gate mask layer (334). Method 300 further includes forming an interlayer dielectric layer covering the source contact structure and the gate contact structure, forming a patterned mask layer on an interlayer dielectric layer, etching the interlayer dielectric layer to form through holes extending to the source contact structure, and filling the through holes with a conductive material to form vias (336). It is noted that the through holes and vias to the gate contact structure can be formed concurrently with the formation of the through holes and vias to the source contact structure.

It should be appreciated that the specific steps illustrated in FIG. 3 provide a particular method of fabricating a vertical FET device with a regrown gate layer according to an embodiment of the present invention. Other sequences of steps may also be performed according to alternative embodiments. For example, alternative embodiments of the present invention may perform the steps outlined above in a different order. Moreover, the individual steps illustrated in FIG. 3 may include multiple sub-steps that may be performed in various sequences as appropriate to the individual step. Furthermore, additional steps may be added or removed depending on the particular application. One of ordinary skill in the art would recognize many variations, modifications, and alternatives.

Figure 4A:
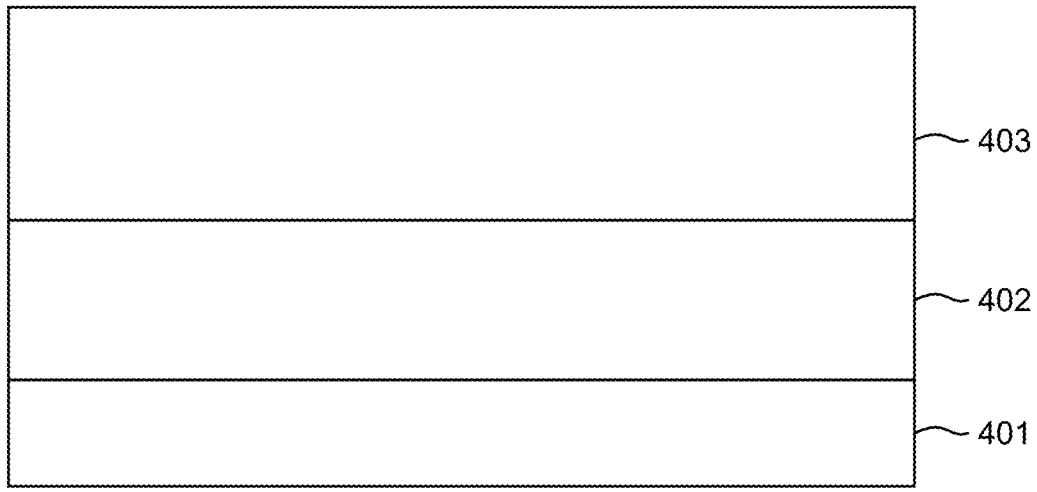
FIGS. 4A-4I are cross-sectional views showing intermediate stages of a method of fabricating a vertical-fin-based FET device according to a first embodiment of the present disclosure.
Figure 4B:
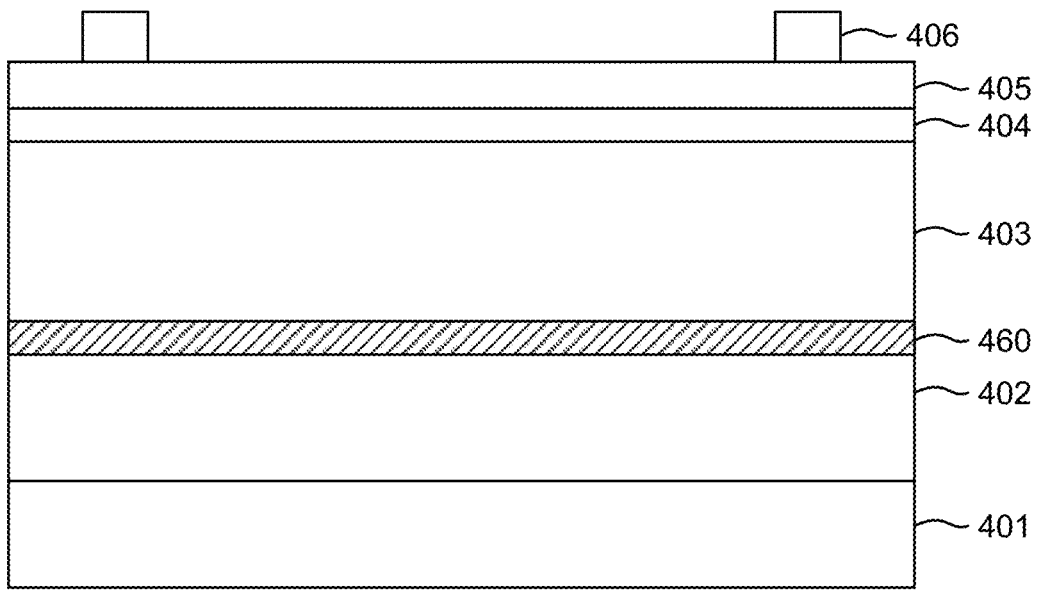
Figure 4C:
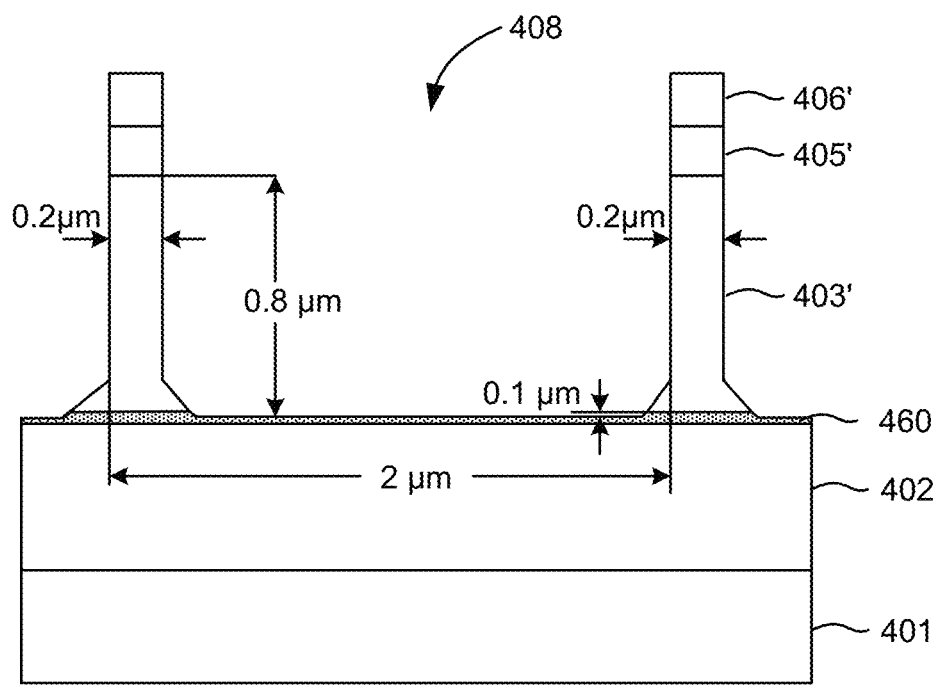
Figure 4D:
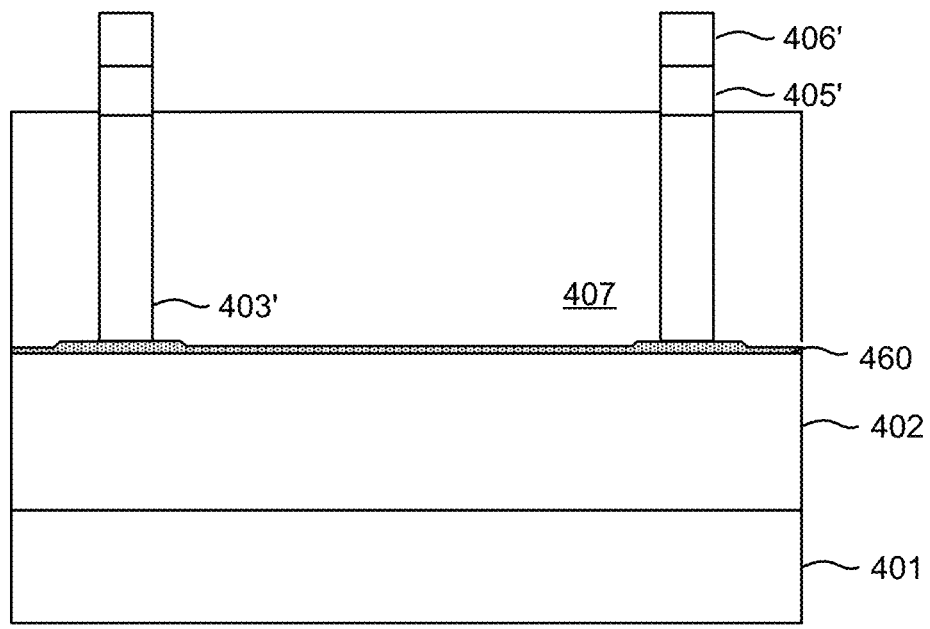
Figure 4E:
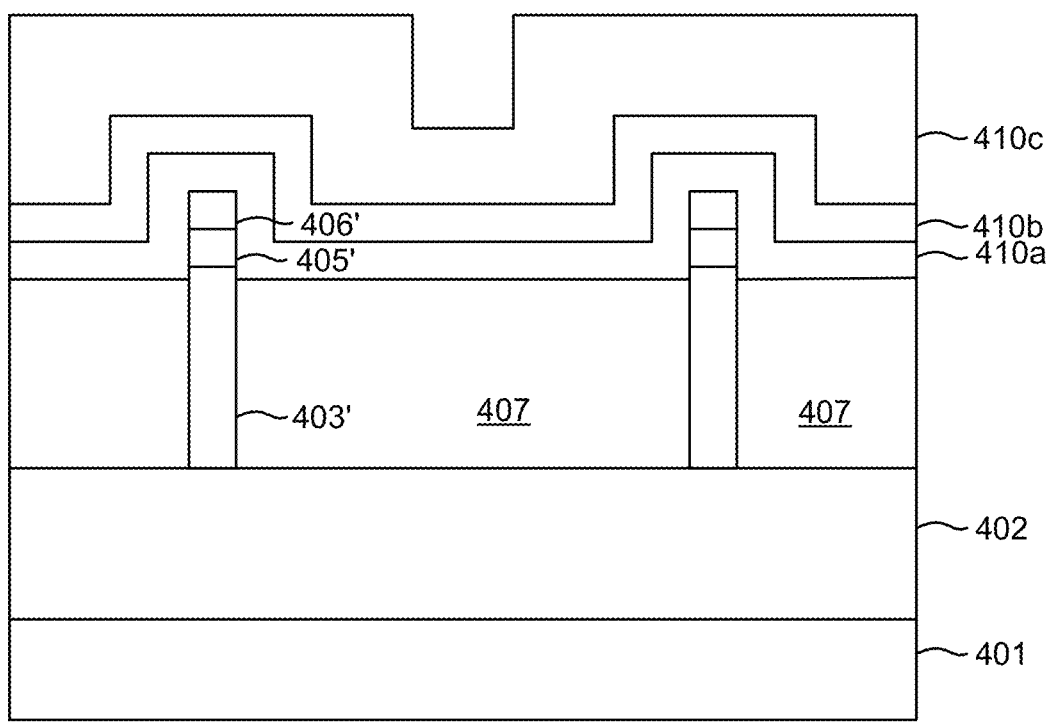
Figure 4F:
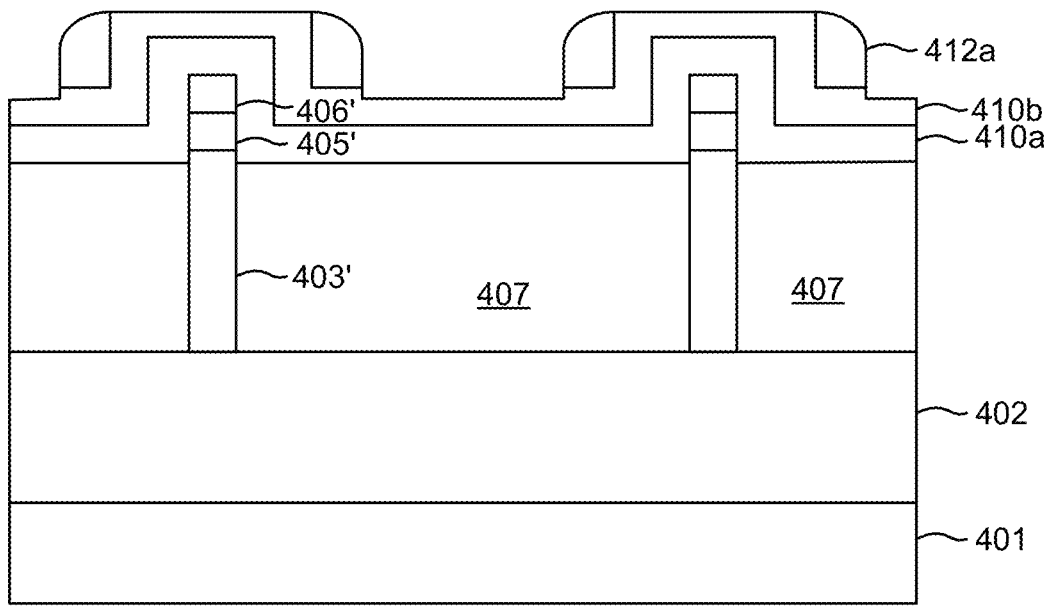
Figure 4G:
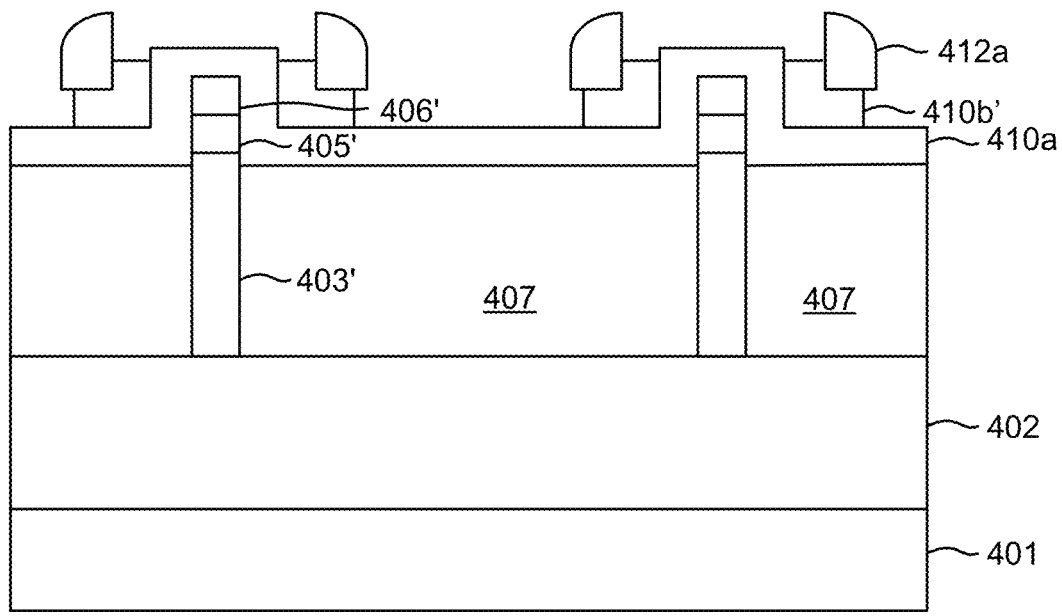
Figure 4H:
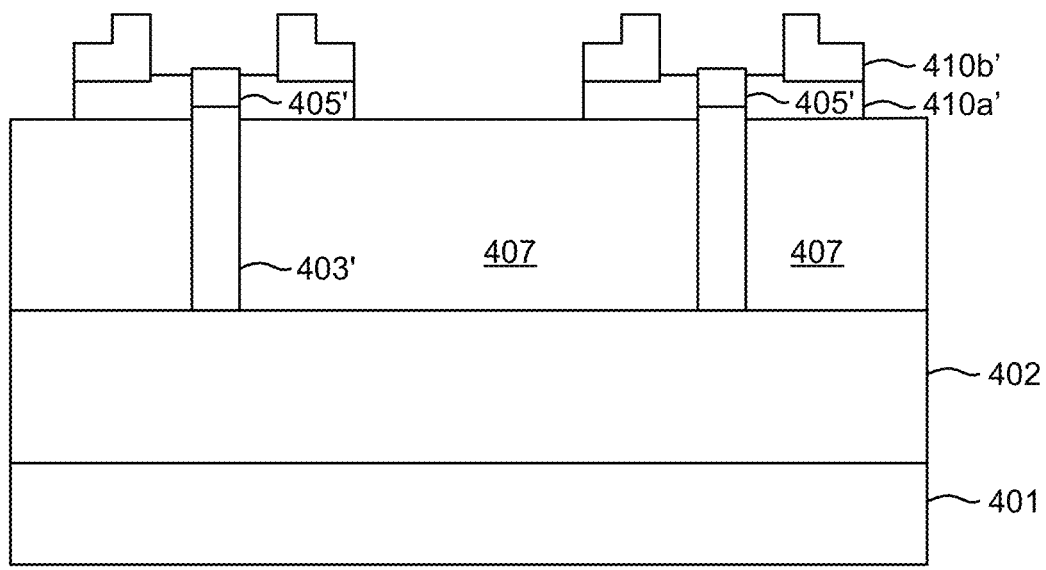
Figure 4I:
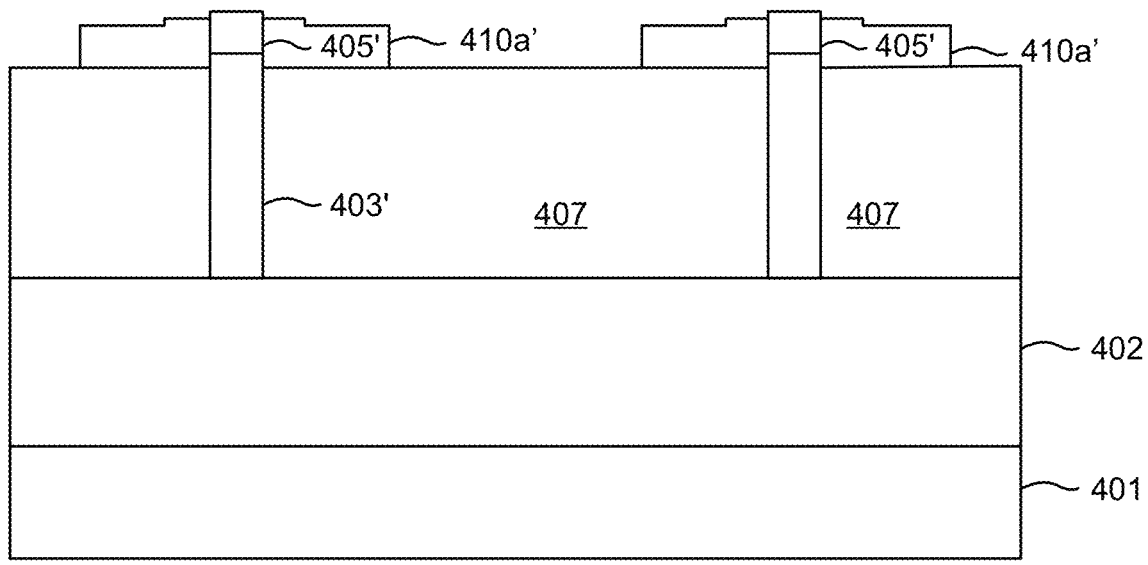
Figure 4J:
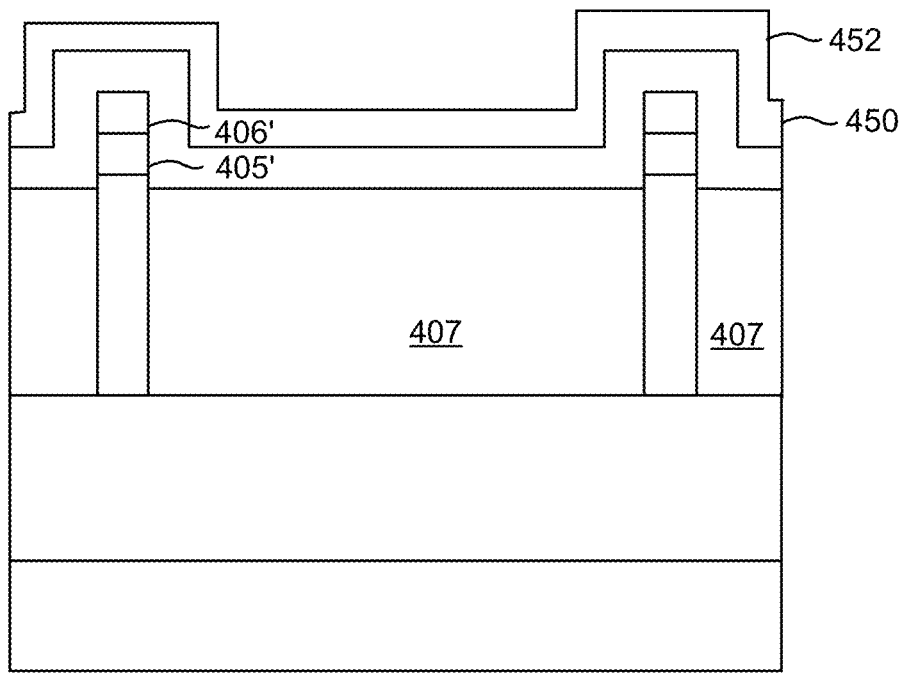
FIGS. 4J through 4M are cross-sectional views showing intermediate stages of a method of fabricating a vertical-fin-based FET device according to a second embodiment of the present disclosure.
Figure 4K:
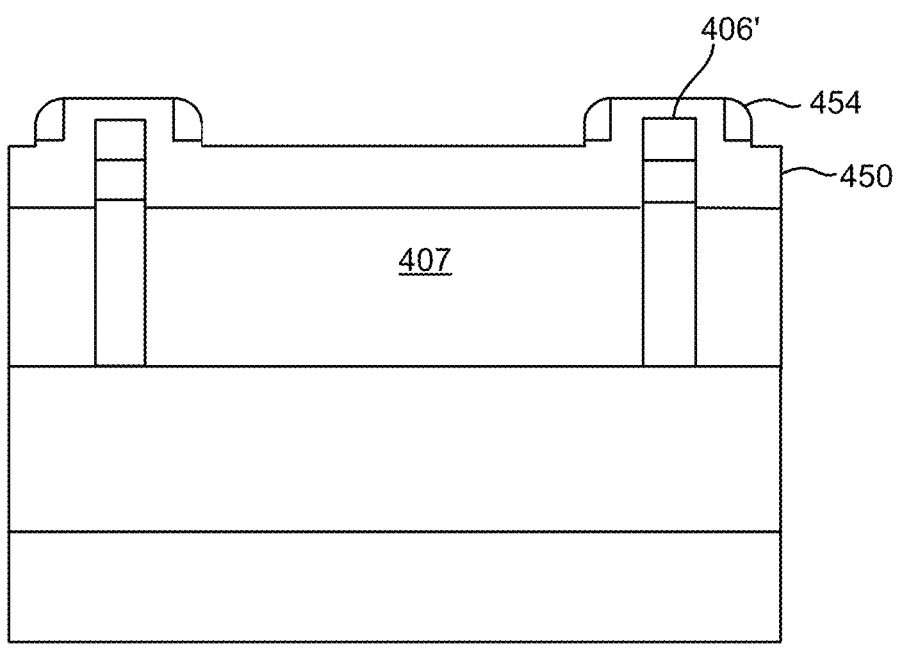
Figure 4L:
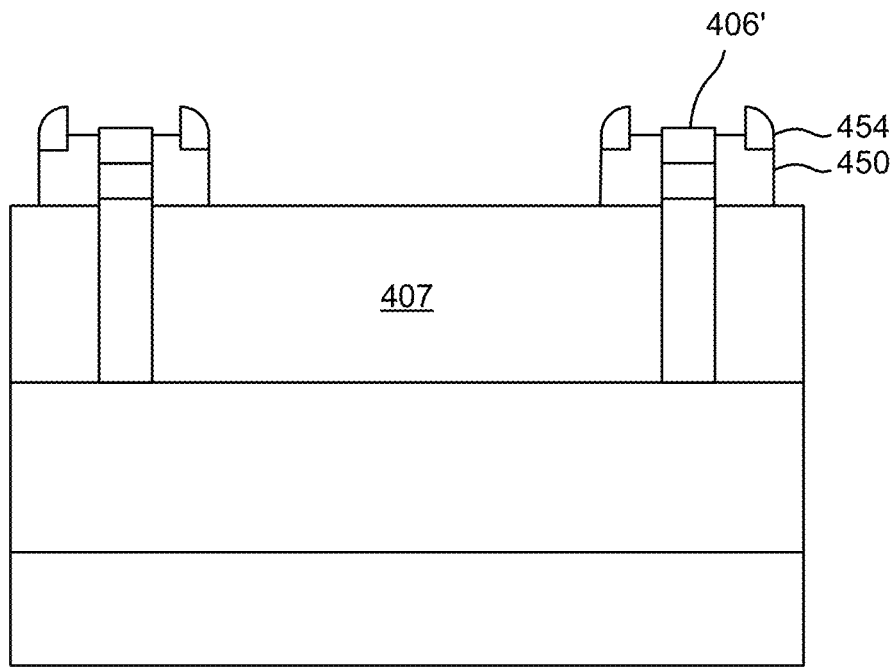
Figure 4M:
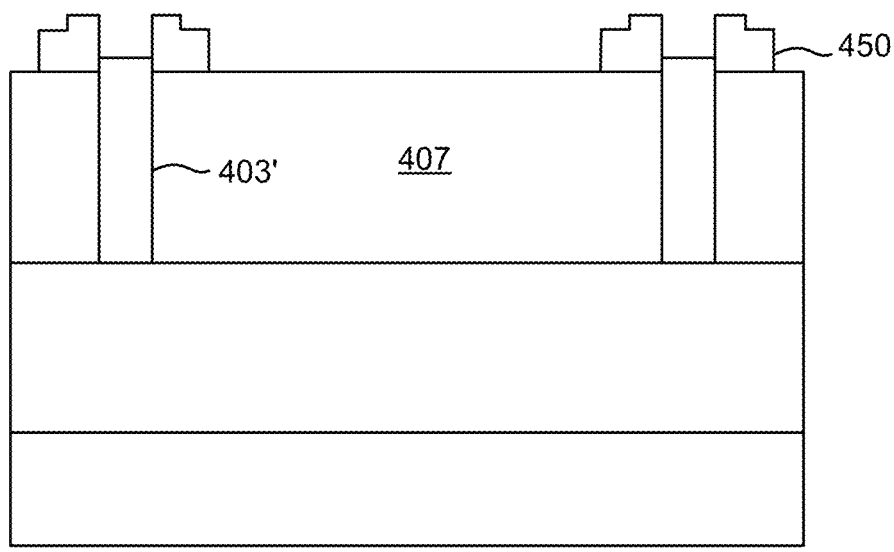
Figure 4N:
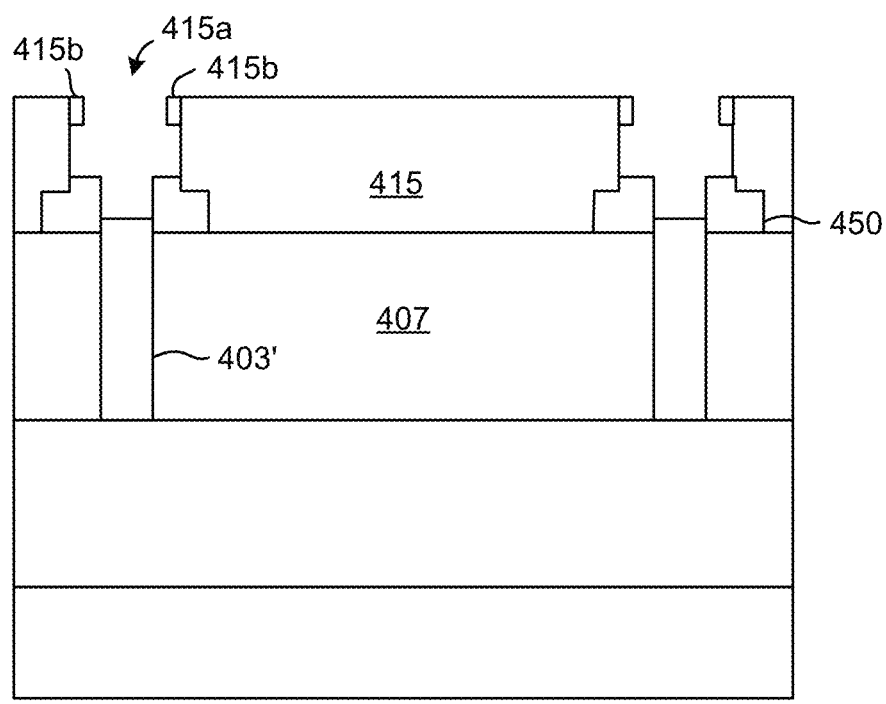
FIG. 4N through FIG. 4U are cross-sectional views showing intermediate stages of a method of fabricating a vertical-fin-based FET device that can be applied to the first and second embodiments of the present disclosure.
Figure 4O:
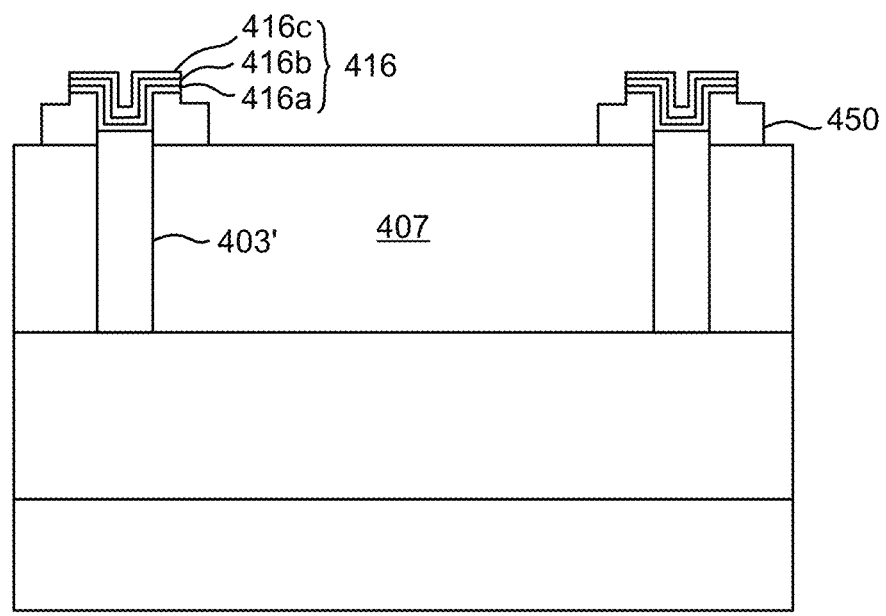
Figure 4P:
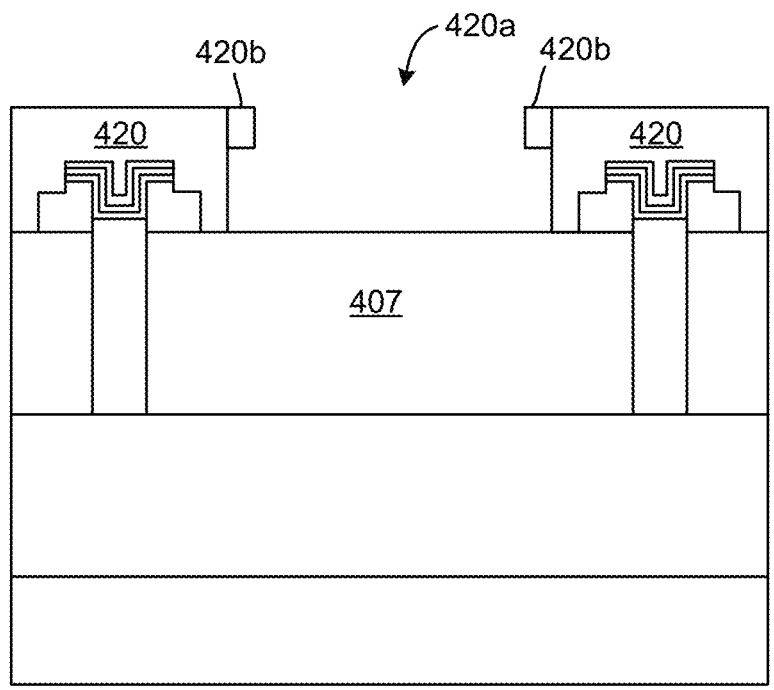
Figure 4Q:
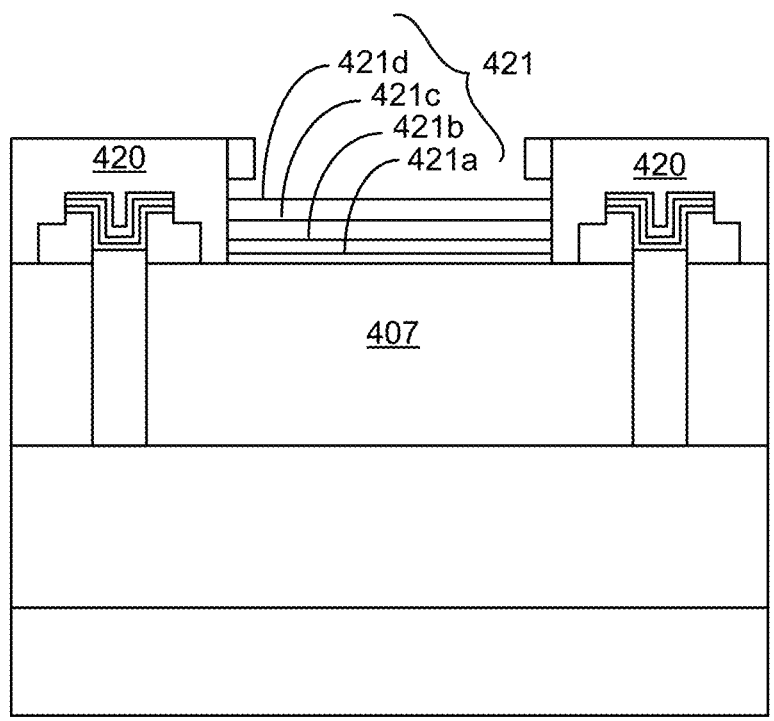
Figure 4R:
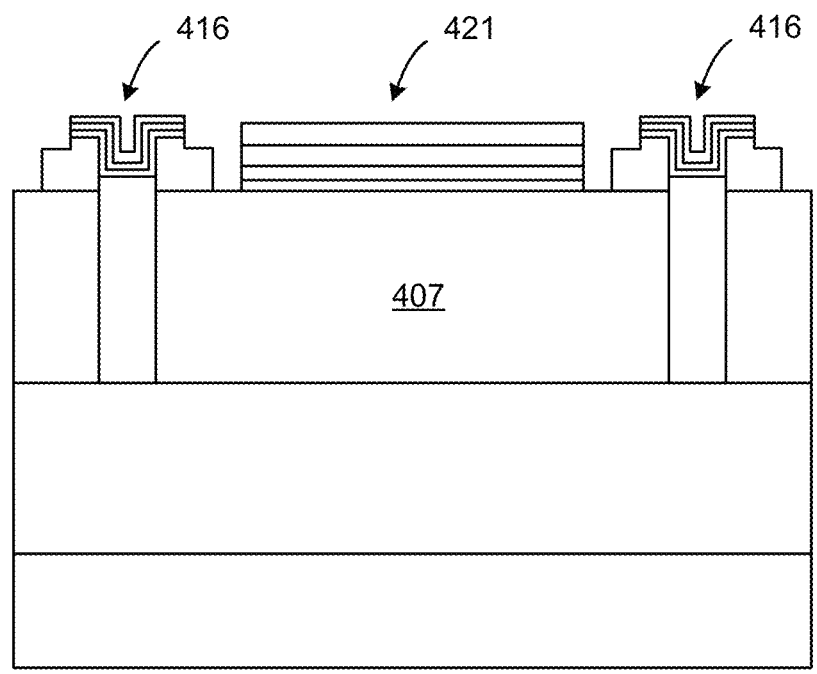
Figure 4S:
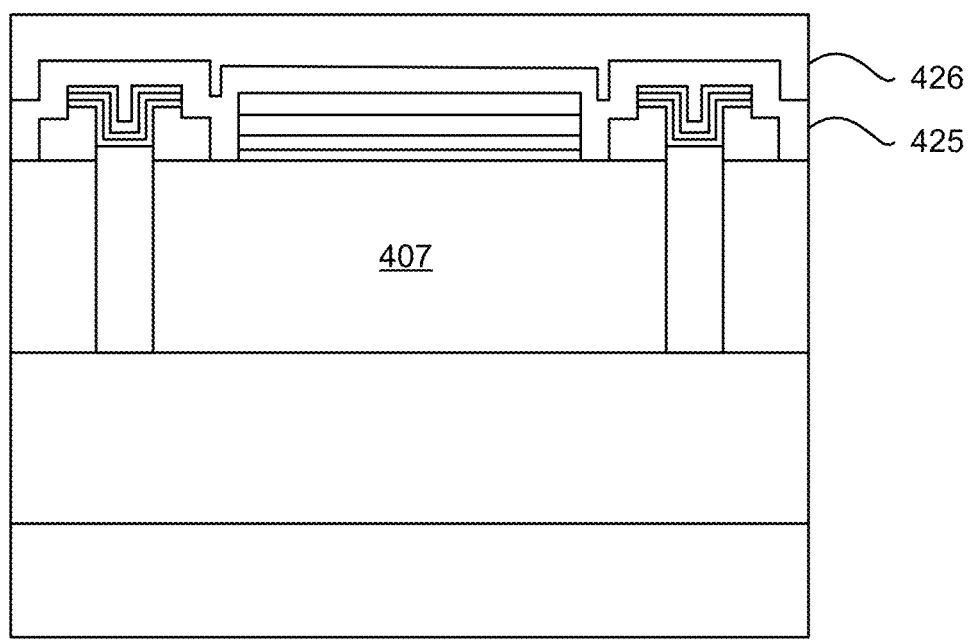
Figure 4T:
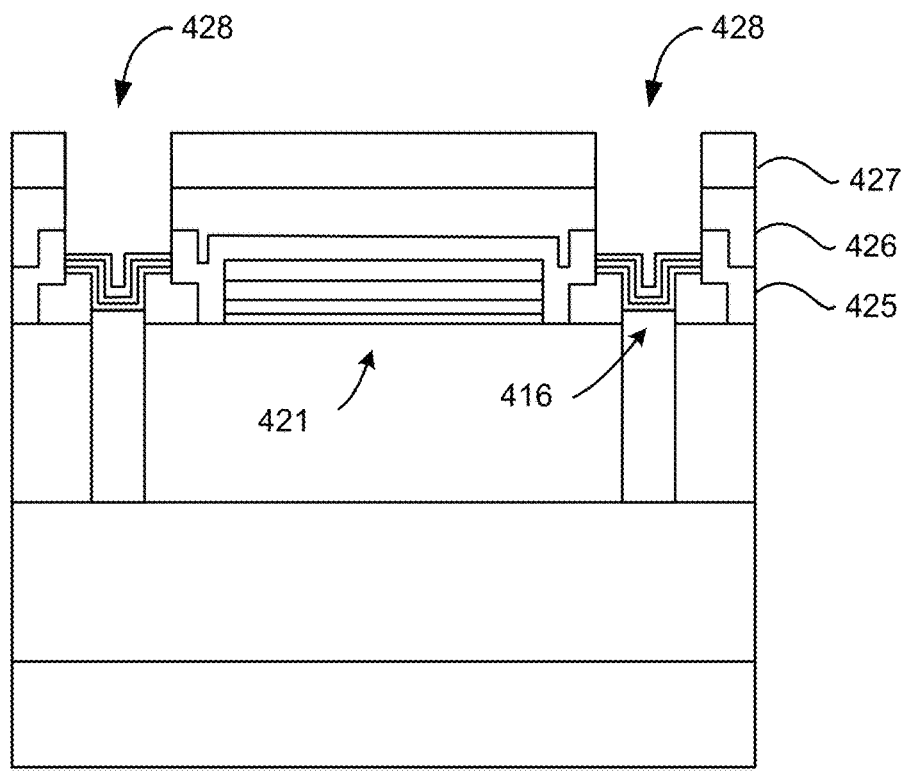
Figure 4U:
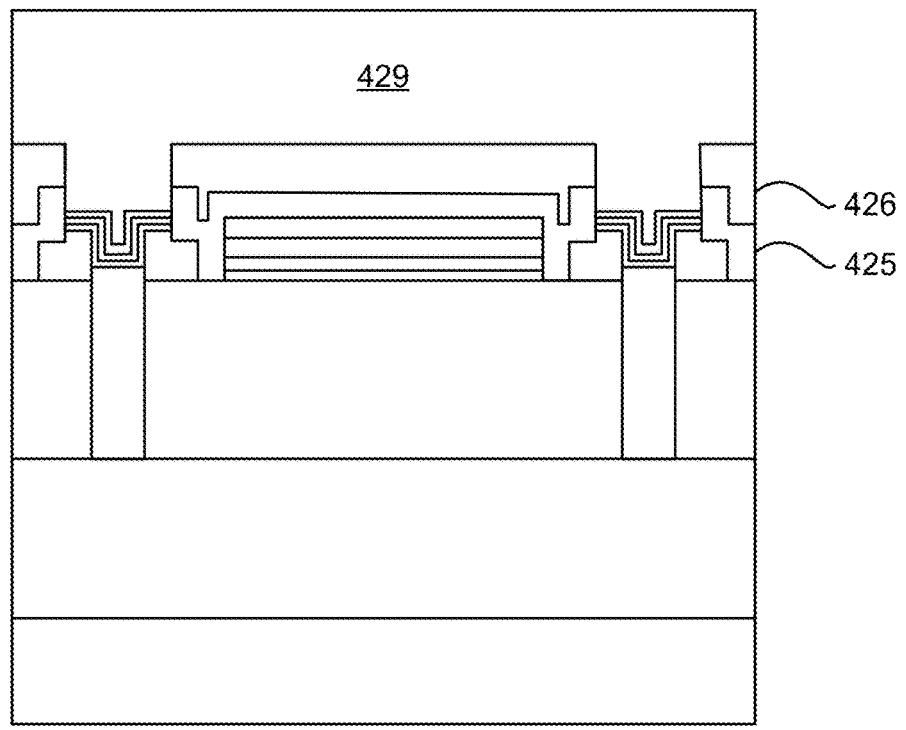

Referring once again to FIG. 3 and with reference to FIGS. 4A through 4U, cross-sectional views showing intermediate stages of various methods of fabricating a vertical-fin-based FET device are shown according to several embodiments of the present disclosure.

Referring to FIG. 4A, an N+ doped III-nitride substrate 401 is provided (block 310). A first N− doped semiconductor (drift) layer, referred to as first semiconductor layer 402, is epitaxially grown on N+ doped III-nitride substrate 401 (block 312) at a temperature between 950° C. and 1200° C., preferably between 1000° C. and 1150° C., and more preferably about 1100° C. In FIG. 4B, a graded doping region 460 having a thickness of about 0.3 μm is disposed between the first and second semiconductor layers and has a dopant concentration that linearly increases from about $1\times10^{16}$ atoms/cm$^3$ to $1.3\times10^{17}$ atoms/cm$^3$, i.e., from the first semiconductor layer toward the second semiconductor layer.

A second N doped semiconductor layer 403 is epitaxially grown on first semiconductor layer 402 (block 314) at a temperature between 950° C. and 1200° C., preferably between 1000° C. and 1150° C., and more preferably about 1100° C. Referring to FIG. 4B, a metal layer 405 is formed on second semiconductor layer 403, and a patterned hardmask layer 406 is formed on metal layer 405 (block 316). In one embodiment, a heavily N+ doped layer 404 may be present between second semiconductor layer 403 and metal layer 405 to improve contact resistance between the second semiconductor layer and the metal layer. In an embodiment, a hardmask layer may include $Si_3N_4$ and is formed with a thickness of about 400 nm by PECVD at about 300° C. In an embodiment, patterned hardmask layer 406 may be formed using RIE with F-based chemistry. In an embodiment, metal layer 405 is omitted.

In an embodiment, N+ doped III-nitride substrate 401 is heavily doped with N-type dopants in a dopant concentration in a range of about $5\times10^{17}$ atoms/$cm^3$ to about $1\times10^{19}$ atoms/$cm^3$ and a resistivity of less than 0.020 ohm-cm. In one embodiment, the resistivity of the N+ doped III-nitride substrate may be from about 0.001 ohm-cm to 0.018 ohm-cm, preferably less than 0.016 ohm-cm, and more preferably, less than 0.012 ohm-cm. First semiconductor layer 402 is a drift layer having a thickness of about 12 μm in a dopant concentration in a range of about $1\times10^{16}$ atoms/$cm^3$. Second semiconductor layer 403 is a fin conduction layer having a uniform doped region with N-type dopants of about $1.3\times10^{17}$ atoms/$cm^3$ and a thickness of about 12 μm. Metal layer 405 may include TiN, and hardmask layer 406 may include silicon nitride. In some of the following drawings and figures, graded doping region 460 and heavily N+ doped layer 404 are omitted for the sake of clarity.

Referring to FIG. 4C, an etch process is performed using the patterned hardmask 406 as a mask to form a plurality of fins 403' (block 318). In some embodiments, the fins each have a width of about 0.2 μm, a height in a range between about 0.7 μm and 0.8 μm, and are spaced apart from each other by a space of about 2 μm, i.e., the fin pitch is about 2 μm. To achieve uniform height of the fins, good controllability of the depth of the etch process is required. In accordance with the present disclosure, an etch process may include Cl-based chemistry using RIE and is carried out to remove a portion of second semiconductor layer 403 to form a recess region 408. In an embodiment, the etch process may stop when about 0.1 μm of graded doping region 460 is removed. The use of the graded doping region to mitigate the electrical effects of the etch process variation or tolerance is utilized as will be described in detail further below.

It is noted that the bottom portion of the fins may have a shape different from the shape shown in FIG. 4C after the etch process. Embodiments of the present disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In the following drawings, the bottom portion of the fins are shown as having a 90 degrees angle with the surface of the graded doping region, i.e., the fins are shown as having a cross-sectional rectangular shape. It is understood that the bottom portion of the fins may have rounded or curved features. Thus, the regions illustrated in the figures are schematic in nature and their shapes are not intended to illustrate the actual shape of a region of a device and are not intended to limit the scope of the invention.

In one embodiment, after forming the trench, a cleaning process is carried using a TMAH solution of about 25% by weight, at a temperature of about 85° C., and for a duration of about 30 minutes. In another embodiment, prior to performing a cleaning using the TMAH solution, a precleaning such as piranha clean using a $H_2SO_4:H_2O$ in a volume ratio 2:1 for 2 minutes may also be performed.

Referring to FIG. 4D, after the cleaning, a third semiconductor layer 407 is epitaxially grown in recess region 408 (block 320). In an embodiment, third semiconductor layer 407 may include a p-type GaN layer that is grown nonconformally in the trench at a temperature of about 950° C. up to a thickness that is substantially planar to the bottom of metal layer 405' (or hardmask 406', if metal layer 405' is omitted). In one embodiment, the thickness of third semiconductor layer 407 is about 840 nm. The p-type GaN layer may be doped with Mg with a dopant concentration of about $1\times10^{19}$ atoms/$cm^3$. The p-type GaN layer may be doped with Mg with a dopant concentration of about $1\times10^{19}$ atoms/$cm^3$. Thereafter, a thermal anneal (e.g., a rapid thermal annealing in Na at 850° C. for 5 minutes) is performed to activate the Mg dopant atoms. The Mg atoms are then activated in the p-type GaN layer in an amount of greater than 10% by weight. In one embodiment, a remaining portion of a heavily N+ doped layer 404 (as shown in FIG. 4B) may be present between fins 403' and metal layer 405' to improve contact resistance between the fins 403' and the metal layer 405'.

In a first embodiment, referring to FIG. 4E, a planarization process may be performed on third semiconductor layer 407. In an embodiment, the planarization process includes removing an upper portion of third semiconductor layer 407 by etching. In an embodiment, the planarization process includes removing about 0.2 μm of the upper portion of third semiconductor layer 407.

Thereafter, a first dielectric layer 410a is formed on at least the planarized surface of fourth dielectric semiconductor layer 407, and substantially conformal to the sidewall of the fin, the metal layer 405' and the hardmask 406'. In an embodiment, the first dielectric layer 410a has a thickness of approximately 100 nm and may include $Si_3N_4$ and be deposited by PECVD at about 300° C. A second dielectric layer 410b is formed on first dielectric layer 410a. In an embodiment, second dielectric layer 410b has a thickness of approximately 100 nm and may include $SiO_2$ and be deposited by PECVD at about 300° C. A third dielectric layer 410c is formed on second dielectric layer 410b. In an embodiment, third dielectric layer 410c has a thickness of approximately 400 nm and may include $Si_3N_4$ and be deposited by PECVD at about 300° C.

Referring to FIG. 4F, third dielectric layer 410c (shown in FIG. 4E) is etched back to form a spacer 412a on the sidewalls of second dielectric layer 410b. In one embodiment, spacer 412a has a width at the foot of about 300 nm.

Referring to FIG. 4G, second dielectric layer 410b is etched using a substantially isotropic etch to expose the top of first dielectric layer 410a over planarized region 407 and over hardmask 406'. In one embodiment, the etch uses a wet etchant such as buffered HF; in another embodiment the etch uses a F-based plasma etch. After etching, the remaining portion of second dielectric layer 410b adjacent to spacer 412a is denoted 410b'.

Referring to FIG. 4H, third dielectric layer 410c (spacer 412a), first dielectric layer 410a, and hardmask 406' are etched to expose the contact region over metal layer 405'. In one embodiment, metal layer 405' is omitted, and the contact region is the top of fin 403'.

Referring to FIG. 4I, the remaining portion of second dielectric layer 410b' (shown in FIG. 4H) is etched to expose the remaining surface of first dielectric layer 410a.

FIG. 4J through FIG. 4M are cross-sectional views showing intermediate stages of a method of fabricating a verticalfin-based FET device according to a second embodiment of the present disclosure. In the second embodiment, starting with the structure shown in FIG. 4D, and referring to FIG. 4J, a planarization process may be performed on third semiconductor layer 407. In an embodiment, the planarization process includes removing an upper portion of third semiconductor layer 407 by etching. In an embodiment, the planarization process includes removing about 0.2 μm of the upper portion of third semiconductor layer 407. Thereafter, a first dielectric layer 450 is formed on the planarized surface of fourth semiconductor layer 407, and a second dielectric layer 452 is formed on first dielectric layer 450. In an embodiment, first dielectric layer 450 may include $SiO_2$ and be deposited by PECVD at about 300° C. Second dielectric layer 452 may include $Si_3N_4$ and be deposited by PECVD at about 300° C.

Referring to FIG. 4K, second dielectric layer 452 is etched back to form a spacer 454 having a thickness of about 2,000 Å on sidewalls of first dielectric layer 450. In one embodiment, first dielectric layer 450 is also etched back by a certain depth such that the upper surface of first dielectric layer 450 is within the thickness of hardmask layer 406', as shown in FIG. 4K.

Referring to FIG. 4L, first dielectric layer 450 is further etched back exposing an upper surface of fourth semiconductor layer 407. In an embodiment, first dielectric layer 450 may be over-etched by an amount of 50% to expose an upper surface and a portion of sidewalls of hardmask layer 406'.

Referring to FIG. 4M, hardmask layer 406' and spacer 454 are removed while retaining the remaining portion of first dielectric layer 450. For purposes of clarity, metal layer 405' has been removed, but it can be utilized to make electrical contact to fins 403' and be included in the device structure as will be evident to one of skill in the art.

FIG. 4N through FIG. 4U are cross-sectional views showing intermediate stages of a method of fabricating a vertical fin-based FET that can be applied to the first and the second embodiments. For purposes of illustration, FIG. 4N through 4U are applied to the second embodiment and those skilled in the art can readily apply the same intermediate stages to the first embodiment. Referring to FIG. 4N, a source mask layer 415 is formed overlying the exposed upper surface of fourth semiconductor layer 407 and having an opening 415a exposing a portion of first dielectric layer 450 and an upper surface of fins 403'. Source mask layer 415 also has an overhang 415b extend over opening 415a. In an embodiment, source mask layer 415 is lift-off capable and has a bottom CD of 0.65 μm and a top CD of 0.55 μm.

Referring to FIG. 4O, a source metal contact structure 416 is formed by deposition at a temperature of about 150° C. on the exposed upper surface of fins 403'. In an embodiment, source metal contact structure 416 may include a stack structure comprising a first source metal layer 416a on the upper surface of fins 403', a second source metal layer 416b on first source metal layer 416a, and a third source metal layer 416c on second source metal layer 416b. If metal layer 405' is present, first source metal layer 416a is on the first metal layer 405'. In an embodiment, first source metal layer 416a includes Ti having a thickness of about 25 nm, second source metal layer 416b includes Al having a thickness of about 100 nm, and third source metal layer 416c includes Mo having a thickness of about 40 nm. In another embodiment, second source metal layer 416b includes TiN and third source metal layer 416c includes Al. In another embodiment, second source metal layer 416b includes TiN and third source metal 416c is omitted. After forming the source metal contact structure, source mask layer 415 is dissolved to lift off the metal layers deposited thereon, while the metal layers deposited on the upper surface of the fins remain intact. In another embodiment, source mask layer 415 is applied in reverse tone after deposition of source metal contact structure 416, and source metal contact structure 416 is etched (e.g., using RIE) except where reverse-tone mask layer 415 is present. Source mask layer 415 is then removed. Source metal contact structure 416 formed below opening 415a will have a width of approximately 0.65 μm corresponding to the width of the opening. In an embodiment, a rapid temperature annealing (RTA) treatment may be performed in $N_2$ at 850° C. for 5 minutes. After the RTA treatment, the source metal contact structure will have a specific resistance of less than about $10^{-5}$ ohm-cm.

In some embodiments, a junction-terminated edge (JTE) structure is formed outside the FET device active area by implantation (e.g., implanting nitrogen (N) or argon (Ar)) to enable stable high-voltage operation of the device.

Referring to FIG. 4P, a gate metal mask layer 420 is formed overlying the exposed upper surface of the source metal structure and having an opening 420a exposing a surface portion of fourth semiconductor layer 407. Gate metal mask layer 420 also has an overhang 420b extending over opening 420a. In an embodiment, gate metal mask layer 420 is lift-off capable and has a bottom CD of 0.9 μm and a top CD of 0.8 μm.

Referring to FIG. 4Q, a gate metal contact structure 421 is formed by deposition through opening 420a onto the exposed surface portion of fourth semiconductor layer 407. In an embodiment, gate metal contact structure 421 may include a stack structure comprising a first gate metal layer 421a on the surface portion of fourth semiconductor layer 407, a second gate metal layer 421b on first gate metal layer 421a, a third gate metal layer 421c on second gate metal layer 421b, and a fourth gate metal layer 421d on third gate metal layer 421c. In an embodiment, first gate metal layer 421a includes Ni, second gate metal layer 421b includes Au, third gate metal layer 421c includes Mo, and fourth gate metal layer 421d includes Au. In another embodiment, gate metal layers 421c and 421d are omitted, and first gate metal layer 421a includes Ni and second gate metal 421b includes Au. In another embodiment, gate metal layer 421d is omitted, and first gate metal layer 421a includes Pd, second gate metal 421b includes Pt, and third gate metal layer 421c includes Au. After forming the gate metal contact structure, gate metal mask layer 420 is dissolved to lift off the metal layers deposited on the gate mask layer while the metal layers deposited on the surface portion of fourth semiconductor layer 407 remain intact.

Referring to FIG. 4R, gate metal mask layer 420 is removed and a thermal anneal is performed to provide a stable, low contact resistance contact. In an embodiment, a rapid thermal annealing (RTA) treatment may be performed in $O_2$ at 500° C. for 10 minutes. After the thermal treatment, the gate metal contact structure 421 will have a specific resistance of less than about $10^{-3}$ ohm-cm.

Referring to FIG. 4S, a first interlayer dielectric layer 425 is deposited covering the gate metal contact structure 421, the source metal contact structure 416, and the surface of the fourth semiconductor layer 407, using a plasma enhanced chemical vapor deposition (PECVD) process at a temperature of 300° C. First interlayer dielectric layer 425 is relatively conformal. In an embodiment, first interlayer dielectric layer 425 has a thickness of approximately 50 nm and may include nitride (e.g., silicon nitride). Next, a second interlayer dielectric layer 426 is deposited on first interlayer dielectric layer 425 using a plasma enhanced chemical vapor deposition (PECVD) process at a temperature of 300° C. (block 336). Second interlayer dielectric layer 426 has a thickness of approximately 50 nm and may include oxide (e.g., silicon oxide).

Referring to FIG. 4T, a patterned photoresist layer 427 is formed over second interlayer dielectric layer 426, which can be planarized or un-planarized. Patterned photoresist layer 427 is formed and patterned with well-known photolithography processes to define locations where a via hole 428 is to be formed. Next, first and second interlayer dielectric layers 425, 426 are etched until an upper surface of the source metal contact structure 416 is exposed. In some embodiments, a via hole to the gate metal contact structure 421 may also be formed concurrently with via hole 428 for the source metal contact structure. In an embodiment, the via hole has a CD of approximately 0.45 µm.

Next, patterned photoresist layer 427 is removed. Referring to FIG. 4U, a conductive material 429 is formed filling via hole 428, and a pad metal deposition is performed on the filled via hole by evaporation to a thickness of about 4 µm. The above described method of fabricating a vertical fin-based FET is advantageous in that a metal, metal alloy, or metal compound layer (e.g., TiN) is formed on the fin epitaxial layer followed by a hardmask layer.

Figure 5:
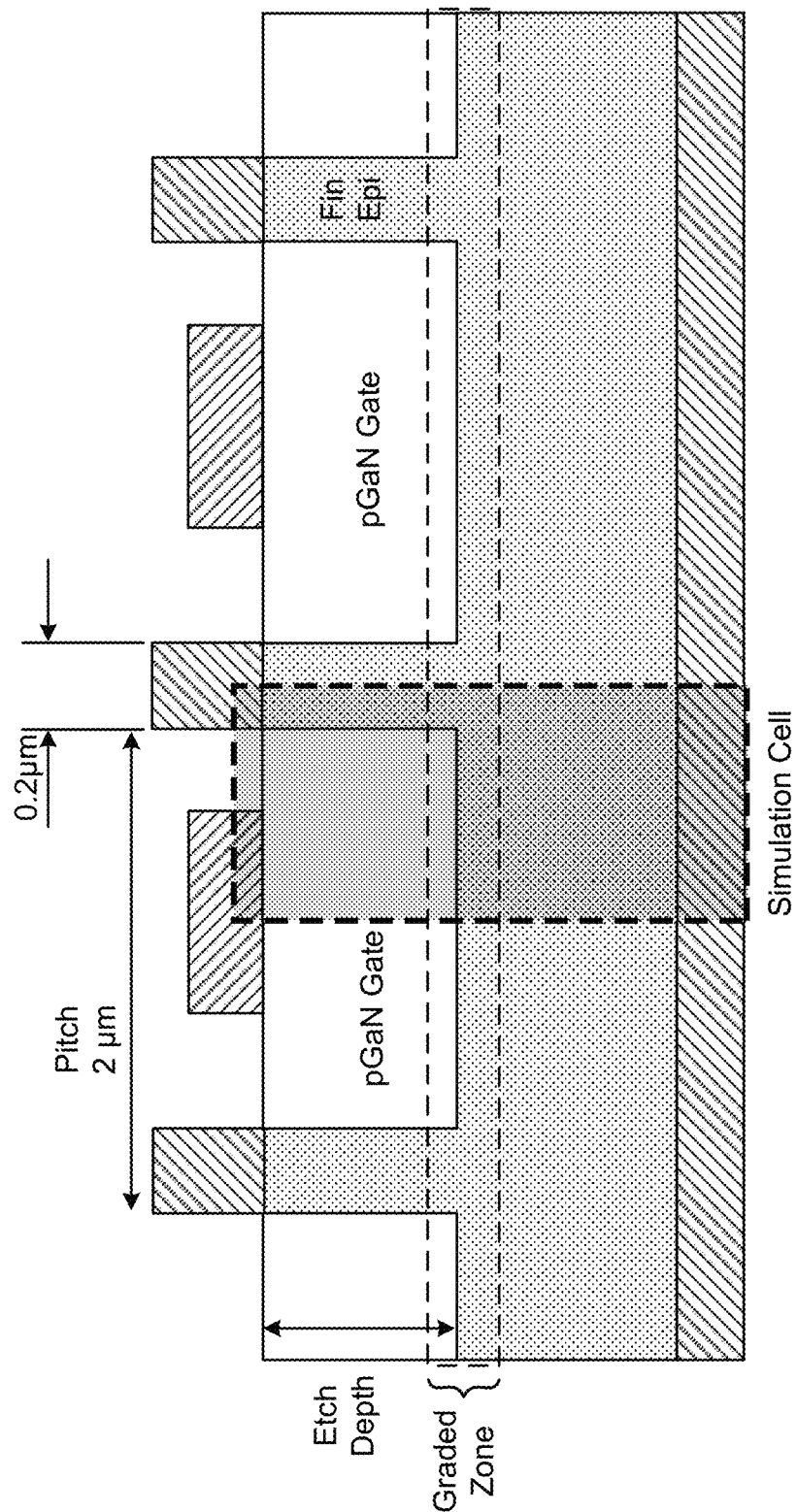
FIG. 5 is a simulation structure of a vertical-fin-based FET device having a 0.2 μm fin thickness.

FIG. 5 is a cross-sectional view of a simulation cell structure using a 0.2 µm fin width. The nominal etch depth is 0.1 µm below the bottom of the fin layer (0.1 µm into the graded zone). Etch depth variations of +/−0.1 µm around the nominal were simulated, as well as a graded zone thickness of 0.2 µm for the second round and 0.3 µm for the third round of simulations.

Figure 6:
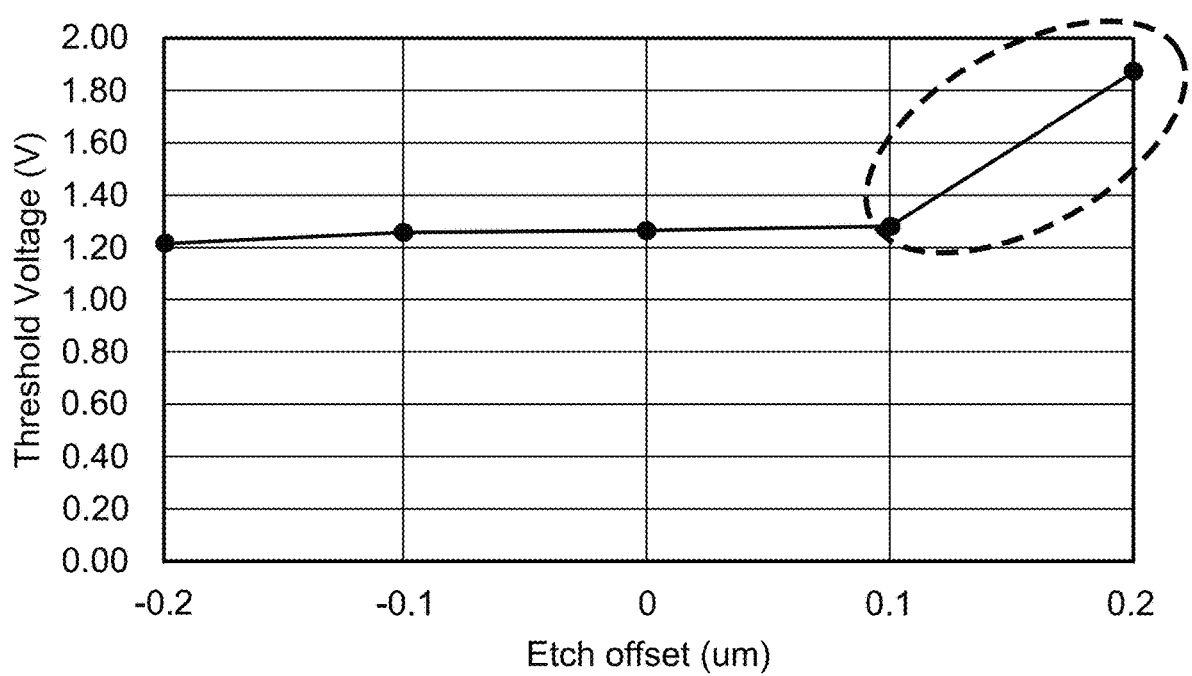
FIG. 6 is a graph illustrating a threshold voltage (in V) of a vertical-fin-based FET device as a function of an etch offset (in μm).

FIG. 6 is a graph illustrating a threshold voltage (in V) of a vertical fin-based FET device as a function of an etch offset (in µm) for a 0.3 µm fin and an ungraded epitaxial layer. The "0" on the x-axis represents the interface between the fin and the drift region. Positive values for the etch offset indicate an overetch into the drift region below the fin layer, and negative values for the etch offset indicate an underetch. The y-axis represents the voltage threshold (V). Referring to FIG. 6, an overetch into the drift region below the fin layer results in a dramatic increase in the voltage threshold. Thus, the inventors have discovered the acceptable limit with respect to an overetch into the drift region for the conductance and the threshold voltage is about 0.1 µm.

Figure 7:
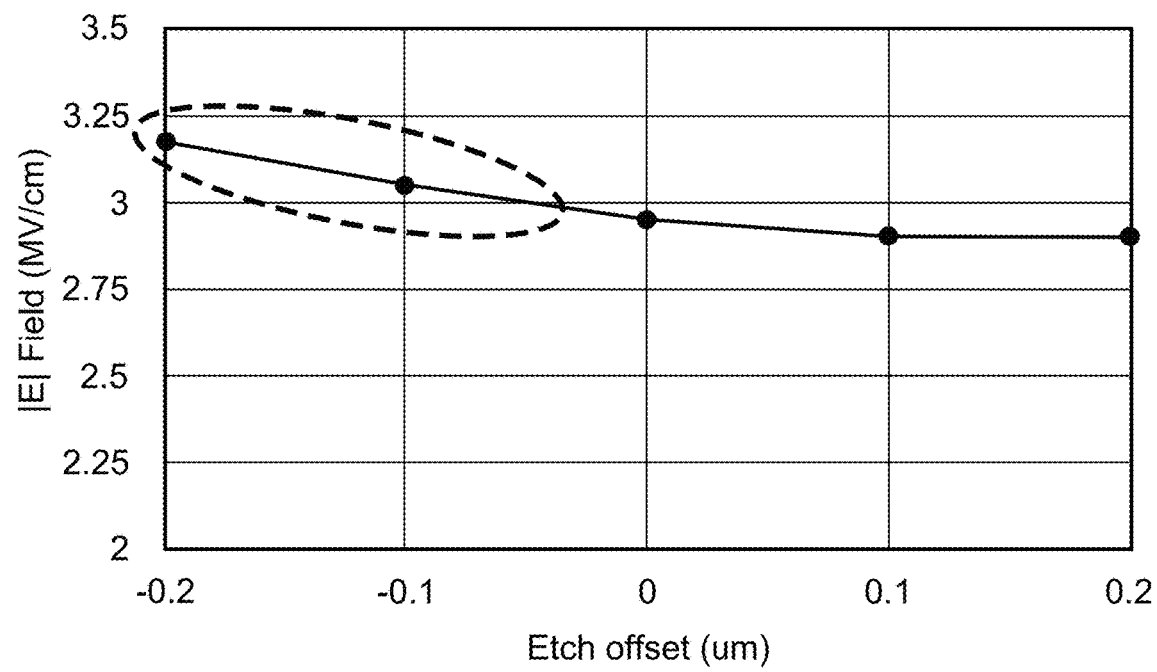
FIG. 7 is a graph illustrating an electric field E (in MV/cm) of a vertical-fin-based FET device as a function of an etch offset (in μm).

FIG. 7 is a graph illustrating an electric field E (in MV/cm) of a vertical fin-based FET device as a function of an etch offset (in µm) for a 0.3 µm fin and an ungraded epitaxial layer. The "0" on the x-axis represents the interface between the fin and the drift region. Positive values for the etch offset indicate an overetch into the drift region below the fin layer, and negative values for the etch offset indicate an underetch. The y-axis represents the electric field E (MV/cm). An underetch of the epitaxial layer (i.e., above the interface with the drift layer) results in a significant increase of the maximum E field. That is, the breakdown risk increases with an underetch of 0.1 µm or more.

Figure 8:
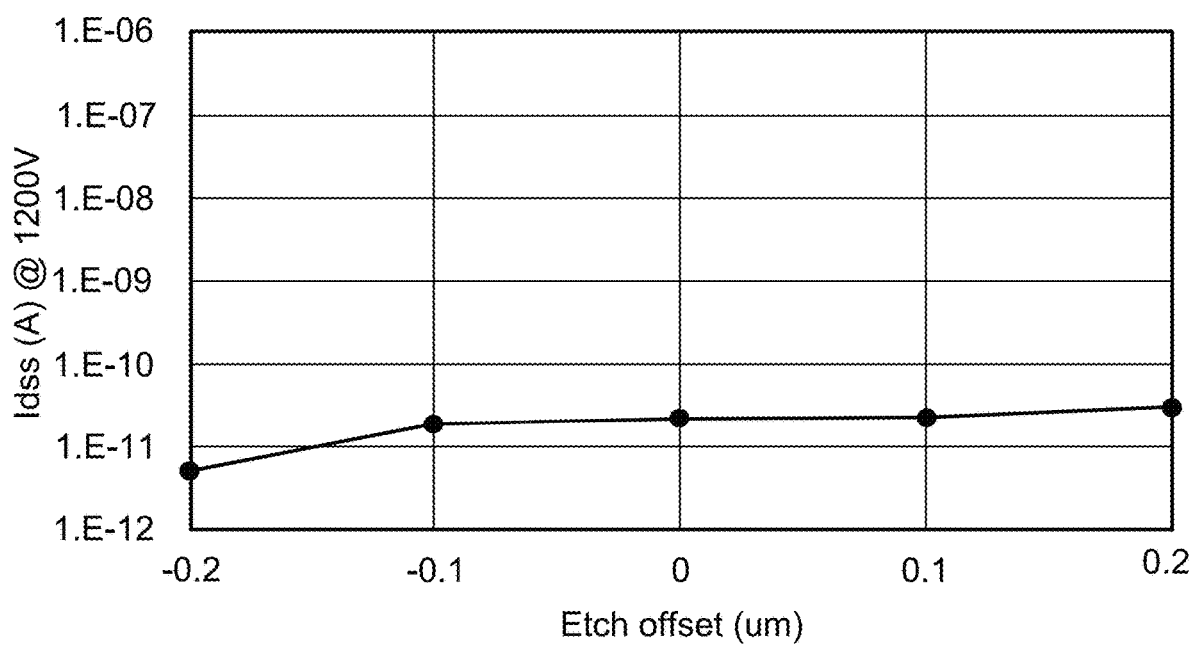
FIG. 8 is a graph illustrating channel leakage (in A) of a vertical-fin-based FET device as a function of an etch offset (in μm).

FIG. 8 is a graph illustrating channel leakage (in A) of a vertical fin-based FET device as a function of an etch offset (in µm) for a 0.3 µm fin and an ungraded epitaxial layer. The "0" in the x-axis represents the interface between the fin and the drift region. Positive values for the etch offset indicate an overetch into the drift region below the fin layer, and negative values for the etch offset indicate an underetch. The y-axis represents the drain-source leakage current Idss (A). Referring to FIG. 8, there is no significant impact of the etch variation on the leakage current.

Figure 9:
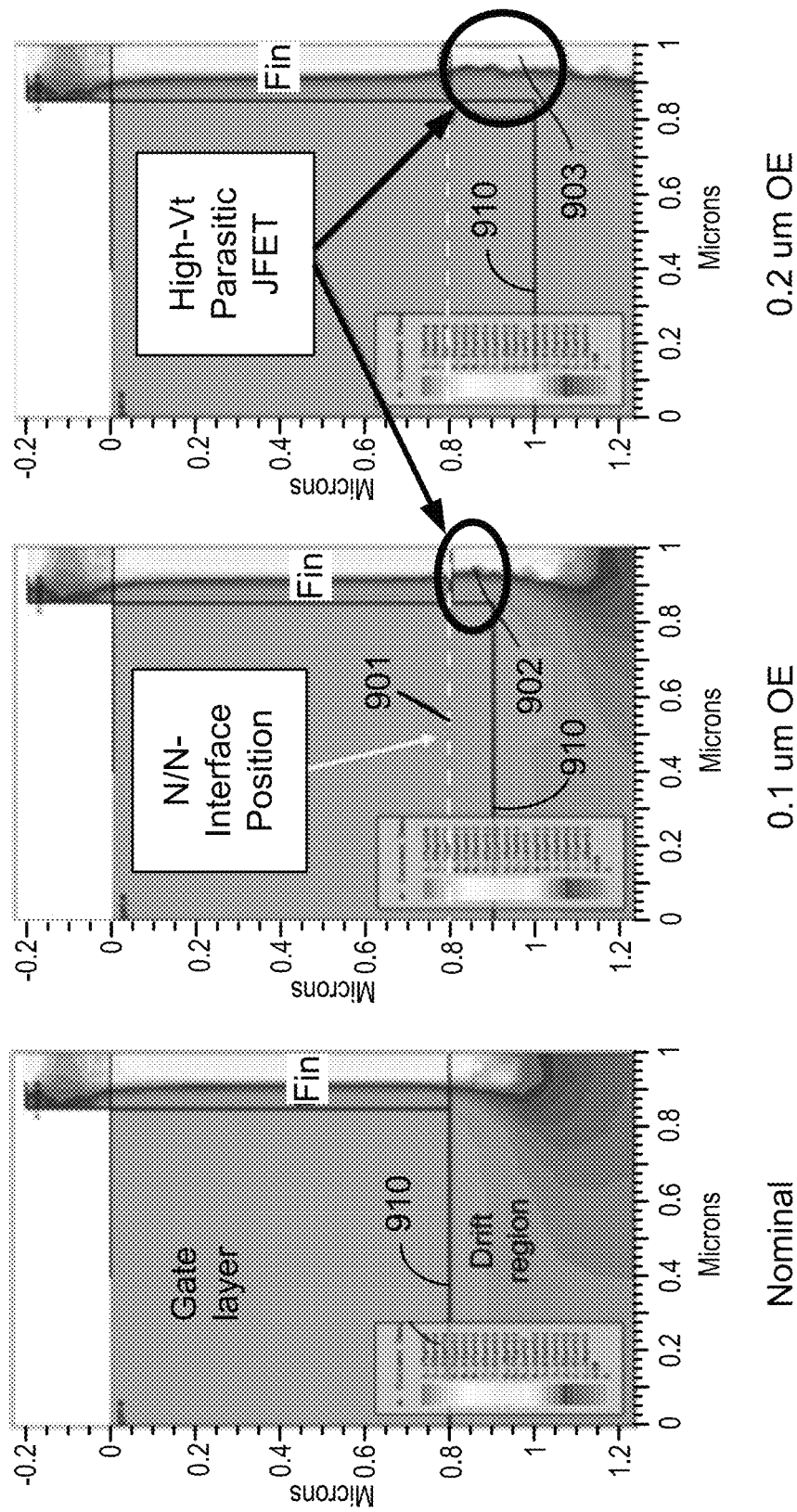
FIG. 9A is a graph illustrating a current density for a normal etch.
FIG. 9B is a graph illustrating a current density for a 0.1 μm overetch.
FIG. 9C is a graph illustrating a current density for a 0.2 μm overetch.

FIG. 9A is a graph illustrating a current density for a normal etch. FIG. 9B is a graph illustrating a current density for a 0.1 µm overetch. FIG. 9C is a graph illustrating a current density for a 0.2 µm overetch. Thus, these graphs illustrate current density (A/cm$^2$) as a function of position relative to the fin for several etch conditions for a 0.3 µm fin and an ungraded epitaxial layer. The fin is located at the right side of each graph. The solid horizontal line 910 is the nominal etch depth, and the dashed line 901 shows the fin/drift region interface. The x-axis represents the position of the current density in microns relative to the fin, where "1" corresponds to the middle of the fin. The y-axis represents the position of the etched drift region relative to the gate layer, where "0" corresponds to the upper surface of the gate layer, and "0.8" corresponds to the nominal bottom position of the gate layer.

Referring to FIG. 9A, for a nominal etch that terminates at the bottom of the gate layer, i.e., the etch depth is 0.8 µm and terminates at the interface with the drift region, the high current density is around the interface between the bottom of the gate layer and the bottom of the fin, and the threshold voltage is in a nominal range. In FIG. 9B, which illustrates a current density for a 0.1 µm overetch, the interface with the bottom of the gate layer is located at 0.9 µm. The threshold voltage is high as indicated by the strip 902. In FIG. 9C, which illustrates a current density for a 0.2 µm overetch, the threshold voltage is worse as indicted by the strip 903. The results are also confirmed in FIG. 6, which shows a significant increase in the threshold voltage at 0.2 µm overetch.

Figure 10:
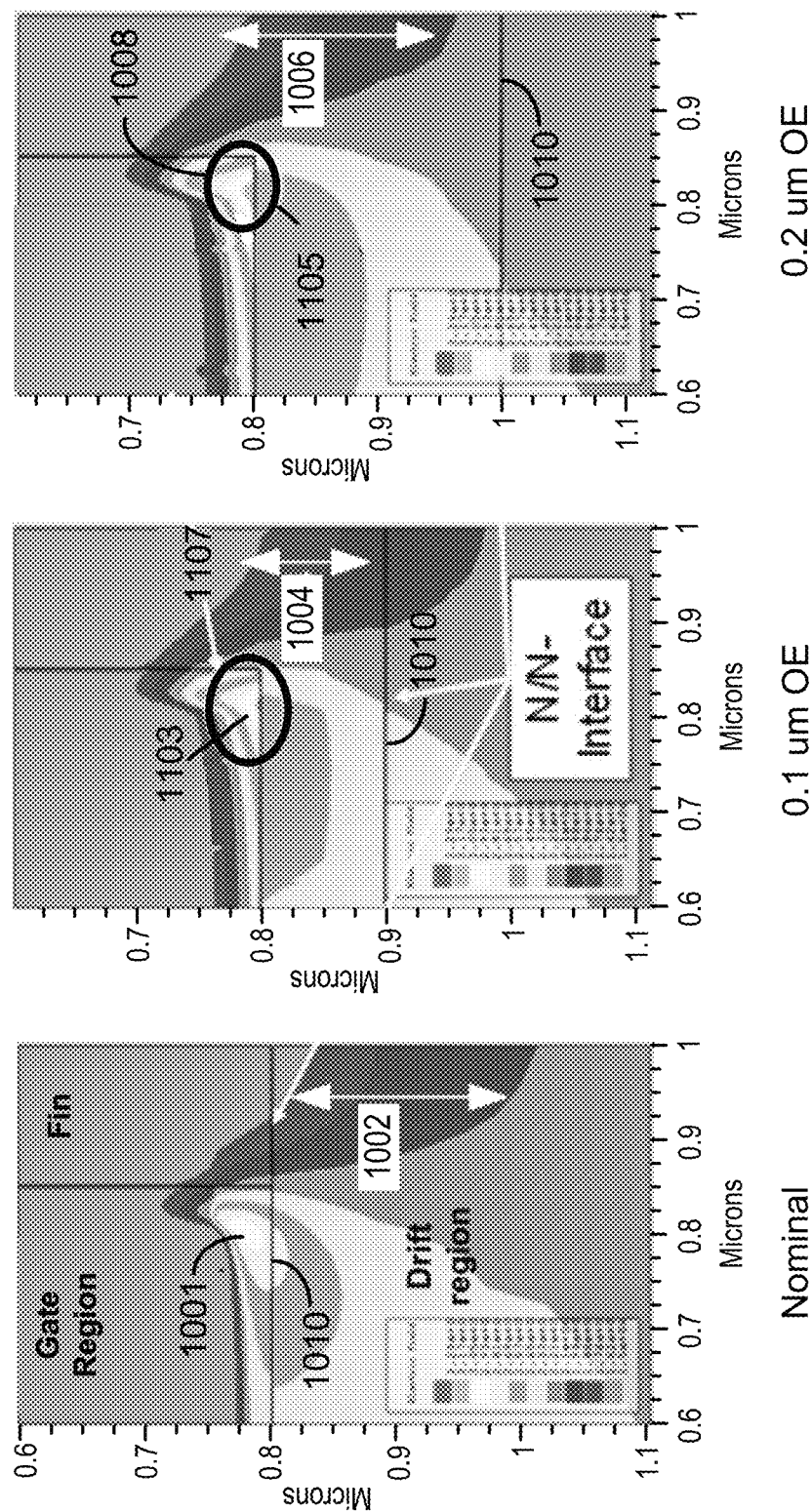
FIG. 10A is a graph illustrating an electric field at the gate corner for a normal etch.
FIG. 10B is a graph illustrating an electric field at the gate corner for a 0.1 μm underetch.
FIG. 10C is a graph illustrating a current density for a 0.2 μm underetch.

FIG. 10A is a graph illustrating an electric field at the gate corner for a normal etch. FIG. 10B is a graph illustrating an electric field at the gate corner for a 0.1 µm underetch. FIG. 10C is a graph illustrating a current density for a 0.2 µm underetch. As illustrated, these graphs show the electric field at the gate corner for different etch conditions. The nominal etch condition is indicated by the horizontal line 1010 marked as "N/N− Interface." FIG. 10A is a graph illustrating the electric field 1001 having a nominal value at the gate corner for a normal etch. The double arrow 1002 shows the heavily doped region below the interface with the gate layer. FIG. 10B is a graph illustrating an electric field 1003 at the gate corner for a 0.1 µm underetch. The double arrow 1004 shows a portion of the heavily doped region disposed between the gate layer and the underetched region, which may cause a high electric filed at the gate corner. FIG. 10C is a graph illustrating an electric field for a 0.2 µm underetch. The high-field region (indicated by ellipse 1007 in FIG. 10B and ellipse 1008 in FIG. 10C) are near the gate corner with the fin. The heavily doped region, indicated by the double arrow 1006, is entirely disposed in the underetched region.

0.2 µm Fin with 0.2 µm Graded Epitaxial Layer

Figure 11:
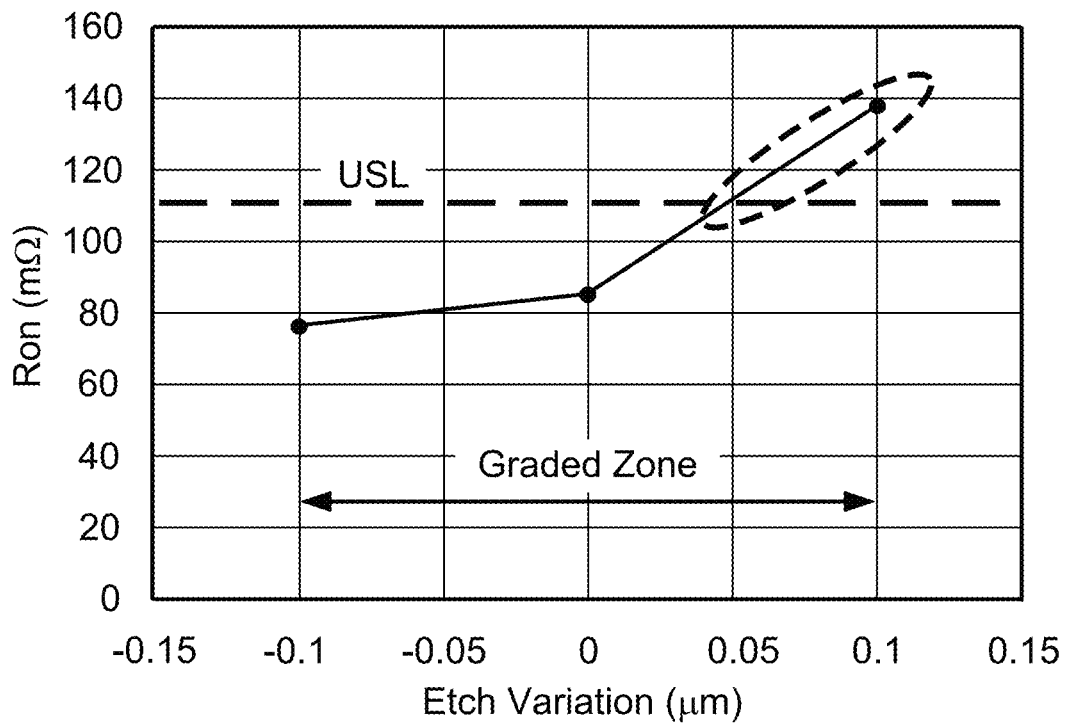
FIG. 11 is a graph illustrating the on-resistance Ron as a function of etch variation (μm) for the 0.2 μm graded epitaxial layer.

FIG. 11 is a graph illustrating the drain-source on-resistance Ron (mΩ) as a function of etch variation (µm) for the 0.2 µm graded epitaxial layer. "0" corresponds to the middle of the 0.2 µm graded epitaxial layer between the fin and the drift regions. Ron increases significantly with a 0.1 µm overetch. Referring to FIG. 11, the Ron upper limit "USL" (upper specification limit) is reached at about 0.05 µm overetch. That is, when the etch variation is within the range between ±0.1 µm, the on-resistance value will be outside the upper specification limit.

Figure 12:
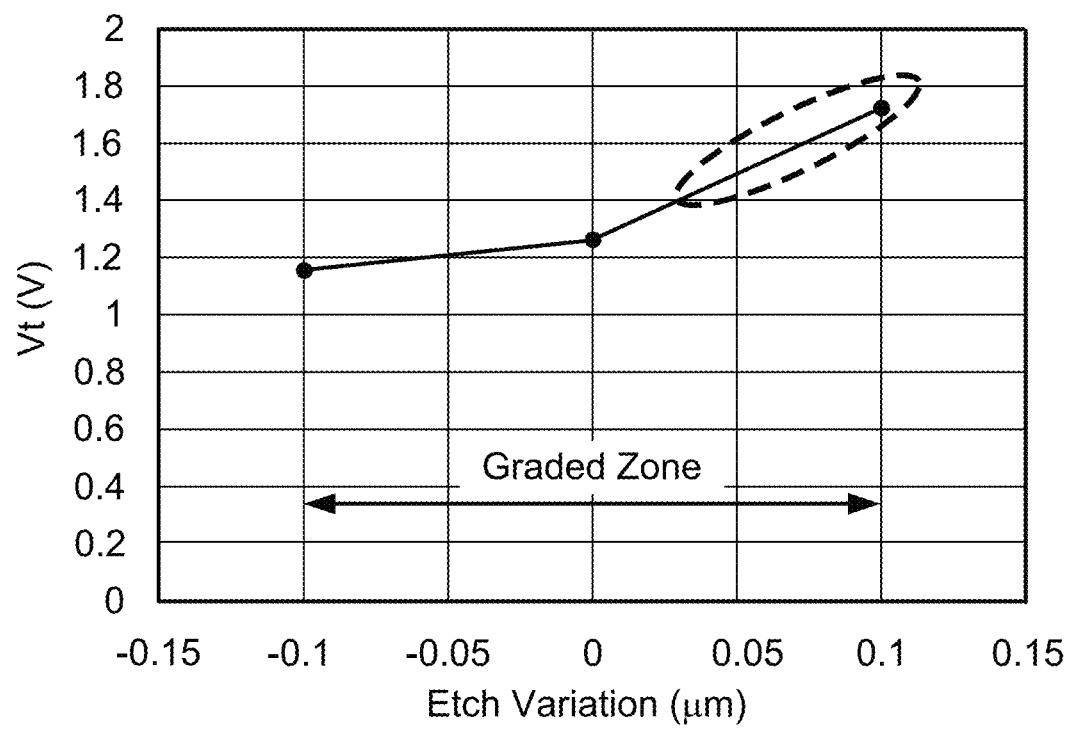
FIG. 12 is a graph illustrating a threshold voltage Vt (V) as a function of etch variation (μm) for the 0.2 μm graded epitaxial layer.

FIG. 12 is a graph illustrating a threshold voltage Vt (V) as a function of etch variation (µm) for the 0.2 µm graded epitaxial layer. "0" corresponds to the middle of the 0.2 µm graded epitaxial layer between the fin and the drift regions. Similar to the on-resistance, the threshold voltage Vt increases significantly with 0.1 µm overetch. That is, when the graded doping zone is overetched, the threshold value may increase to an unacceptable value. Referring to FIGS. 11 and 12, an underetch does provide an improvement in the on-resistance and threshold voltage. The underetch also provides an improvement of the maximum electric field and leakage current, as shown in FIGS. 13 and 14 below.

Figure 13:
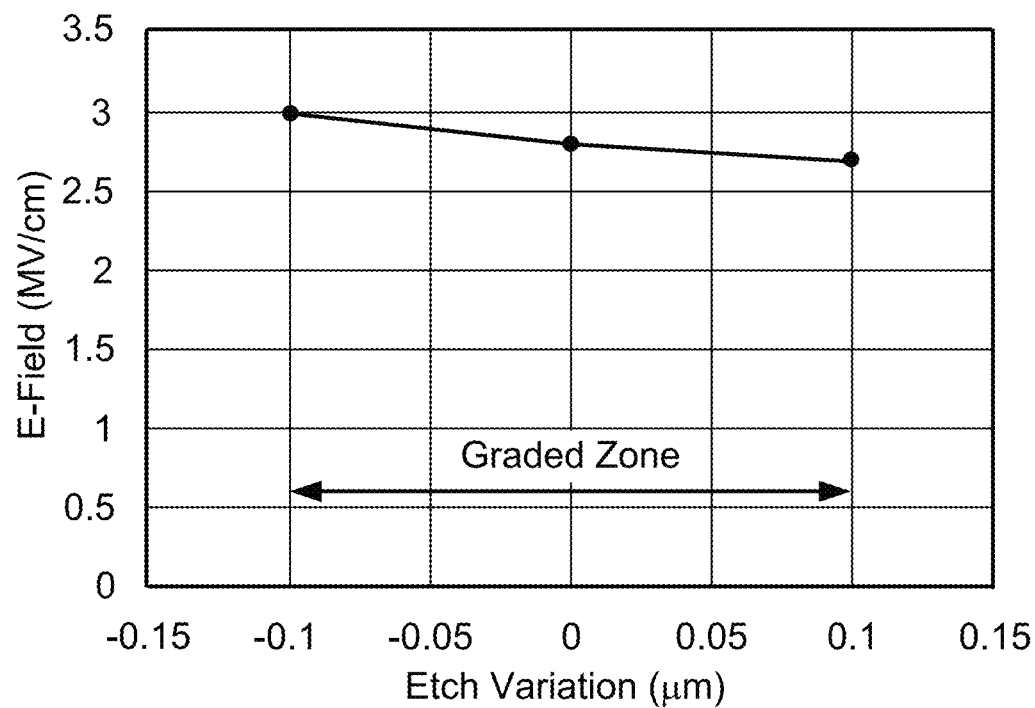
FIG. 13 is a graph illustrating a maximum electric field (MV/cm) as a function of etch variation (μm) for the 0.2 μm graded epitaxial layer.

FIG. 13 is a graph illustrating a maximum electric field (MV/cm) as a function of etch variation (μm) for the 0.2 μm graded epitaxial layer. The 0.2 μm graded epitaxial layer does provide an improvement in the electric field with underetch, by allowing the nominal etch to end in the graded doping layer. The 0.1 μm underetch case is now similar to the nominal case in the first round of simulations, with a slight increase in the electric field because of the additional charge in the graded doping layer.

Figure 14:
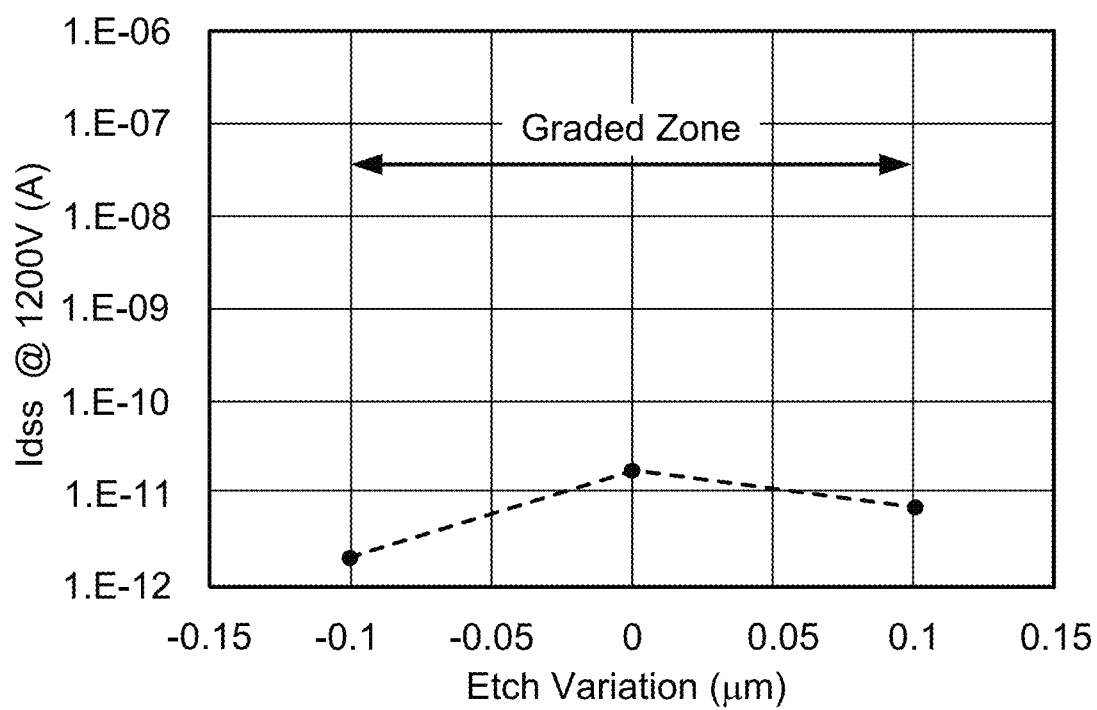
FIG. 14 is a graph illustrating a high-voltage drain leakage current Idss (A) at 1200V as a function of etch variation (μm) for the 0.2 μm graded epitaxial layer.

FIG. 14 is a graph illustrating a high-voltage drain leakage current Idss (A) at 1200V as a function of etch variation (μm) for the 0.2 μm graded epitaxial layer. Referring to FIG. 14, the high-voltage drain leakage current Idss remains well controlled with the graded epitaxial layer. That is, an overetch or underetch does not affect the leakage current.

0.2 μm Fin with 0.3 μm Graded Epitaxial Layer

The inventors conducted a third simulation round using the 0.2 μm fin with a 0.3-μm thick linearly graded epitaxial layer inserted between the fin epitaxial layer and the drift region. In the third simulation round, the nominal etch depth was kept at 0.1 μm below the bottom of the fin epitaxial layer, and the results are shown in FIGS. 16 through 19.

Figure 15:
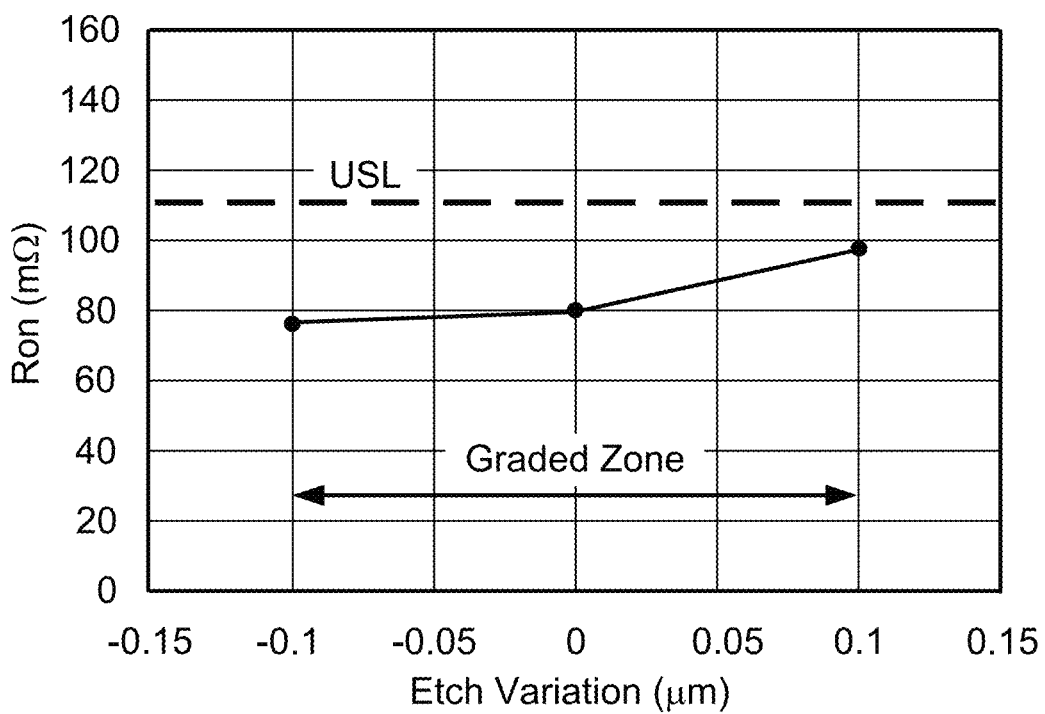
FIG. 15 is a graph illustrating the on-resistance Ron (mΩ) as a function of etch variation (μm) for the 0.3 μm graded epitaxial layer.

FIG. 15 is a graph illustrating the drain-source on-resistance Ron (mΩ) as a function of etch variation (μm) for the 0.3 μm graded epitaxial layer. Referring to FIG. 15, the on-resistance Ron was well controlled for an underetch in the range of −0.1 μm to zero. Referring to FIG. 15, the on-resistance Ron increases by about 10% for the 0.1 μm overetch condition, which is acceptable and much less than on-resistance observed in the 0.2 μm graded epitaxial layer (see FIG. 11) used in the second set of simulations.

Figure 16:
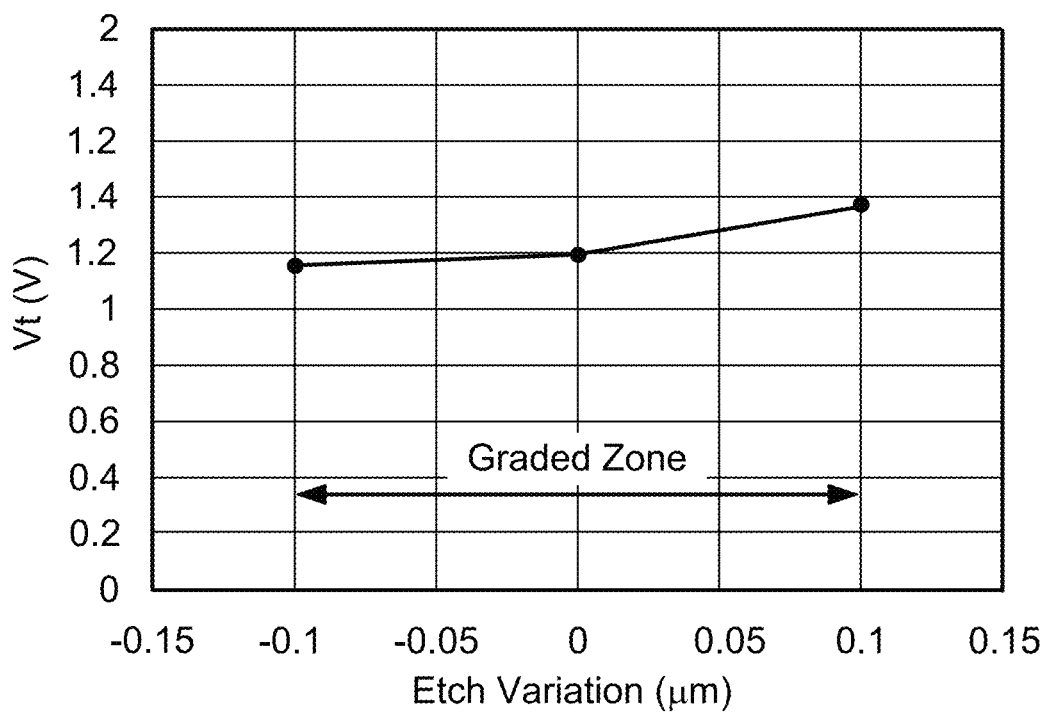
FIG. 16 is a graph illustrating a threshold voltage Vt (V) as a function of etch variation (μm) for the 0.3 μm graded epitaxial layer.

FIG. 16 is a graph illustrating a threshold voltage Vt (V) as a function of etch variation (μm) for the 0.3 μm graded epitaxial layer. Referring to FIG. 16, the threshold voltage Vt was well controlled for an underetch in the range of −0.1 μm to zero. The threshold voltage Vt increase by about 10% with the 0.1 μm overetch, which is acceptable and much less than the threshold voltage Vt illustrated in FIG. 12 for the structure utilizing 0.2 μm graded epitaxial layer used in the second set of simulations.

Figure 17:
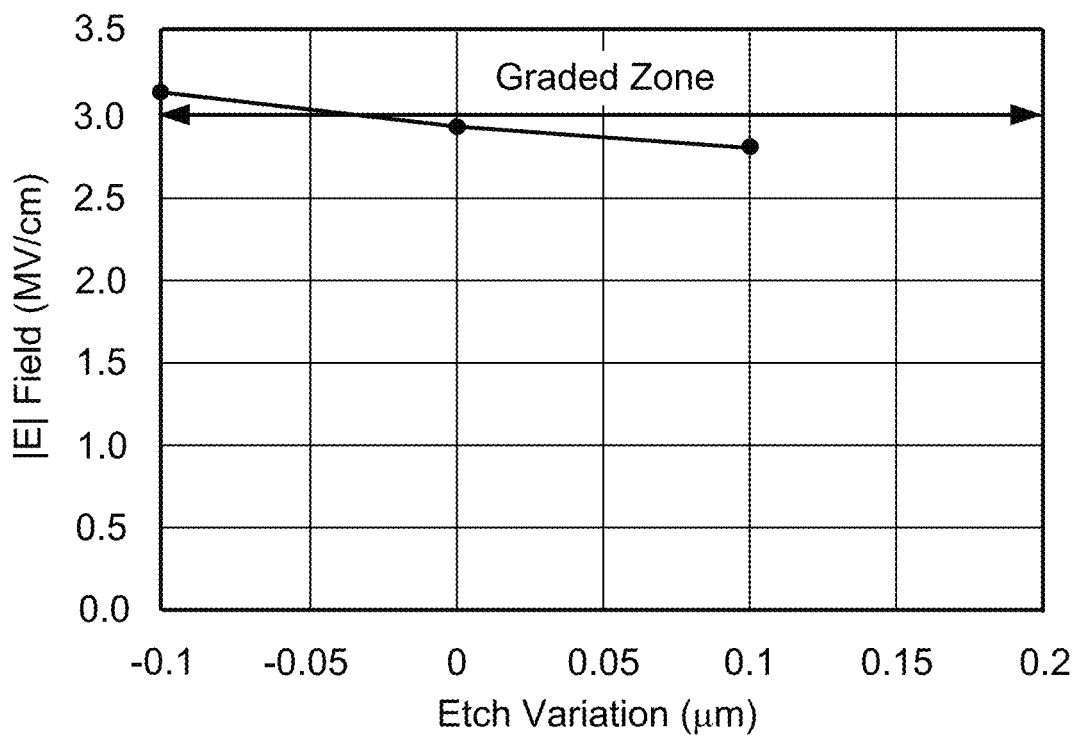
FIG. 17 is a graph illustrating an electric field (MV/cm) as a function of etch variation (μm) for the 0.3 μm graded epitaxial layer.

FIG. 17 is a graph illustrating an electric field (MV/cm) as a function of etch variation (μm) for the 0.3 μm graded epitaxial layer. Referring to FIG. 17, the electric field is higher with the 0.3 μm graded region than with the 0.2 μm graded region illustrated in FIG. 13. At the 0.1 underetch condition, the electric field is about 3.15 MV/cm (at the borderline), i.e., the maximum electric field is marginal at the minimum etch depth. The borderline or marginal condition would be improve by additional optimization, either through a change in the grading or re-centering of the nominal etch depth.

Figure 18:
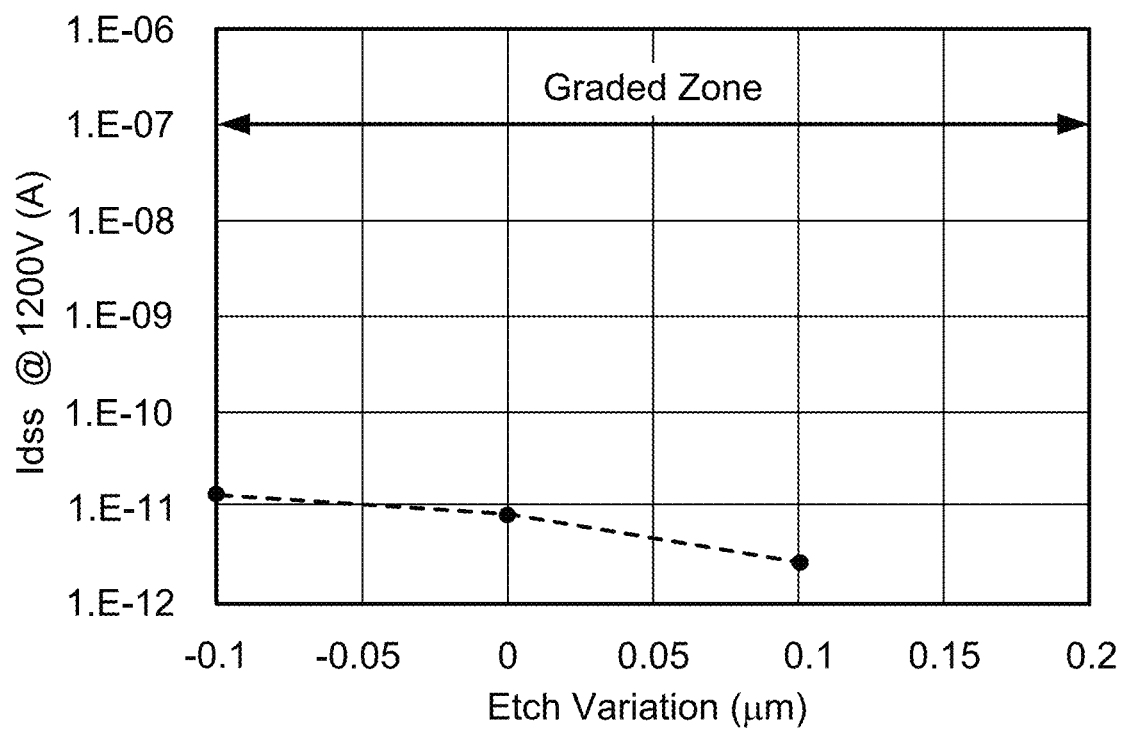
FIG. 18 is a graph illustrating a high-voltage drain leakage current Idss (A) at 1200V as a function of etch variation (μm) for the 0.3 μm graded epitaxial layer.

FIG. 18 is a graph illustrating a high-voltage drain leakage current Idss (A) at 1,200V as a function of etch variation (μm) for the 0.3 μm graded epitaxial layer. Referring to FIG. 18, the high-voltage drain leakage current Idss was well controlled over the simulated etch range.

In summary, the inventors have determined that using an abrupt fin-epitaxial layer to drift region doping transition, the expected fin-etch depth process variation will cause unacceptable variations in the drain-source on-resistance Ron, the threshold voltage Vt, and breakdown voltage. Inserting a graded-doping zone as a transition layer between the fin-epitaxial region and the drift region significantly improves the parameter variation with etch process variation. A linearly-graded, 0.3 μm transition zone achieves good control over the drain-source on-resistance Ron and Vt variations. The electric field is high, and the grading (or etch depth) is optimized by embodiments of the present invention to reduce the electric field levels to about 3 MV/cm.

In one embodiment, an existing Silvaco TCAD model for the FET device was modified to use $In_{0.15}Ga_{0.85}N$ material in the gate region. Expected polarization charge at the $In_{0.15}Ga_{0.85}N/GaN$ interface was calculated using material models and a strain calculation.

Table 1 shows calculated charge components for the $In_{0.15}Ga_{0.85}N/GaN$ interface.

TABLE 1

| $In_{0.15}Ga_{0.85}N/GaN$ | |
|---|---|
| Spontaneous, $P_{sp}$ | 2.197e13 cm$^{-2}$ |
| Piezoelectric, $P_{pz}$ | −1.117e13 cm$^{-2}$ |
| Net, $P_{total}$ | 1.08e13 cm$^{-2}$ |

It is assumed that this polarization charge occurs on the c-plane, but not on the channel sidewall (m-plane), following the typical behavior of III-N heterointerfaces on these planes.

Figure 19B:
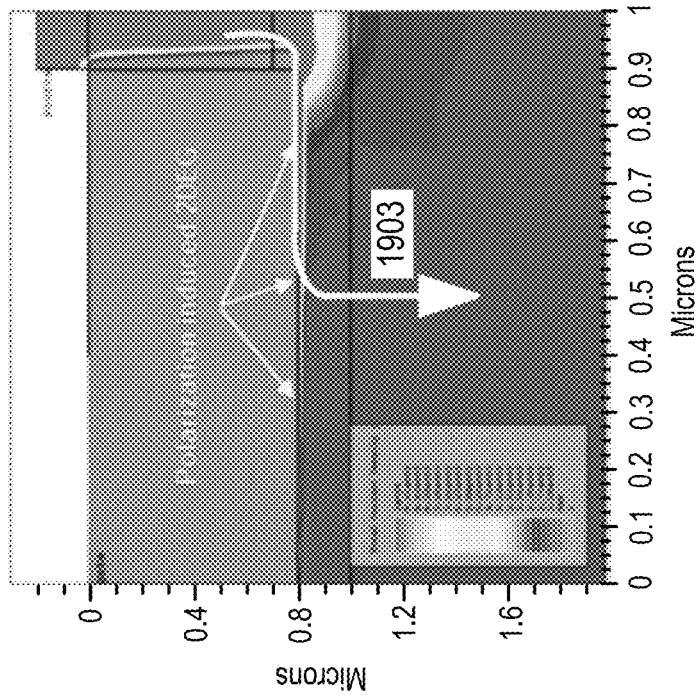
FIG. 19B is a graph illustrating an effect of the polarization charge predicted to result at the c-plane $In_{0.15}Ga_{0.85}N$/GaN interface according to some embodiments of the present disclosure.
Figure 19A:
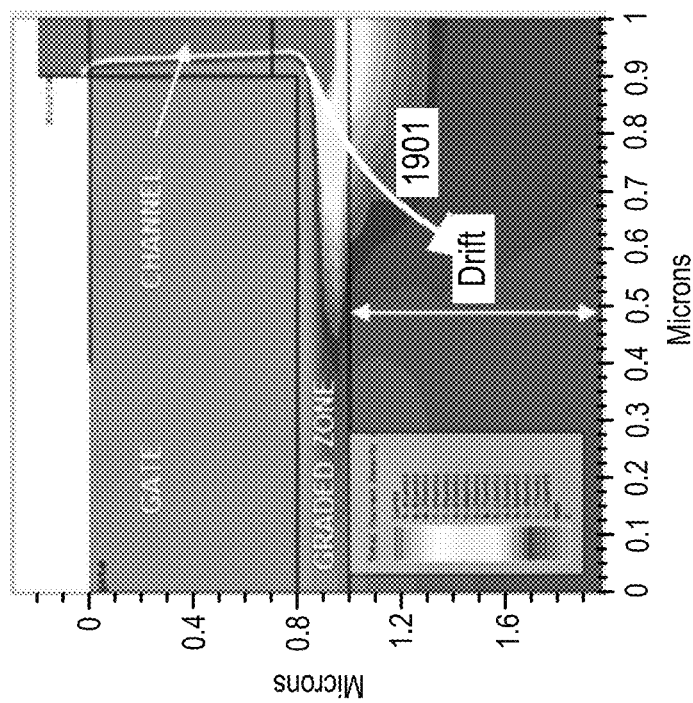
FIG. 19A is a graph illustrating an effect of no polarization charge on the current density predicted to result at the c-plane $In_{0.15}Ga_{0.85}N$/GaN interface.

FIG. 19A is a graph illustrating an effect of no polarization charge on the current density predicted to result at the c-plane $In_{0.15}Ga_{0.85}N/GaN$ interface. The graph shows a 2D cross section of total current density for the case where polarization is not included. Referring to FIG. 19A, a current 1901 flows from the channel region between the fin (i.e., the channel) and the gate region toward the drift region without sufficiently spreading horizontally through the interface between the $In_{0.15}Ga_{0.85}N$ gate region and the GaN drift region. FIG. 19B is a graph illustrating an effect of the polarization charge predicted to result at the c-plane $In_{0.15}Ga_{0.85}N/GaN$ interface according to some embodiments of the present disclosure. The graph shows a 2D cross section of total current density for the case where polarization is included. The net positive fixed charge at the interface due to polarization is expected to attract equal and opposite mobile charge (2D electron gas). The 2DEG at this location results in greater current spreading at the channel opening to the drift layer. Referring to FIG. 19B, the current 1903 flows horizontally along a lateral surface of the bottom portion of the gate layer via a two-dimensional electron gas (2DEG), which is induced by polarization of the $In_{0.15}Ga_{0.85}N/GaN$ interface in the c-plane, then vertically in a direction toward the substrate and the drain metal contact through the drift region. This can provide significant advantages of smaller device sizes and lower costs over existing devices that do not include polarization.

Figures 20A, 20B:
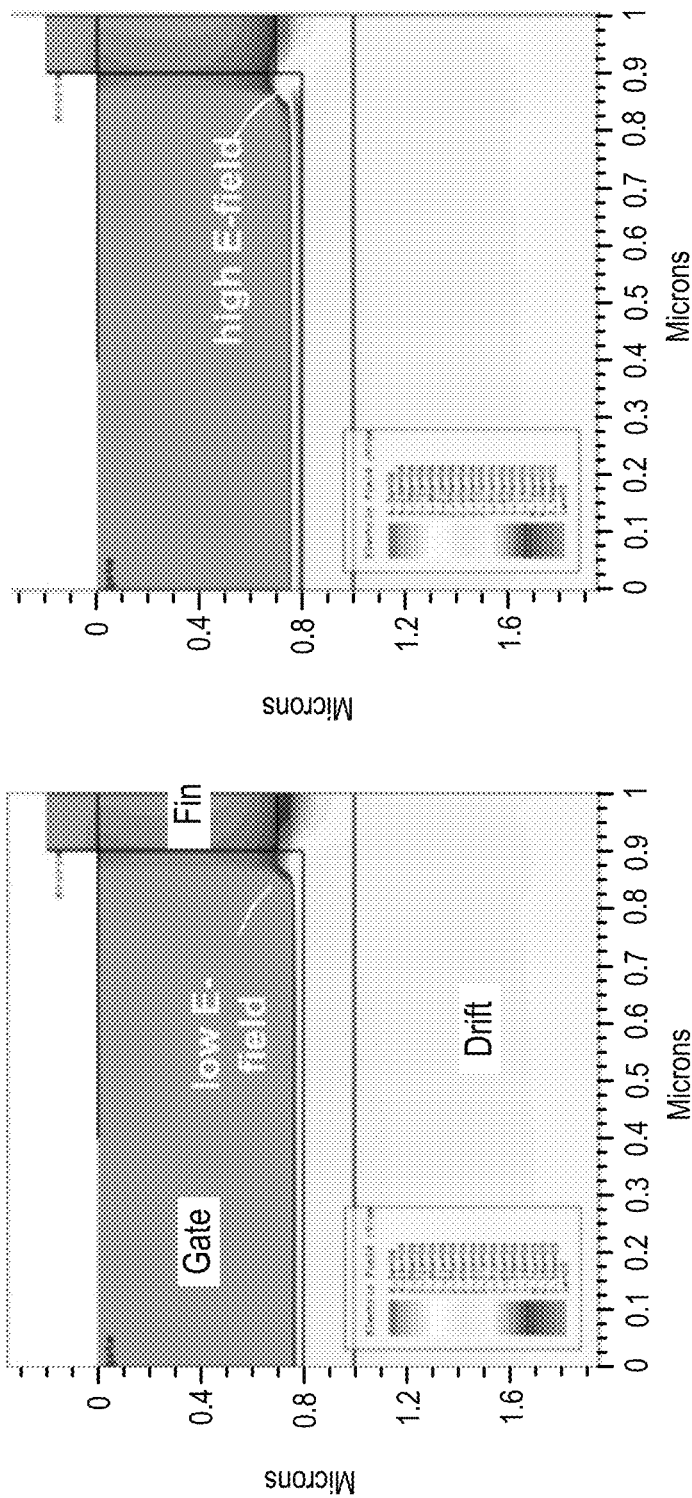
FIG. 20A is a graph illustrating an effect of an electric field predicted to result at the interface between the c-plane $In_{0.15}Ga_{0.85}N$ gate layer and the GaN drift layer.
FIG. 20B is a graph illustrating an effect of an electric field predicted to result at the c-plane $In_{0.15}Ga_{0.85}N$/GaN interface according to some embodiments of the present disclosure. The graph shows a relatively high electric field is formed due to the polarization in an off state.

FIG. 20A is a graph illustrating an effect of an electric field predicted to result at the interface between the c-plane $In_{0.15}Ga_{0.85}N$ gate layer and the GaN drift layer. A relatively low electric field is formed uniformly between the gate layer (region) and the drift layer (region) in an off state. FIG. 20B is a graph illustrating an effect of an electric field predicted to result at the c-plane $In_{0.15}Ga_{0.85}N/GaN$ interface according to some embodiments of the present disclosure. The graph shows a relatively high electric field is formed due to the polarization in an off state.

Figure 20C:
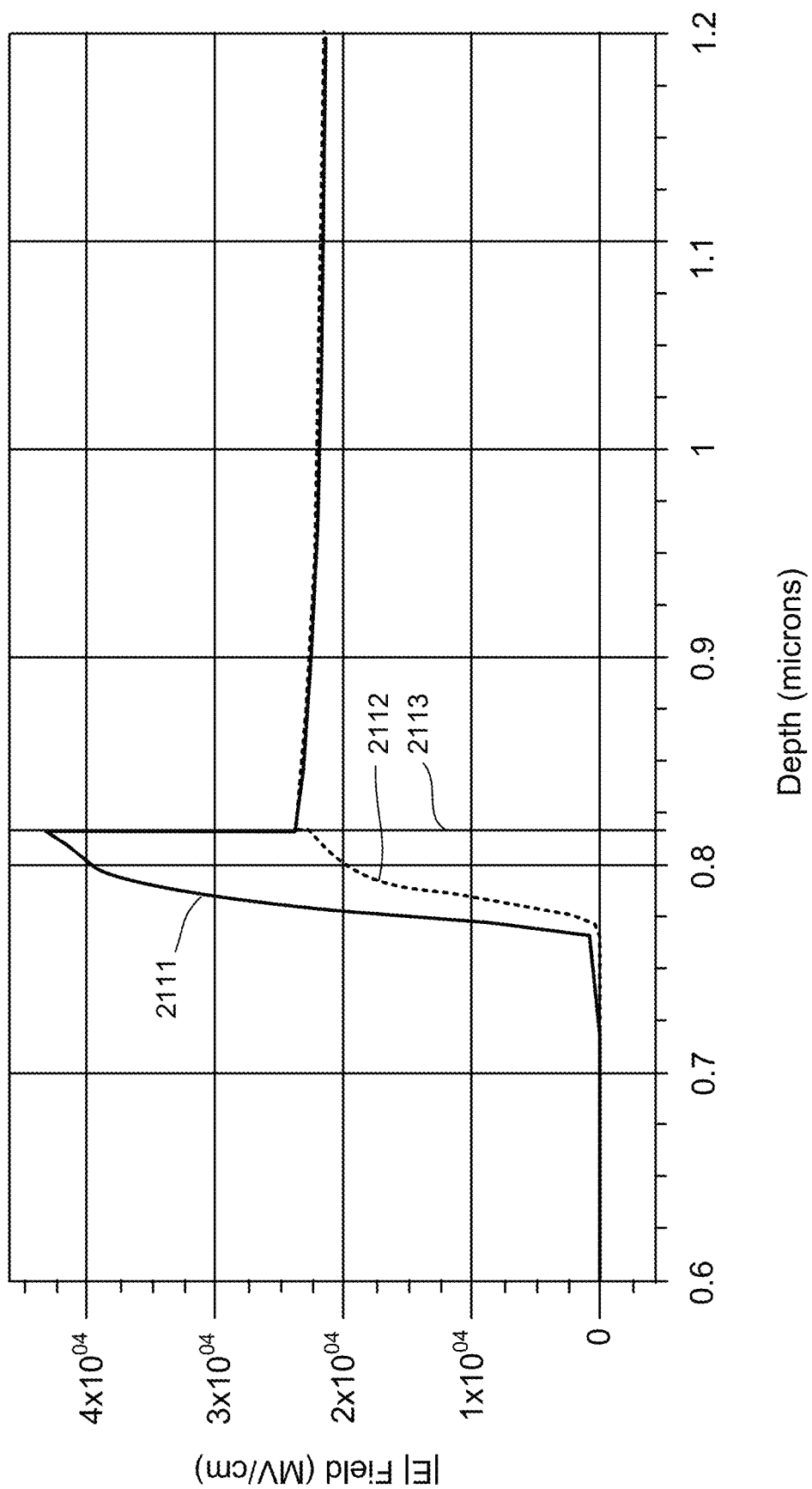
FIG. 20C is a graph illustrating the off-state magnitude of electric field without polarization and with polarization.

FIG. 20C is a graph illustrating the off-state magnitude of electric field without polarization 2111 and with polarization 2112. Referring to FIG. 20C, a vertical cutline 2113 is illustrated passing through the non-channel (p-n junction region). The presence of the 2DEG due to polarization results in high electric field at the interface in the off-state.

Table 2 illustrates simulated electrical parameters of a baseline GaN FinFET vs. an $In_{0.15}Ga_{0.85}N$ gate FinFET which includes polarization.

TABLE 2

|  | Baseline FinFET | InGaN FinFET with polar |
|---|---|---|
| Ichannel | 0.8 | 0.8 |
| Nchannel | 1.30E+17 | 1.30E+17 |
| Graded landing | yes | yes |
| Fin width (μm) | 0.2 | 0.2 |
| Vth (V) | 1.23 | 1.15 |
| IDSS@1200 V (A) | 8.70E−12 | 7.10E−12 |
| Max E (MV/cm) | 2.92 | 4.5 |
| Max E ∥ (MV/cm) | 2.4 | 2.4 |
| Conductance/unit trench (S/cm) | 6.55E−08 | 6.60E−0.8 |

As has been demonstrated in FIG. 19A, FIG. 19B, FIGS. 20A through 20C, and Table 2 above, the use of 15% InGaN is shown to be capable of providing the benefits expected (lower threshold voltage: Vth 1.15 V vs. 1.23V), but with a severe tradeoff of increased E-field (4.5 MV/cm vs. 2.92 MV/cm) in the off-state. It suggests using a lower percentage In, which results in lower polarization charge, or even negligible polarization. The present inventors will show simulation results for a non-polar InGaN FINFET structure below.

Table 3 illustrates simulated electrical parameters of a baseline GaN FinFET vs. a non-polar InGaN gate FinFET.

TABLE 3

|  | Baseline FinFET | InGaN FinFET non-polar |
|---|---|---|
| Ichannel | 0.8 | 0.8 |
| Nchannel | 1.30E+17 | 1.30E+17 |
| Graded landing | yes | yes |
| Fin width (μm) | 0.2 | 0.2 |
| Vth (V) | 1.23 | 1.15 |
| IDSS@1200 V (A) | 8.70E−12 | 7.10E−12 |
| Max E (MV/cm) | 2.92 | 2.6 |
| Max E ∥ (MV/cm) | 2.4 | 2.4 |
| Conductance/unit trench (S/cm) | 6.55E−08 | 6.60E−0.8 |

Referring to Table 3, the use of InGaN results in a −0.08V threshold voltage shift (1.15V vs. 1.23V) with a low electric field (2.6 MV/cm vs. 2.92 MV/cm). The channel doping can be re-tuned to return to the baseline threshold voltage, resulting in very little electrical difference between the structures. The advantage for InGaN will be lower temperature growth and better ohmic contact and p-type doping.

Figure 21A:
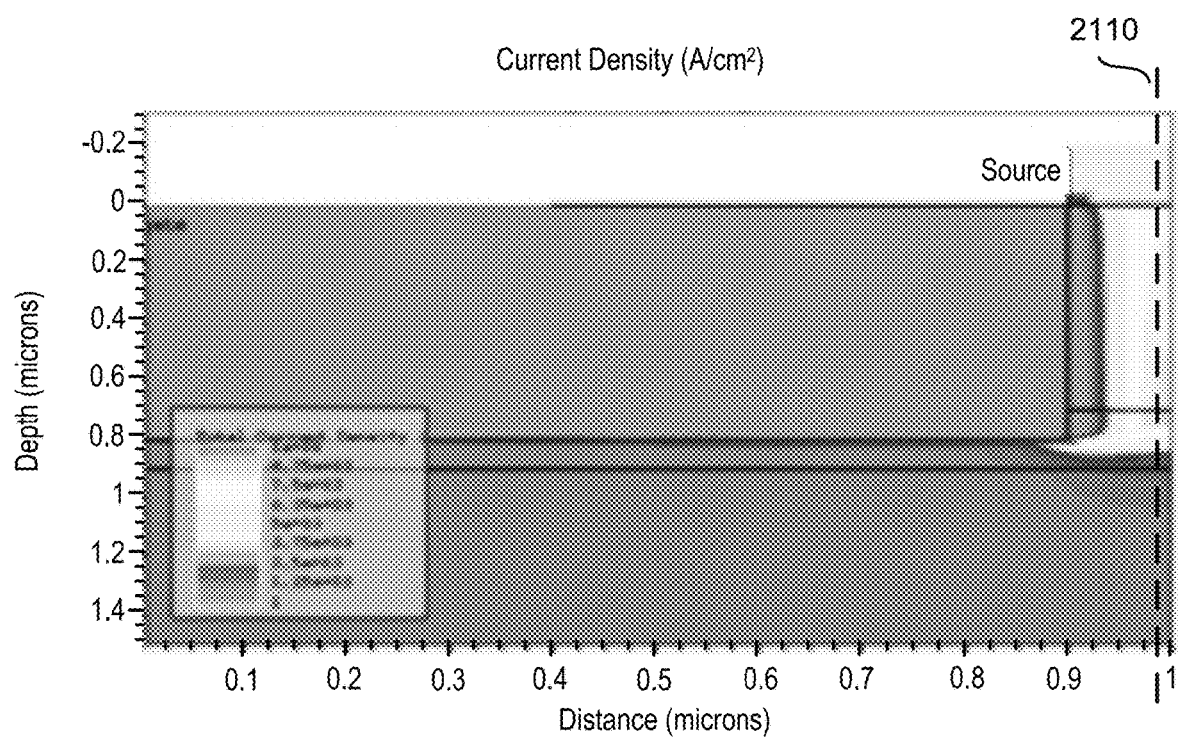
FIG. 21A is a graph illustrating current density through the channel of a baseline FET.
Figure 21B:
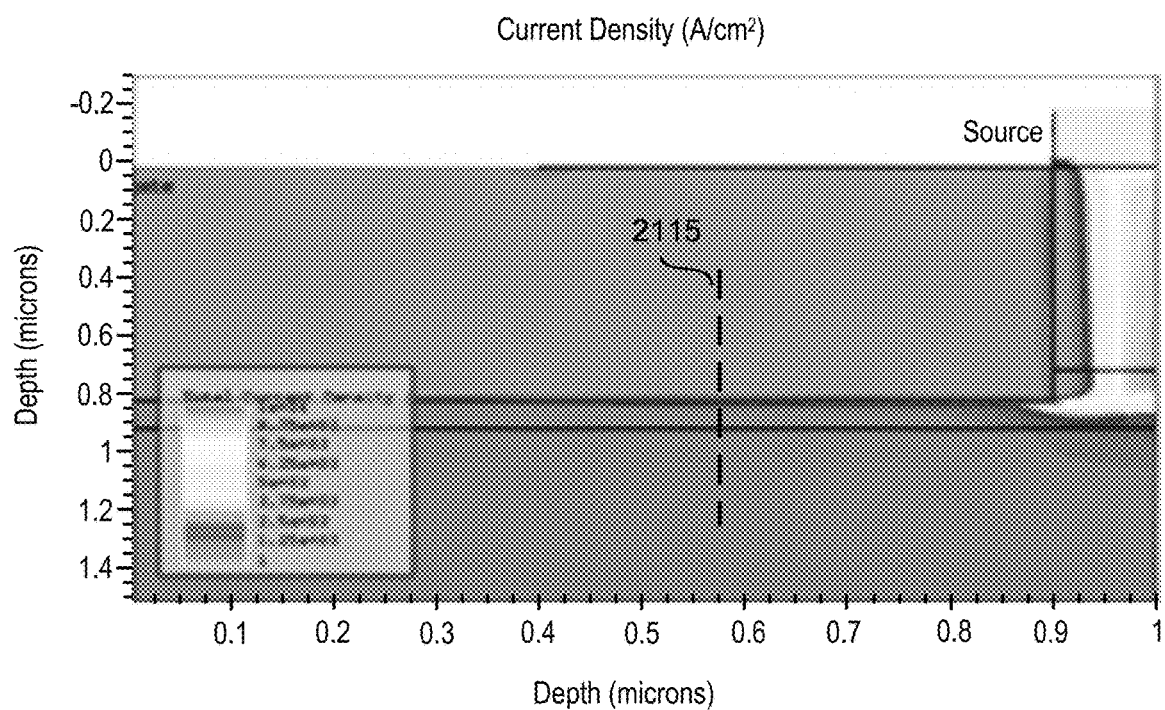
FIG. 21B is a graph illustrating current density through the channel of a non-polar FET.
Figure 21C:
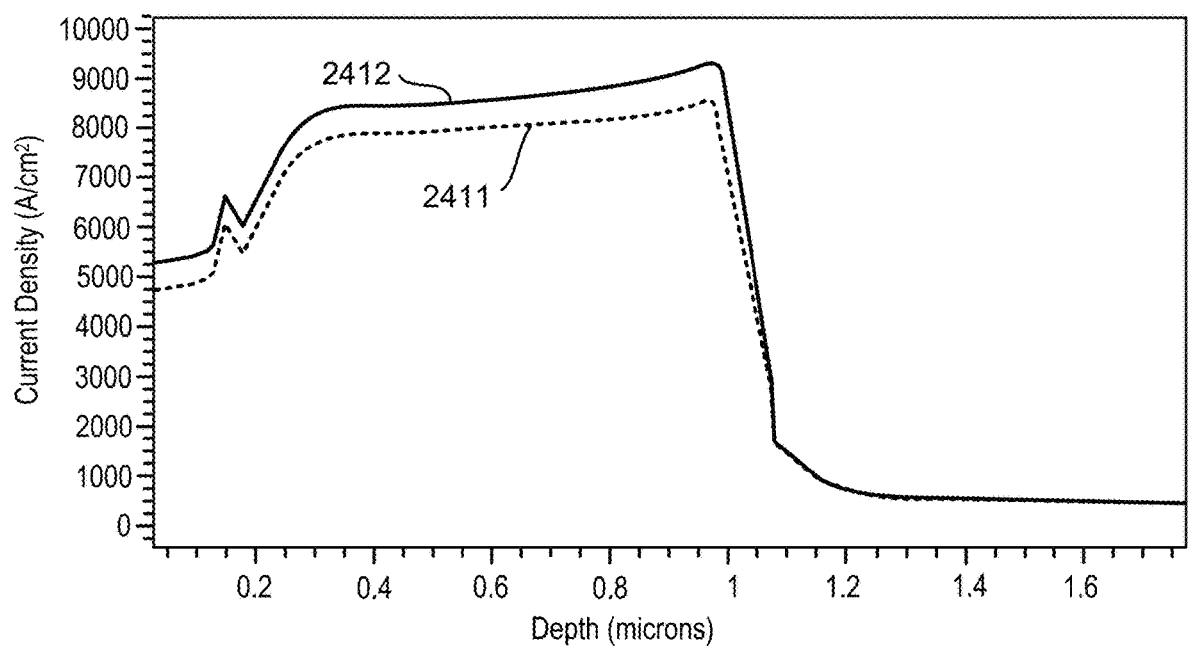
FIG. 21C is a graph of current density through the channel of the baseline FET compared with that of the non-polar FET.
Figure 21D:
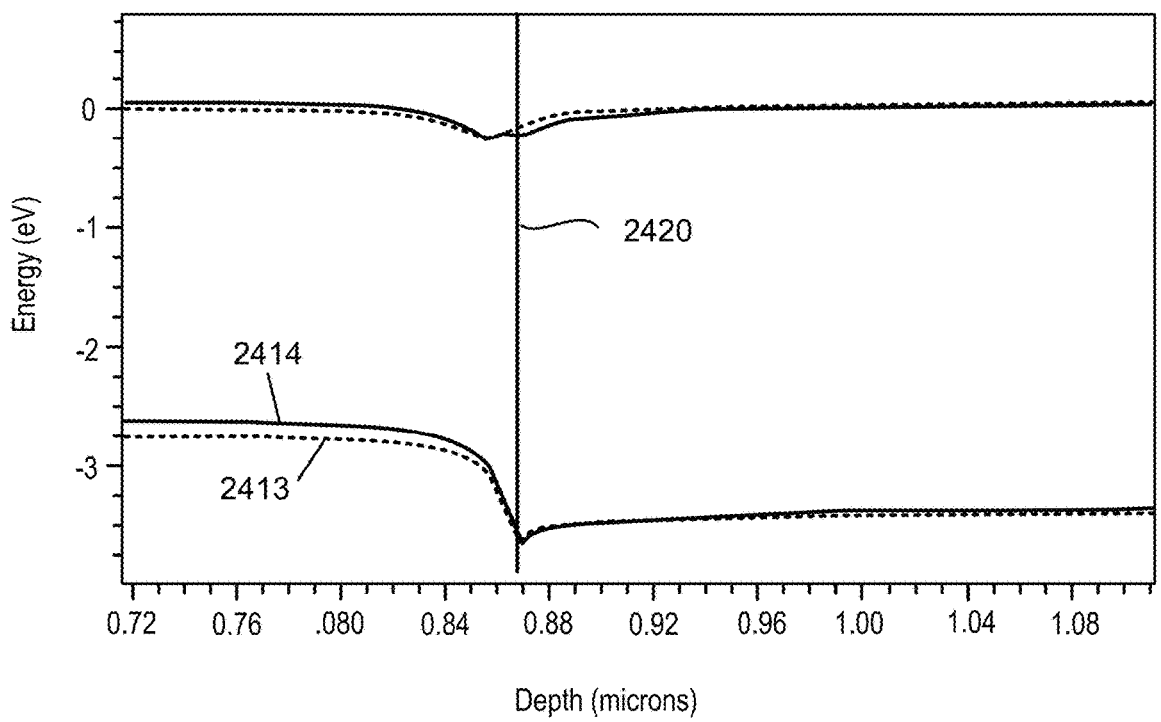
FIG. 21D is a graph of the band diagrams of the baseline FET compared with that of the non-polar FET.

FIG. 21A is a graph illustrating current density through the channel of a baseline FET. FIG. 21B is a graph illustrating current density through the channel of a non-polar FET with a p-type InGaN gate interfacing to an InGaN channel along a non-polar plane. FIG. 21C is a graph of current density through the channel of the baseline FET (curve 2411) compared with that of the non-polar FET (curve 2412) at 150 degrees C. In FIG. 21C, the current density corresponds to cutline 2110 (shown in FIG. 21A) positioned in the channel. FIG. 21D is a graph of the band diagrams of the baseline FET compared with that of the non-polar FET. In FIG. 21D, the band diagrams for the baseline FET (curve 2413) and the non-polar FET (curve 2414) are shown under the gate (non-channel region) corresponding to cutline 2115 (shown in FIG. 21B). The junction 2420 is also illustrated in FIG. 21D.

According to embodiments of the present invention, Fin-FETS with p-type gate regions utilizing InGaN (e.g., in place of GaN) are provided. The utilization of InGaN for the p-type gate material provides a number of benefits not available using conventional techniques. For example, some process flows described herein utilize the lower growth temperature of InGaN compared to GaN, which serves to protect the regrowth hardmask utilized during the regrowth process. Moreover, some embodiments utilize magnesium doping in which the Mg dopant is shallower in the InGaN layer, resulting in a higher ionization of the dopant at the same temperature. In addition, the lower bandgap of InGaN assists in the formation of ohmic contacts to the p-type region.

Embodiments of the present invention consider the effect of polarization to achieve a desired trade-off between current spreading and high electric field, which has been demonstrated.

Additional embodiments are provided below to further illustrate a method of fabricating vertical fin-based FET devices according to embodiments of the present invention. Some of the below embodiments focus on fabricating a self-aligned source contact for the vertical fin-based FET devices.

Figure 22A:
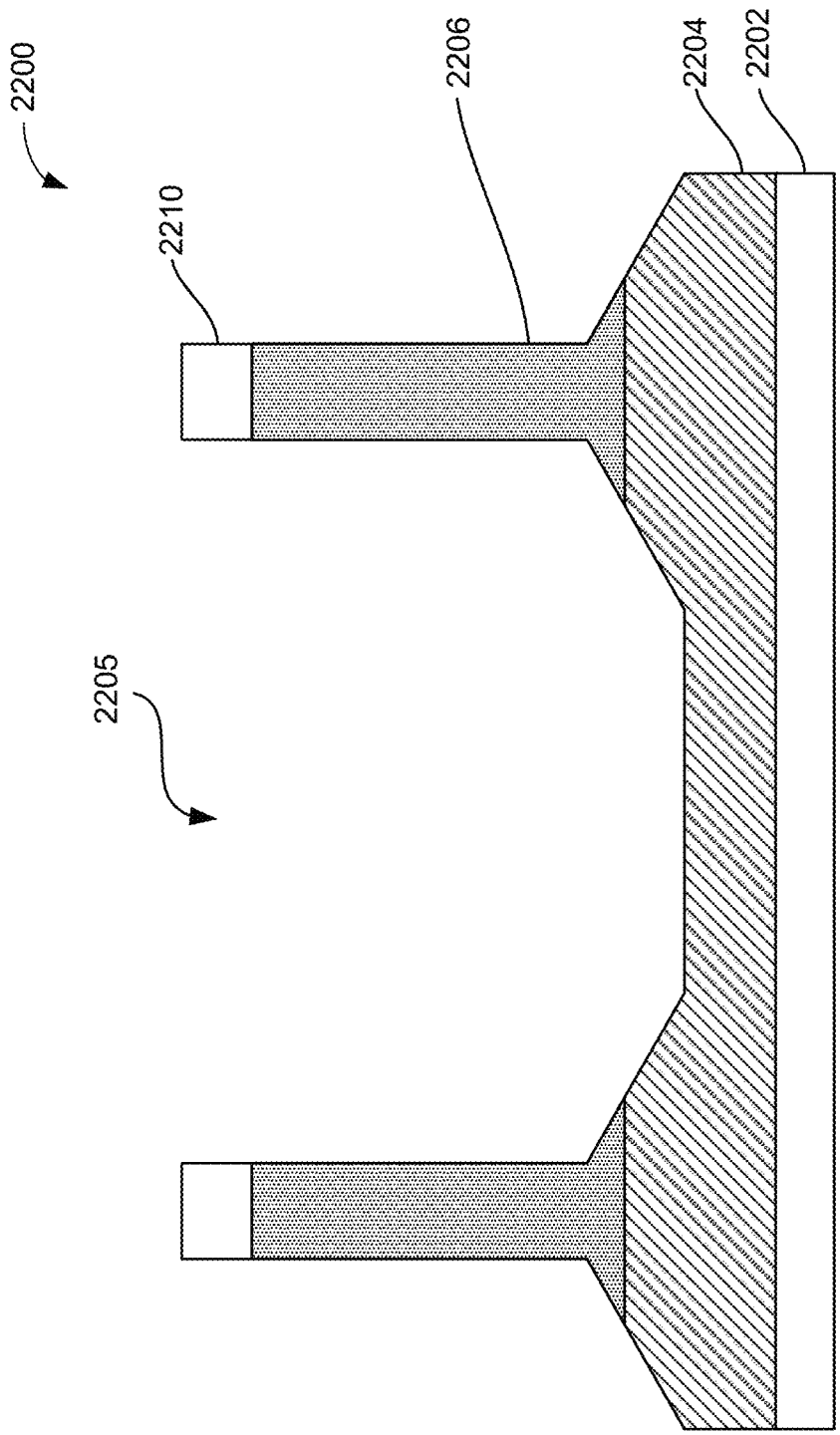
FIG. 22A through FIG. 22J are cross-sectional views showing intermediate stages of a method of fabricating a vertical-fin-based FET device according to an embodiment of the present disclosure.

Additional embodiments of the present invention may provide intermediate steps following the step 320 of the method 300 illustrated with reference to FIG. 4C. For sake of clarity, the intermediate stage shown in FIG. 4C is generally reproduced in FIG. 22A. Referring to FIG. 22A, a vertical fin-based FET device 2200 includes a semiconductor substrate 2202, for example, a n+ doped semiconductor substrate. In an embodiment, semiconductor substrate 2202 may include a III-nitride compound, such as n-type GaN. A first semiconductor layer 2204 is epitaxially grown on semiconductor substrate 2202 at a temperature between 950° C. and 1200° C., preferably between 1000° C. and 1150° C., and more preferably about 1100° C. In an embodiment, first semiconductor layer 2204 may include a III-nitride material, such as n-type GaN. Like the embodiment illustrated with reference to FIGS. 4A-4C, an etch process is performed using patterned hardmask layer 2210 as a mask to form a plurality of semiconductor fins 2206 on first semiconductor layer 2204. Each of the plurality of semiconductor fins 2206 is separated by one of a plurality of recess regions 2205. In an embodiment, the plurality of semiconductors fins 2206 may include III-nitride compound, such as n-type GaN.

In some embodiments, semiconductor substrate 2202 may be heavily doped with n-type dopants in a dopant concentration in a range of about $5 \times 10^{17}$ atoms/cm$^3$ to about $1 \times 10^{19}$ atoms/cm$^3$ and a resistivity of less than 0.020 ohm-cm. In some embodiments, the resistivity of the semiconductor substrate 2202, which may be implemented as an n+ doped semiconductor substrate, may be from about 0.001 ohm-cm to 0.018 ohm-cm, preferably less than 0.016 ohm-cm, and more preferably, less than 0.012 ohm-cm. In some embodiments, first semiconductor layer 2204 is a drift layer having a thickness of about 12 μm and a dopant concentration in a range of about $1 \times 10^{16}$ atoms/cm$^3$. The plurality of semiconductor fins 2206 can be characterized by uniform doping with n-type dopants of about $1.3 \times 10^{17}$ atoms/cm$^3$ and a thickness of about 12 μm. In some embodiments, a graded doping layer (not shown in FIG. 22A), such as the graded doping region 460 shown in FIG. 4C is disposed between first semiconductor layer 2204 and the plurality of semiconductor fins 2206. In some embodiments, each of the plurality of semiconductor fins 2206 has a width of about 0.2 µm, a height in a range between about 0.7 µm and 0.8 µm, and are spaced apart from each other by a recess region 2205 of about 2.0 µm, i.e., the fin pitch is about 2.0 µm. To provide fins characterized by uniform height, embodiments of the present invention utilize etch processes that are characterized by good depth controllability. In some embodiments, each of the plurality of semiconductor fins 2206 may include a metal, such as metal layer 405 shown in FIG. 4C. The metal layer is disposed between hardmask layer 2210 and the top of each of the plurality of semiconductor fins 2206. For sake of clarity, the metal layer is not shown in FIG. 22A.

In some embodiments, after forming the plurality of recess regions 2205, a cleaning process is carried using a TMAH solution of about 25% by weight, at a temperature of about 85° C., and for a duration of about 5 minutes. Thereafter, in an embodiment, a polish etch process is performed. The polish etch process may include low power Cl-based chemistry using ME. In another embodiment, prior to performing a cleaning using the TMAH solution, a pre-cleaning such as Piranha cleaning using a $H_2SO_4:H_2O$ in a volume ratio 2:1 for 2 minutes may also be performed.

Figure 22B:
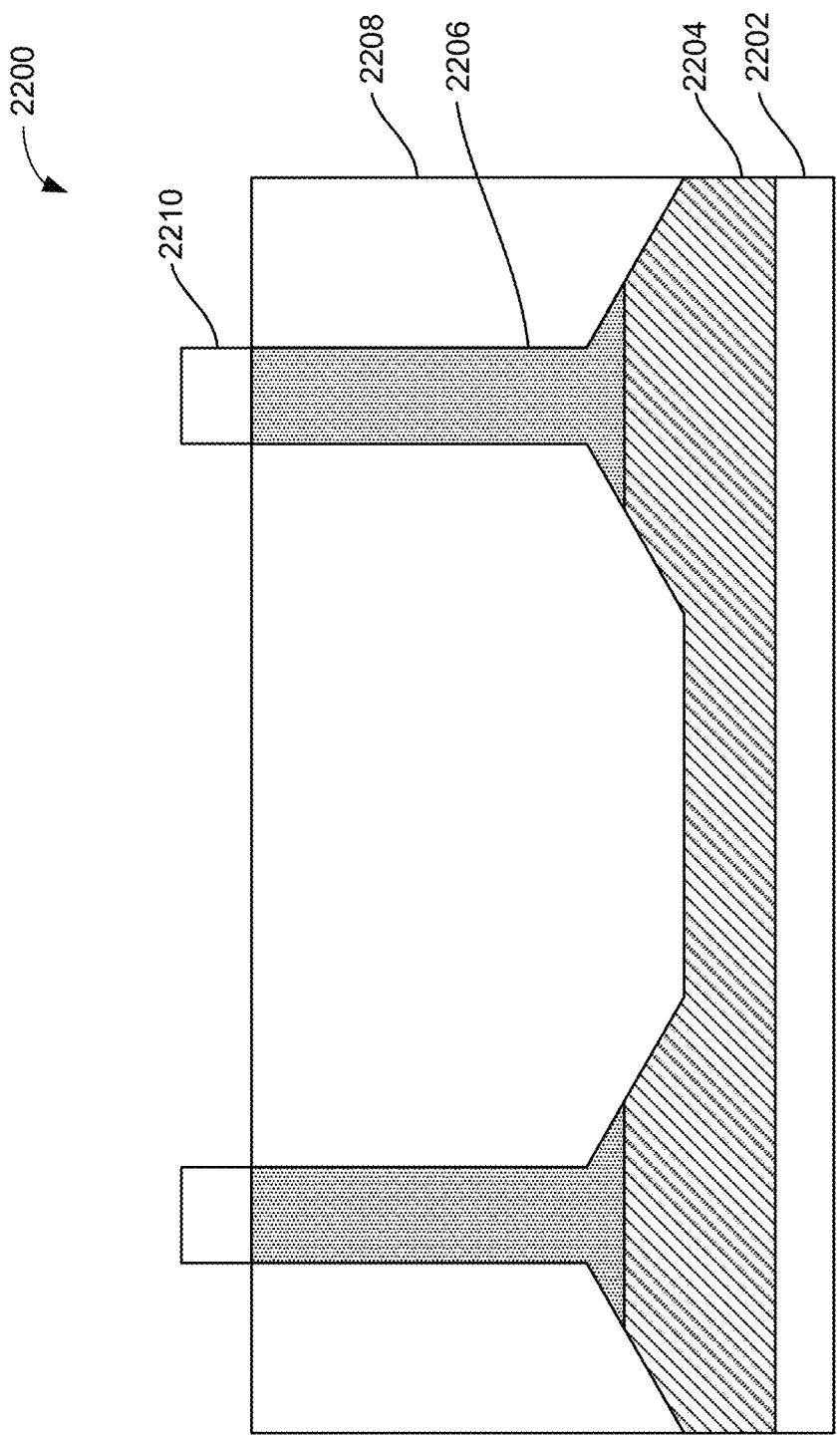

Referring to FIG. 22B, after cleaning is completed, semiconductor gate layer 2208 is epitaxially regrown in each of the plurality of recess regions 2205 (shown in FIG. 22A). In some embodiments, semiconductor gate layer 2208 may include a p-type GaN material that is grown non-conformally in the recess regions 2205 at a temperature of about 950° C. up to a thickness that is substantially planar to the bottom of hardmask layer 2210. In some embodiments, the thickness of semiconductor gate layer 2208 is about 840 nm. The p-type GaN layer may be doped with Mg with a dopant concentration of about $1\times10^{19}$ atoms/cm$^3$. Thereafter, a thermal annealing (e.g., a rapid thermal annealing in $N_2$ at 850° C. for 5 minutes) is performed to activate the Mg dopant atoms. The Mg atoms are then activated in the p-type GaN layer in an amount of greater than 1% by weight. In some embodiments, a heavily n+ doped layer (not shown in FIG. 22B), such as layer 404 shown in FIG. 4B, may be present between the plurality of semiconductor fins 2206 and hardmask layer 2210.

In some embodiments, a planarization process may be performed on semiconductor gate layer 2208. In some embodiments, the planarization process includes removing an upper portion of semiconductor gate layer 2208 by etching, for example, removing 0.2 µm of the upper portion of semiconductor gate layer 2208.

Figure 22C:
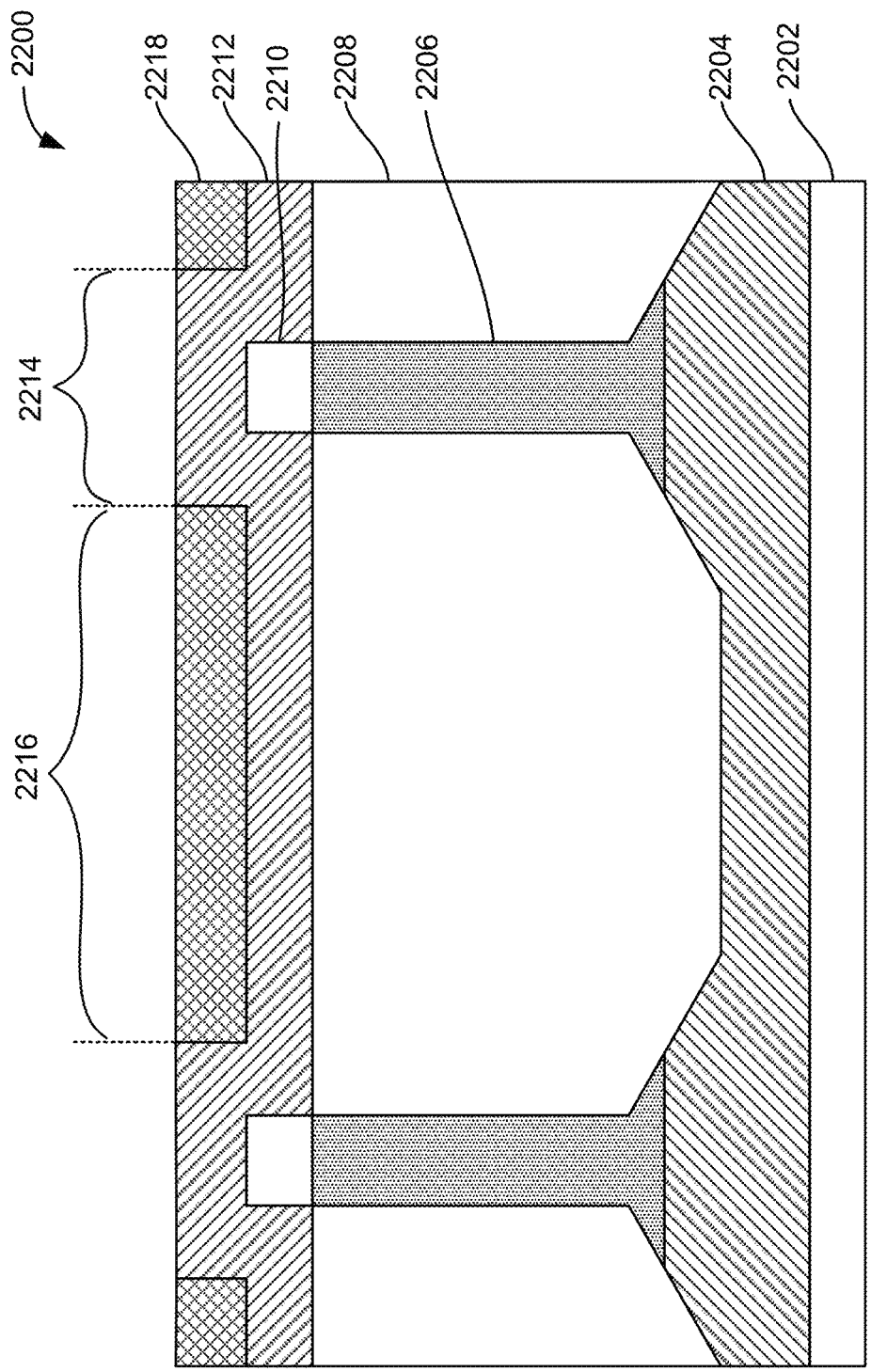

Referring to FIG. 22C, a first dielectric layer 2212 is formed over semiconductor gate layer 2208 and hardmask layer 2210. In some embodiments, first dielectric layer 2212 is substantially conformal to the sidewall of the hardmask layer 2210. In an embodiment, first dielectric layer 2212 has a thickness of approximately 200 nm and may include $SiO_2$ and be deposited by PECVD at about 300° C. A portion of first dielectric layer 2212 may be designated as a contact region 2214 substantially aligned with each of the plurality of semiconductor fins 2206 and a gate region 2216 substantially aligned with the semiconductor gate layer 2208 between fins.

Figure 22D:
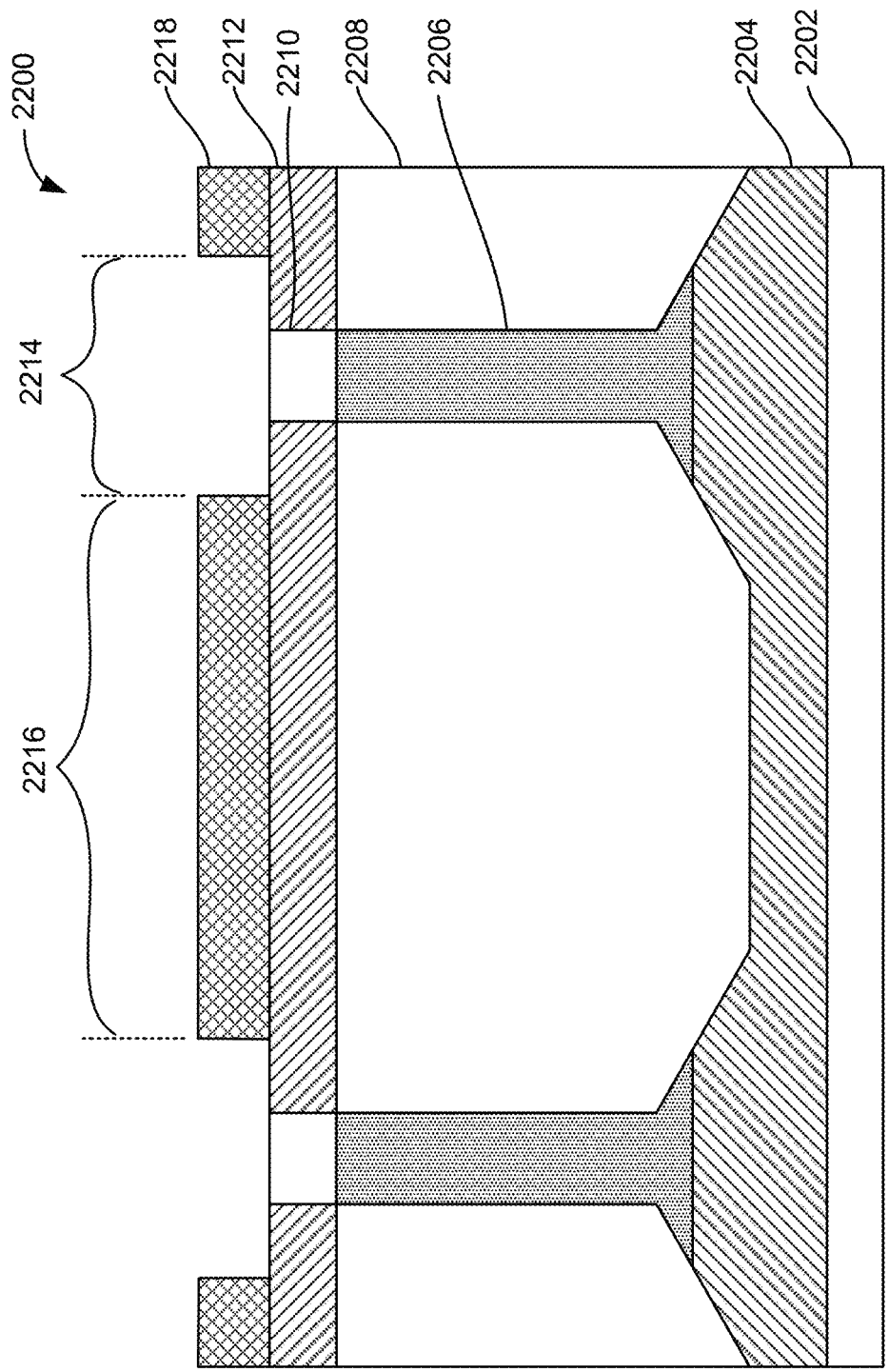

Thereafter, a photoresist layer 2218 that is patterned is formed on the gate region 2216 of first dielectric layer 2212. In some embodiments, the upper surface of photoresist layer 2218 is planar with the upper surface of contact region 2214 of first dielectric layer 2212. In some embodiments, patterned photoresist layer 2218 is formed and patterned with well-known photolithography processes to expose contact region 2214 of hardmask layer 2210. Next, referring to FIG. 22D, contact region 2214 of first dielectric layer 2212 is etched using photoresist layer 2218 as a mask to expose the upper surface of hardmask layer 2210. In some embodiments, contact region 2214 is over etched to extend to a predetermined depth into first dielectric layer 2212 such that the upper surface of contact region 2214 of first dielectric layer 2212 is disposed within the thickness of hardmask layer 2210. In an embodiment, the predetermined depth is about 0.25 µm. Thereafter, as shown in FIG. 22E, hardmask layer 2210 is etched to expose the upper surface 2220 of each of the plurality of semiconductor fins 2206.

Figure 22E:
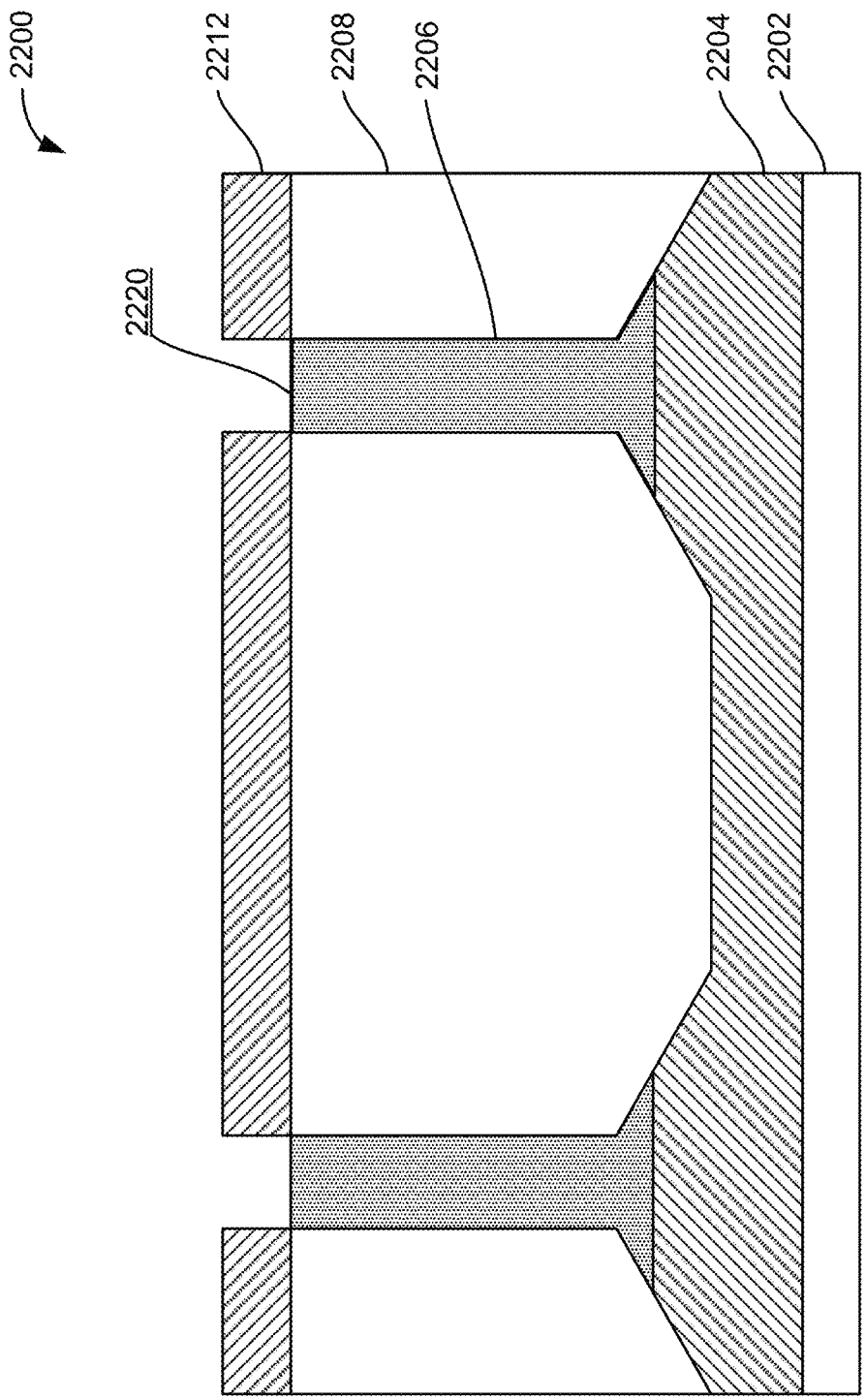
Figure 22F:
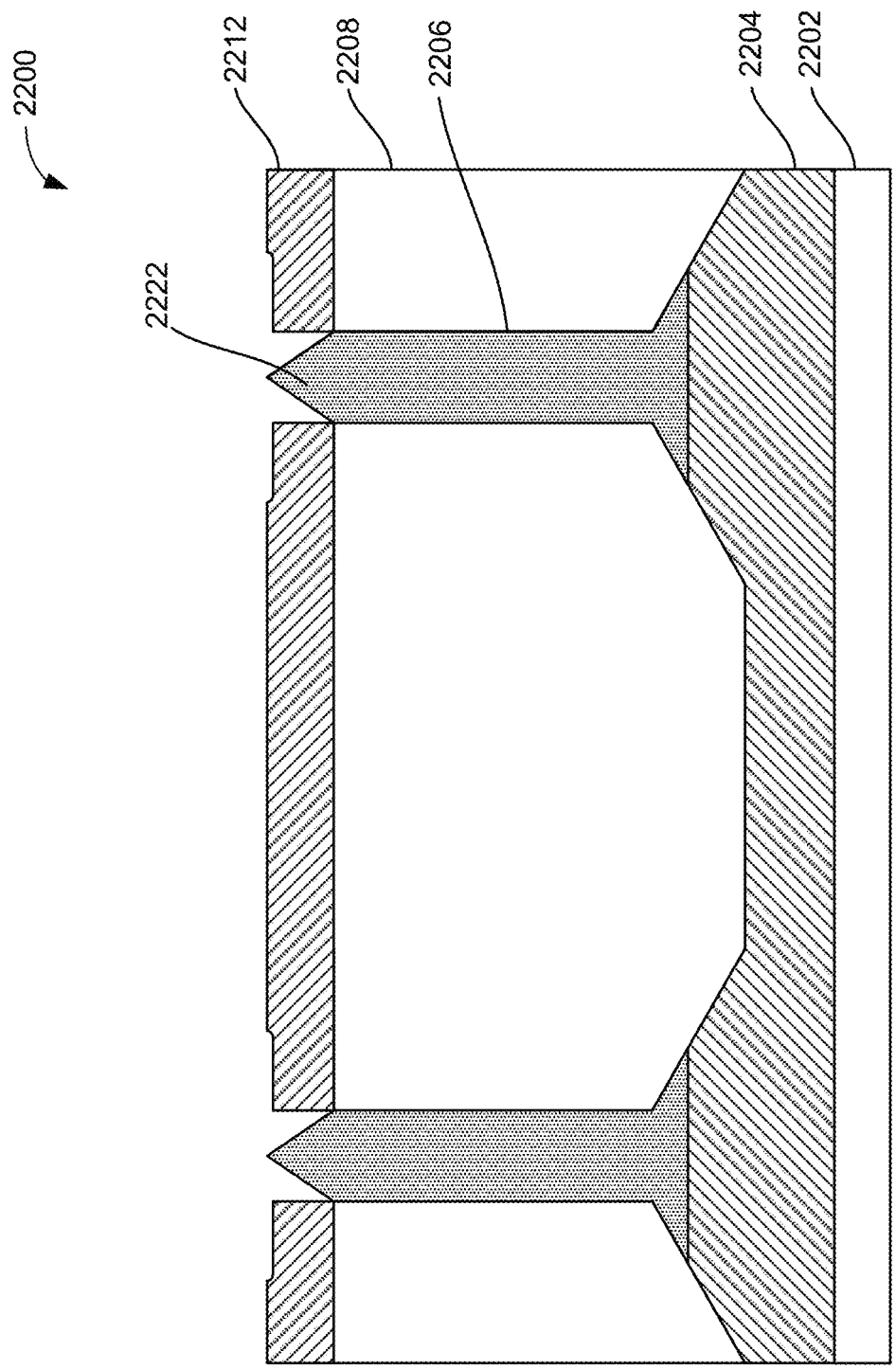

Referring to FIG. 22E, photoresist layer 2218 (shown in FIG. 22D) is removed to expose the upper surface of first dielectric layer 2212 and the upper surface 2220 of the semiconductor fins 2206. Referring to FIG. 22F, a semiconductor source contact portion 2222 is regrown on upper surface 2220 of each of the plurality of semiconductor fins 2206 and coupled to each of the plurality of semiconductor fins 2206. In some embodiments, the semiconductor source contact portion 2222 includes n-type GaN with a dopant concentration of about $2\times10^{17}$ to $5\times10^{17}$ atoms/cm$^3$. The regrowth of semiconductor source contact portion 2222 is self-limiting when the semiconductor source contact portion 2222 is characterized by a triangular shape. As an example, in a self-limiting growth process, the semiconductor source contact portion 2222 can be characterized by an isosceles triangle shape having a base angle in a range between 58 degrees and 65 degrees in a cross-section view as illustrated in FIG. 22F.

In an embodiment, the semiconductor source contact portion 2222 has a height of about 0.1 µm-0.2 µm. In an embodiment, a smooth surface for the regrowth facets can be obtained at a growth temperature in a range between 800° C. and 1150° C. and under a pressure of about 600 mbar with $H_2$ carrier gas. In an embodiment, the regrowth temperature is in a range between 850° C. and 1100° C., preferably between 900° C. and 1050° C., and more preferably between about 930° C. and 970° C., e.g., 950° C. in an embodiment.

Figure 22G:
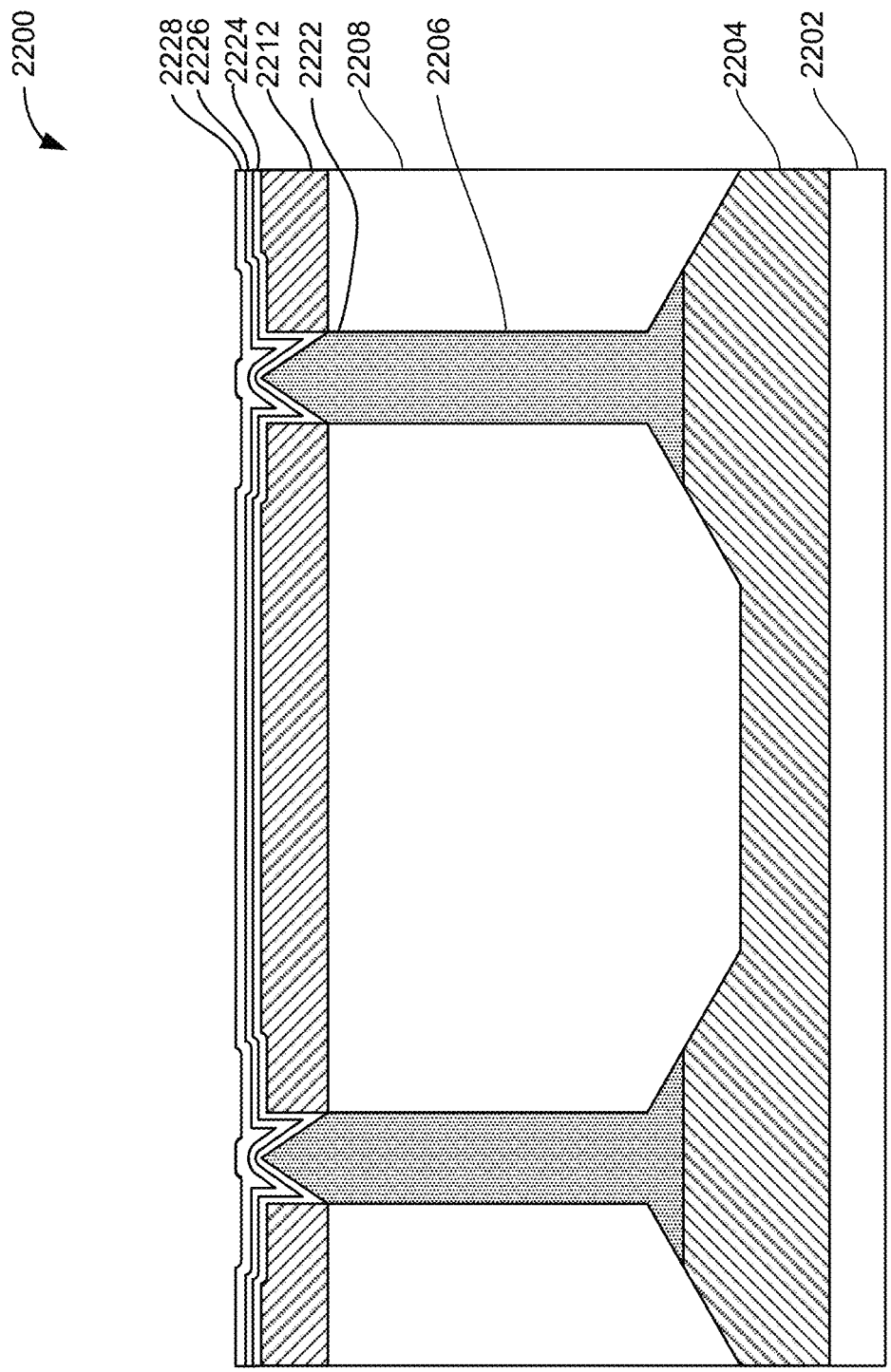

Thereafter, a source contact structure is formed on first dielectric layer 2212 and semiconductor source contact portion 2222. In some embodiments, the source contact structure contains multiple (two to four) metal or metal alloy layers. In an embodiment, the source contact structure may include a first source metal layer, a second source metal layer, and a third source metal layer. Referring to FIG. 22G, first source metal layer 2224 is formed overlying semiconductor source contact portion 2222 and first dielectric layer 2212. In an embodiment, first source metal layer 2224 may include titanium having a thickness of about 25 nm. Next, second source metal layer 2226 is formed on first source metal layer 2224 and coupled to first source metal layer 2224. In an embodiment, second source metal layer 2226 may include aluminum having a thickness of 100 nm. Thereafter, third source metal layer 2228 is formed on second source metal layer 2226 and coupled to second source metal layer 2226. In an embodiment, third source metal layer 2228 may include molybdenum having a thickness of about 40 nm. In another embodiment, second source metal layer 2226 may include titanium nitride and third source metal layer 2228 may include aluminum. In some embodiments, third source metal layer 2228 is omitted.

Figure 22H:
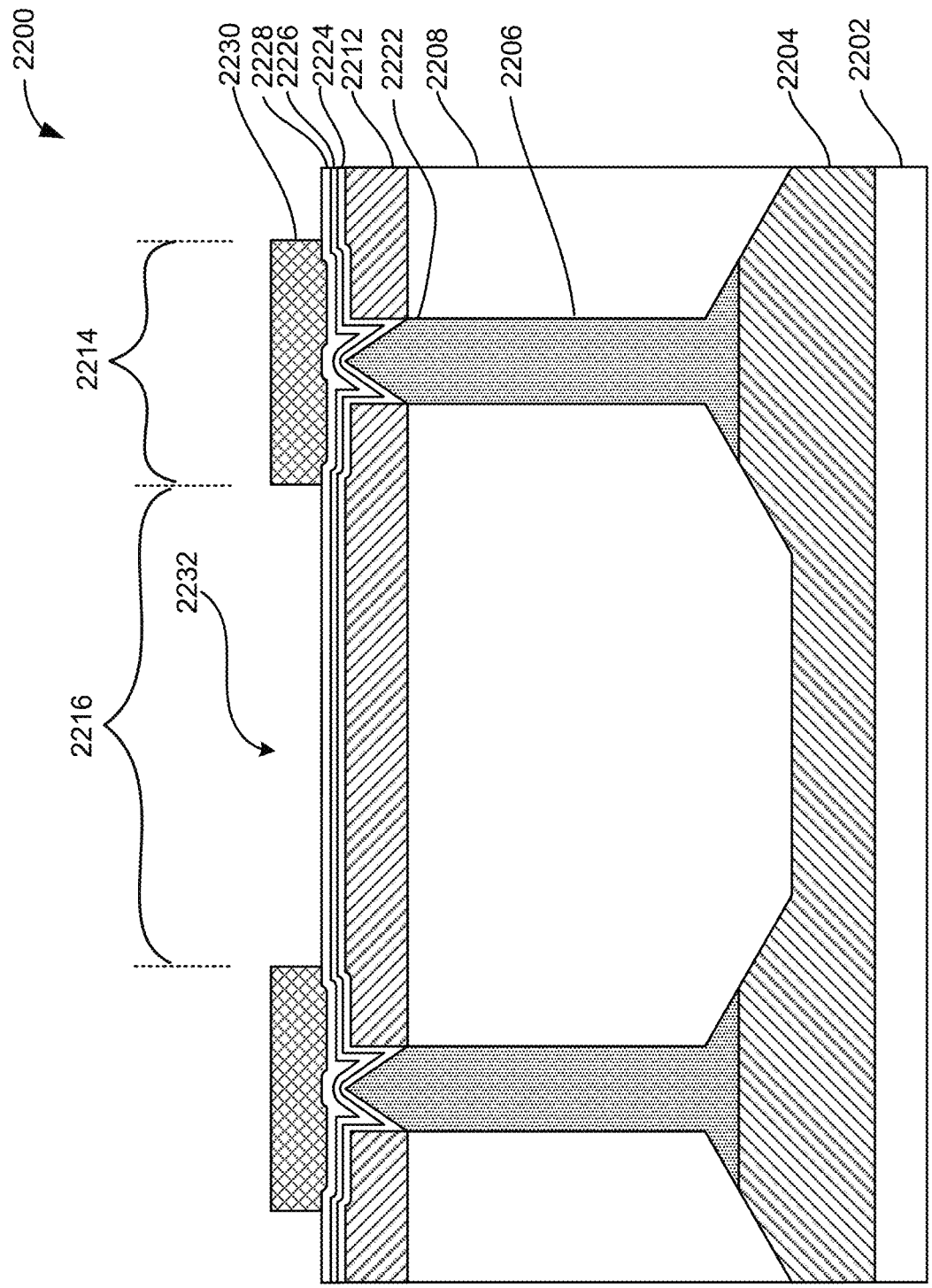
Figure 22I:
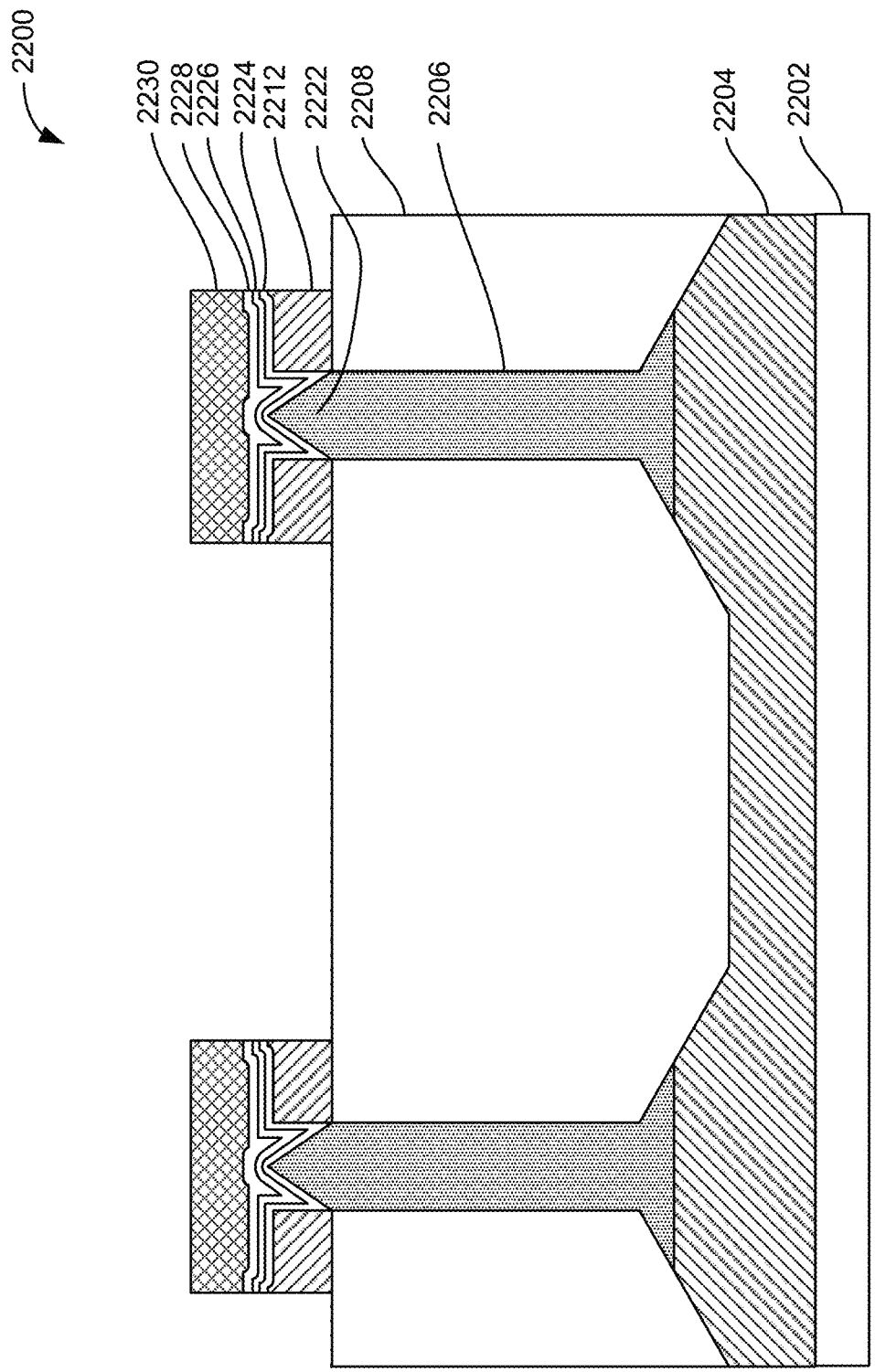

Referring to FIG. 22H, a source metal mask layer 2230 is formed on third source metal layer 2228. Source metal mask layer 2230 has opening 2232 aligned with gate region 2216. In an embodiment, source metal mask layer 2230 is lift-off capable and has a bottom CD of about 0.6 μm. Thereafter, referring to FIG. 22I, third source metal layer 2228, second source metal layer 2226 and first source metal layer 2224 are etched using source metal mask layer 2230 as a mask to expose the upper surface of first dielectric layer 2212. In an embodiment, the etching process may include Cl-based chemistry using RIE. Then, first dielectric layer 2212 is etched away using the source metal mask layer 2230 as a mask to expose the upper surface of semiconductor gate layer 2208. In an embodiment, etching first dielectric layer 2212 may include F-based chemistry using RIE.

Figure 22J:
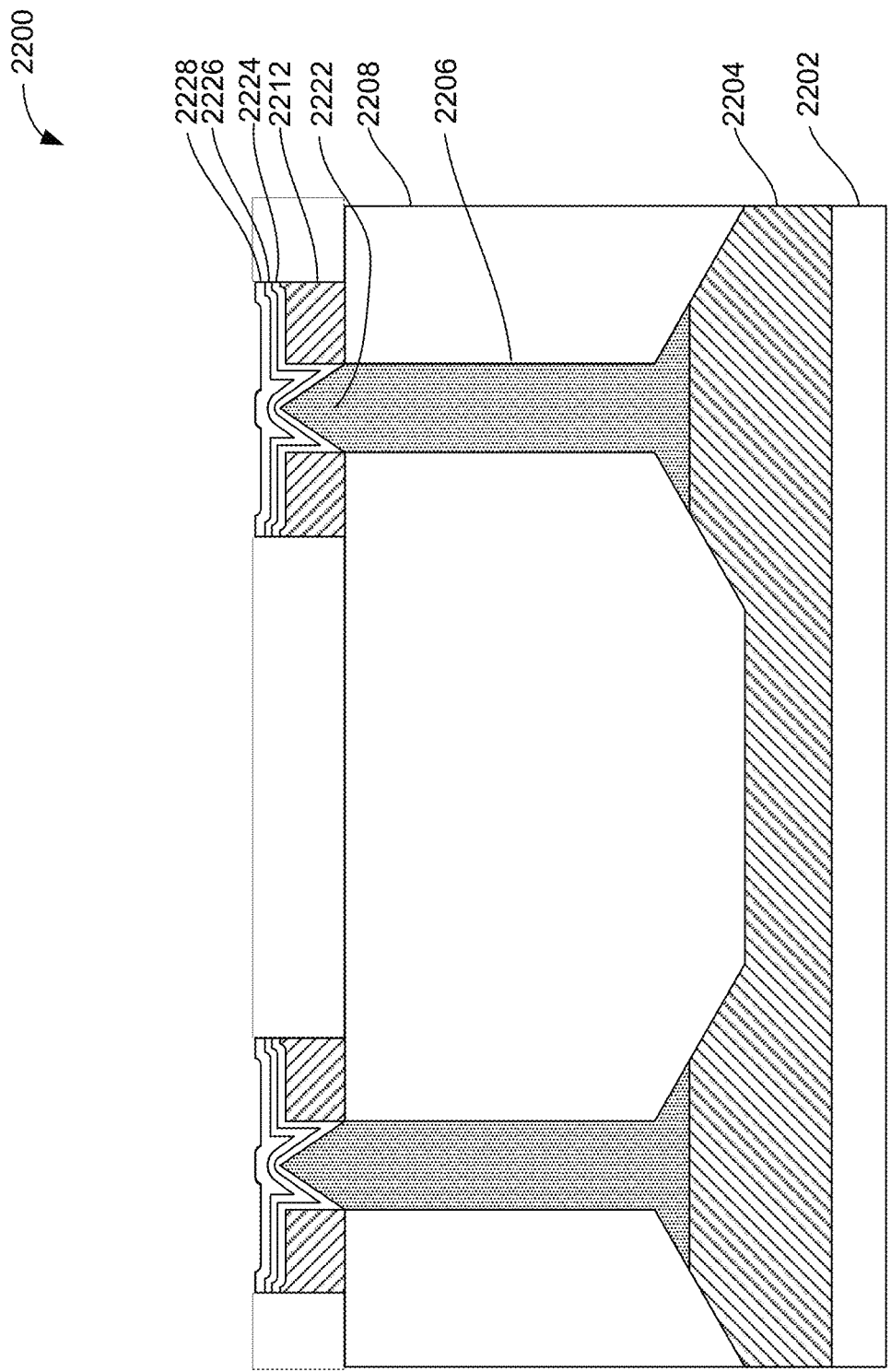

Referring to FIG. 22J, source metal mask layer 2230 (shown in FIG. 22H) is removed. In an embodiment, a thermal annealing process is performed to provide a stable, low contact resistance contact after removal of source metal mask layer 2230. In an embodiment, a rapid thermal annealing (RTA) treatment may be performed in $N_2$ at 825° C. for 90 seconds. After the RTA treatment, the source metal structure will preferably have a specific resistance of less than about $10^{-5}$ ohm-cm.

Figure 23A:
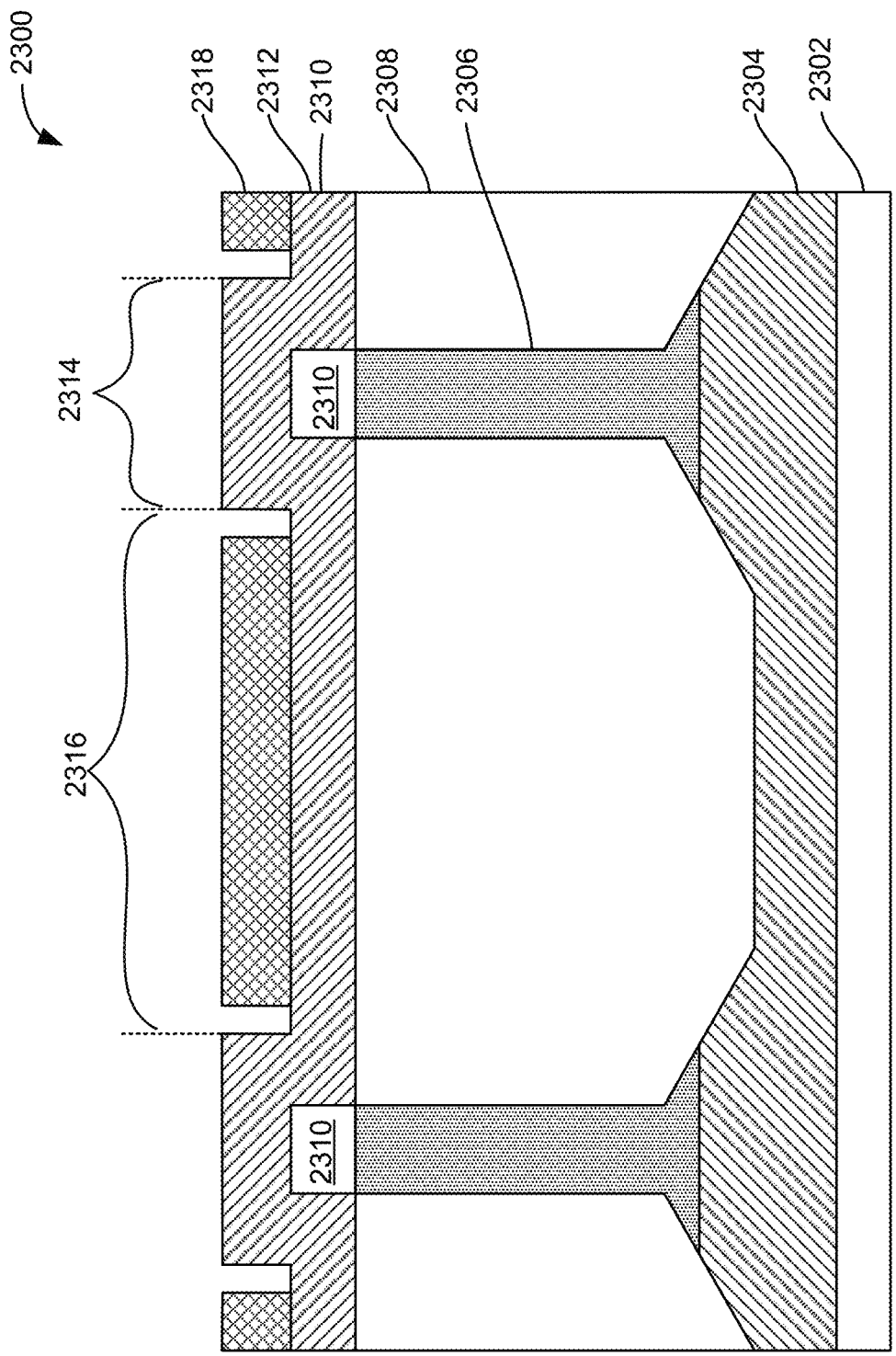
FIG. 23A through FIG. 23G are cross-sectional views showing intermediate stages of a method of fabricating a vertical-fin-based FET device according to an embodiment of the present disclosure.

Referring to FIGS. 23A-23G, another embodiment of fabricating a self-aligned source contact for the vertical fin-based FET device according to the present invention is illustrated. As described more fully below, similar processes to those illustrated with reference to FIGS. 22A-22C can be performed to achieve the process stage as shown in FIG. 23A. Specifically, vertical fin-based FET device 2300 includes a semiconductor substrate 2302, which may be an n+ doped semiconductor substrate, a first semiconductor layer 2304 epitaxially grown on semiconductor substrate 2302, and a plurality of semiconductor fins 2306 formed on first semiconductor layer 2304. Each of the plurality of semiconductor fins 2306 is separated by one of a plurality of recess regions. A semiconductor gate layer 2308 is epitaxially formed in the plurality of recess regions.

Like the embodiment shown in FIG. 22A, hardmask layer 2310 is present on top of each of the plurality of semiconductor fins 2306. A first dielectric layer 2312 is formed on semiconductor gate layer 2308 and hardmask layer 2310. In an embodiment, first dielectric layer 2312 is substantially conformal to the sidewall of the hardmask layer 2310. A portion of first dielectric layer 2312 may be designated as a contact region 2314 substantially aligned with each of the plurality of semiconductor fins 2306 and a gate region 2316 substantially aligned with the semiconductor gate layer 2308 between fins. Thereafter, a photoresist layer 2318 that is patterned is formed on gate region 2316 of first dielectric layer 2312. In an embodiment, photoresist layer 2318 formed on part of gate region 2316, leaving contact region 2314 to have a width at least three times of the width of each semiconductor fin 2306. For example, contact region 2314 having a width of 0.6 μm when the width of each of the plurality of semiconductor fins 2306 is 0.2 μm.

Figure 23B:
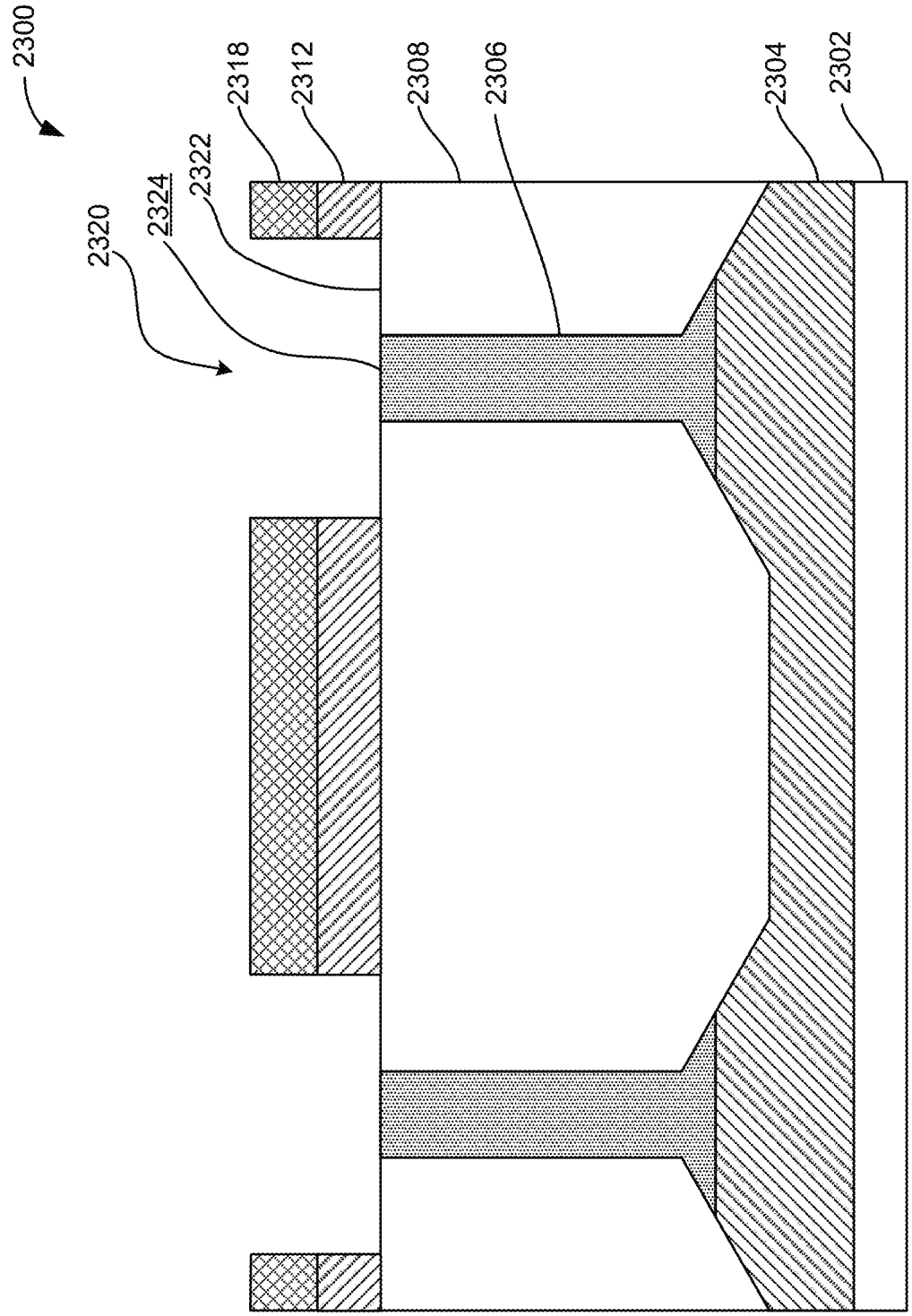

Referring to FIG. 23B, first dielectric layer 2312 is etched using photoresist layer 2318 as a mask to remove portions of first dielectric layer 2312 and hardmask layer 2310 and to form a plurality of recess regions 2320. The upper surface 2324 of each of the plurality of semiconductor fins 2306 and a portion 2322 of the upper surface of semiconductor gate layer 2308 surrounding each of the plurality of semiconductor fins 2306 are exposed at the bottom of each of the plurality of recess regions 2320.

Figure 23C:
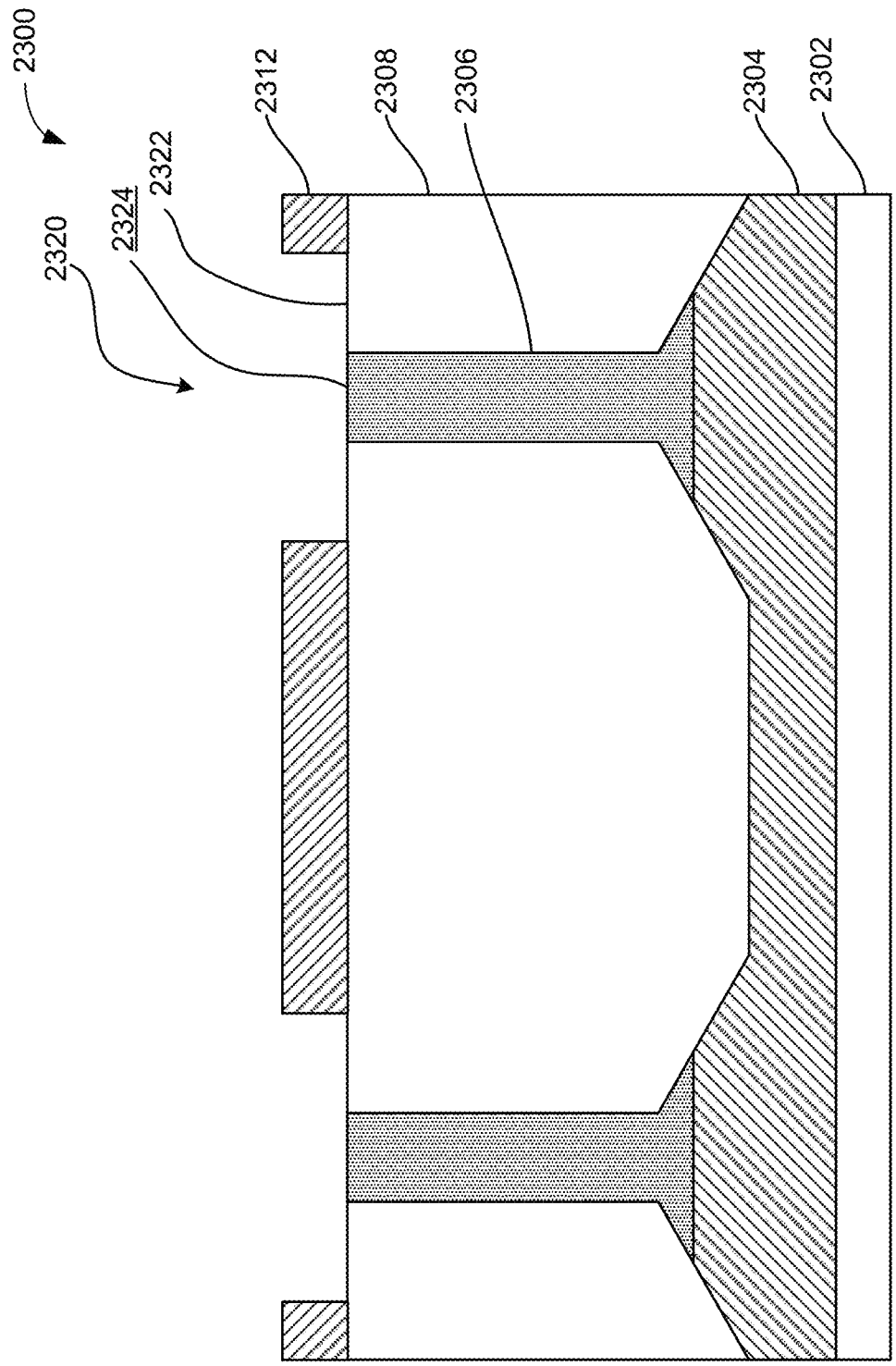
Figure 23D:
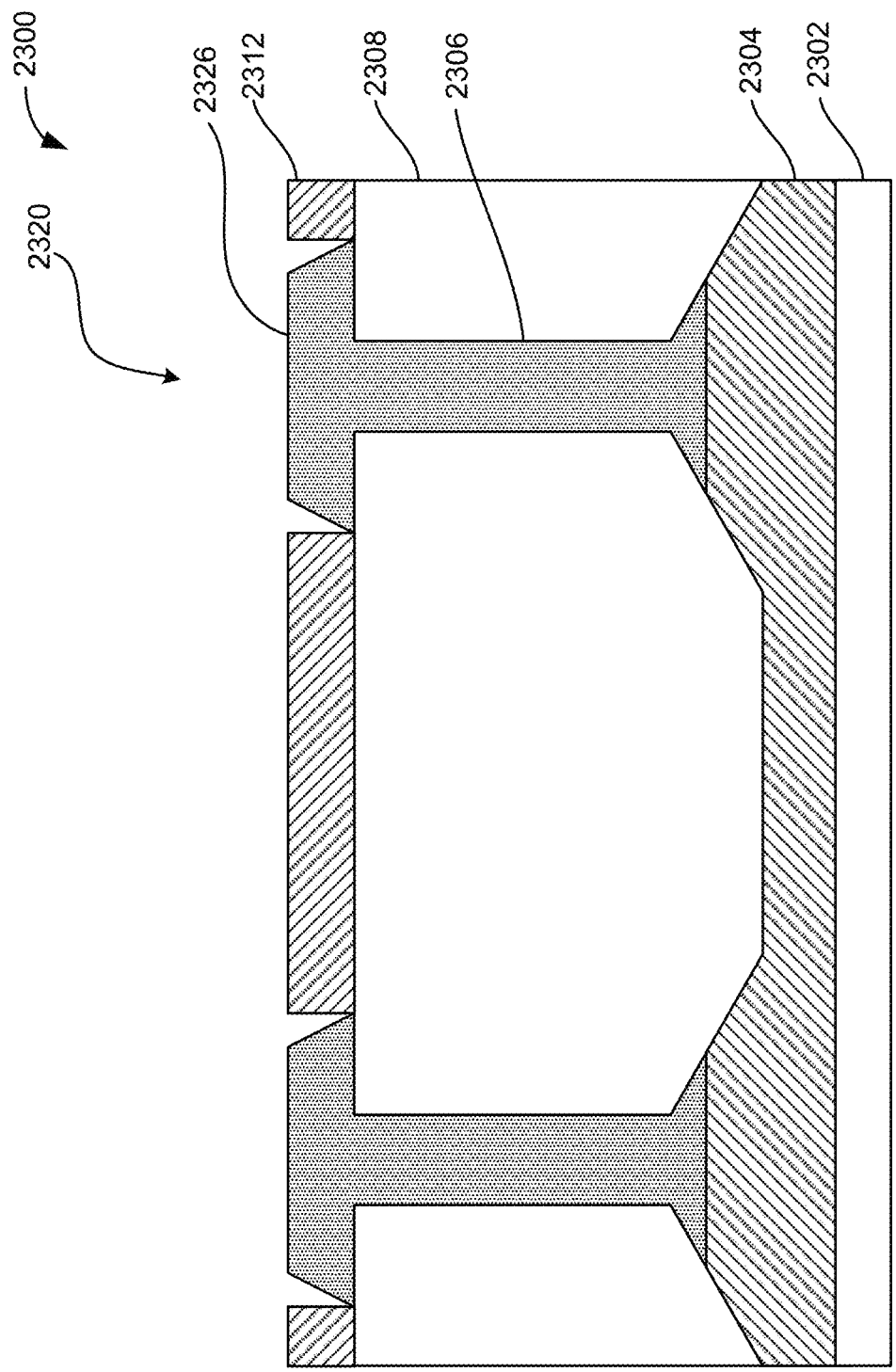

Referring to FIG. 23C, photoresist layer 2318 (shown in FIG. 23B) is removed. Referring to FIG. 23D, a semiconductor source contact portion 2326 is epitaxially regrown in each of the plurality of recess regions 2320 and coupled to each of the plurality of semiconductor fins 2306. In an embodiment, semiconductor source contact portion 2326 includes a III-nitride material, such as n-type GaN with a dopant concentration of about $2 \times 10^{17}$ to $5 \times 10^{17}$ atoms/cm$^3$. The regrowth of semiconductor source contact portion 2326 is self-limiting when the source contact portion 2326 is characterized by an isosceles trapezoid shape. In an embodiment, semiconductor source contact portion 2326 has a height of about 0.1 μm-0.2 μm. In an embodiment, a smooth surface for the regrowth facets can be obtained at a growth temperature in a range between 800° C. and 1150° C. and under a pressure of about 600 mbar with $H_2$ carrier gas. In an embodiment, the regrowth temperature is in a range between 850° C. and 1100° C., preferably between 900° C. and 1050° C., and more preferably between about 930° C. and 970° C., e.g., 950° C. in an embodiment.

Figure 23E:
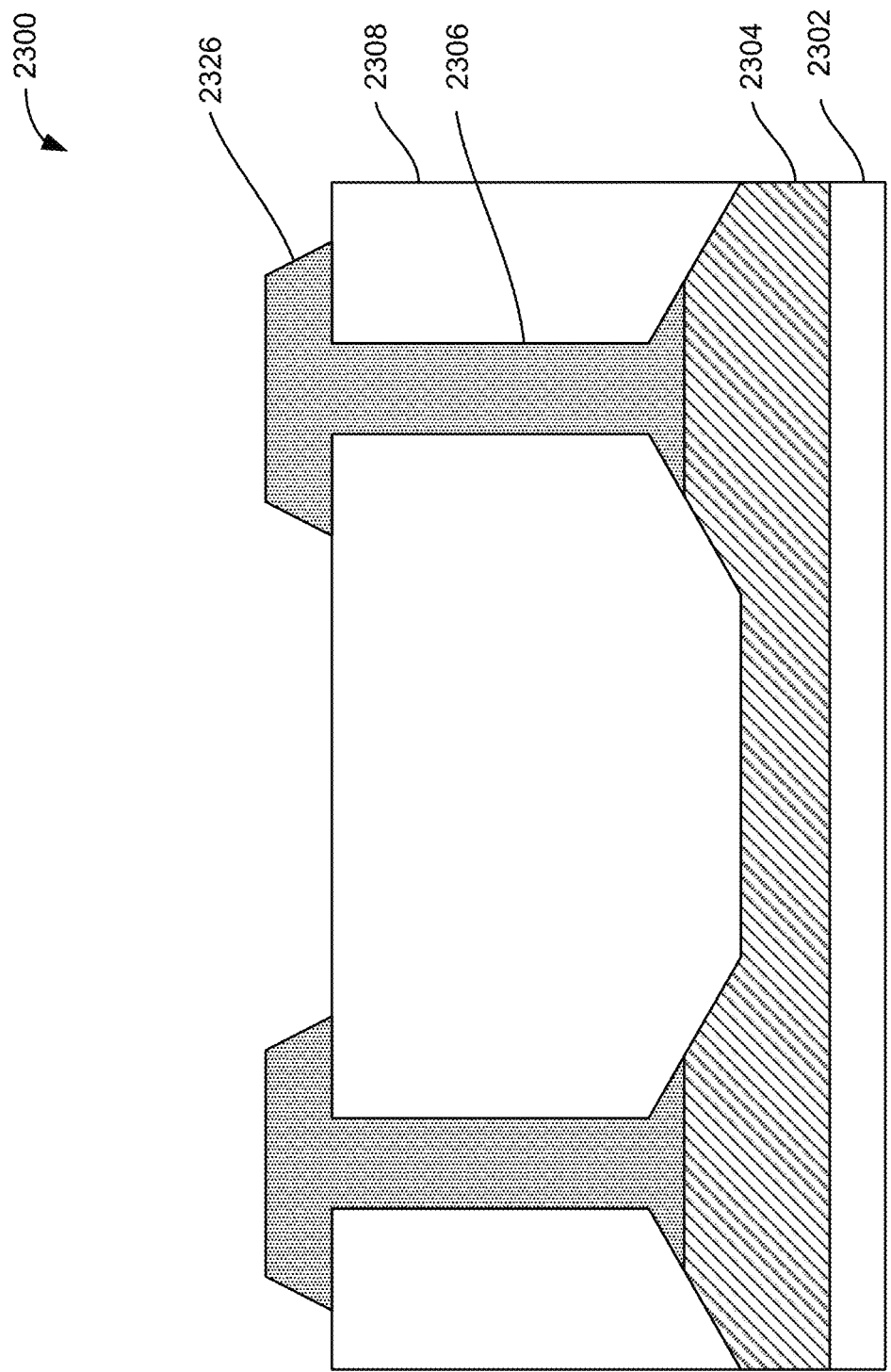
Figure 23F:
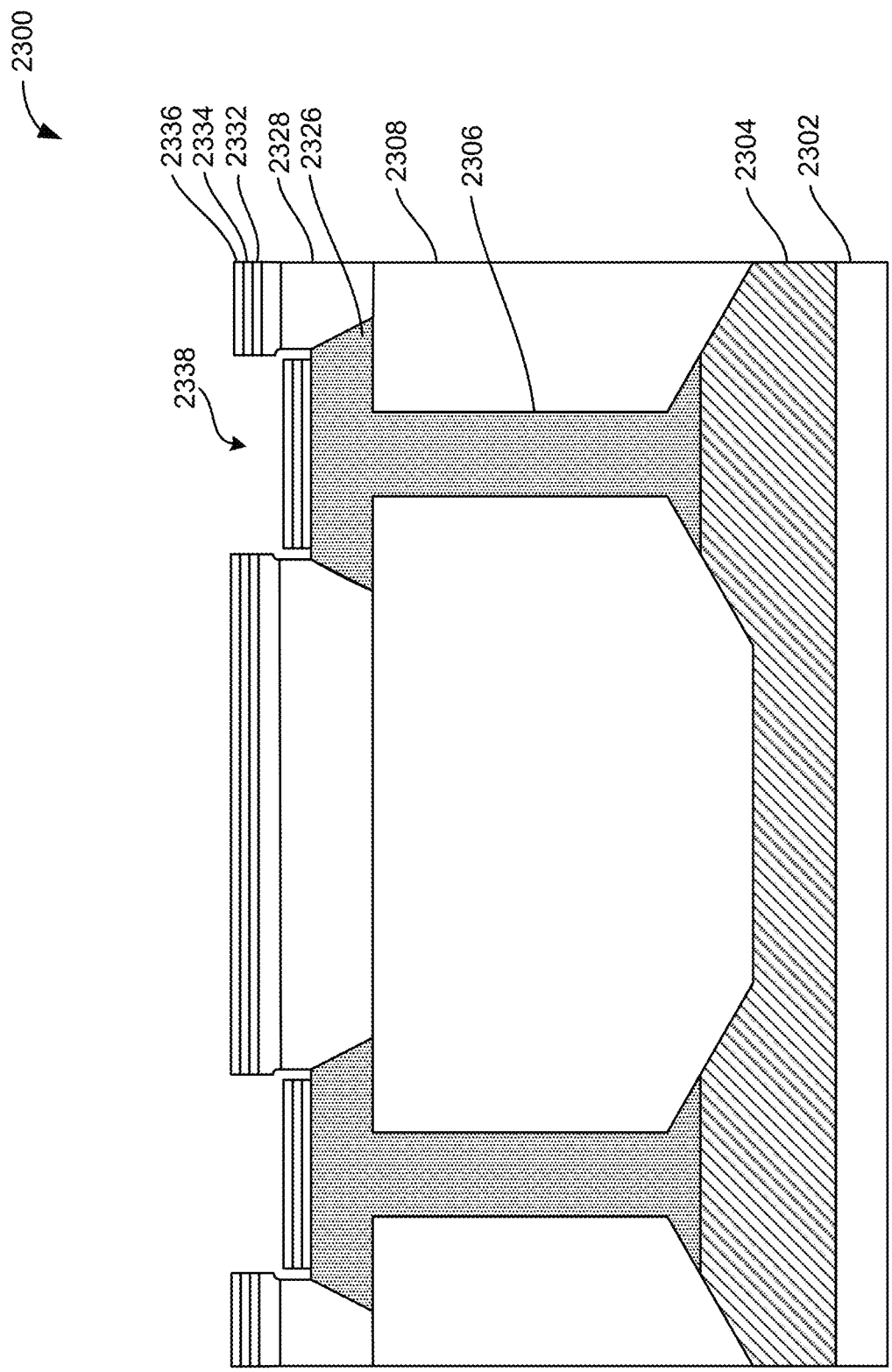

Referring to FIG. 23E, first dielectric layer 2312 (shown in FIG. 23D) is removed after regrowth of semiconductor source contact portion 2326 to expose the upper surface of semiconductor gate layer 2308. In an embodiment, a wet etch process is performed to remove first dielectric layer 2312. Referring to FIG. 23F, a source metal mask layer 2328 is formed overlying the exposed upper surface of semiconductor gate layer 2308, having an opening 2338 exposing the upper surface of semiconductor source contact portion 2326. In an embodiment, source metal mask layer 2328 is lift-off capable and has a bottom CD of 0.6 μm and a top CD of 0.5 μm.

Thereafter, a source contact structure is formed on the exposed upper surface of semiconductor source contact portion 2326 at a temperature of about 25° C.-150° C. In some embodiments, the source contact structure contains multiple (two to four) metal or metal alloy layers. In an embodiment, the source contact structure may include a first source metal layer 2332, a second source metal layer 2334, and a third source metal layer 2336. Specifically, first source metal layer 2332 is formed overlying semiconductor source contact portion 2326 and source metal mask layer 2328. In an embodiment, first source metal layer 2332 may include titanium having a thickness of about 25 nm. Next, second source metal layer 2334 is formed on first source metal layer 2332 and coupled to first source metal layer 2332. In an embodiment, second source metal layer 2334 may include aluminum having a thickness of 100 nm. Thereafter, third source metal layer 2336 is formed on second source metal layer 2334 and coupled to second source metal layer 2334. In an embodiment, third source metal layer 2336 may include molybdenum having a thickness of about 40 nm. In another embodiment, second source metal layer 2334 may include aluminum and third source metal layer 2336 may include titanium nitride. In some embodiments, third source metal layer 2336 is omitted.

Figure 23G:
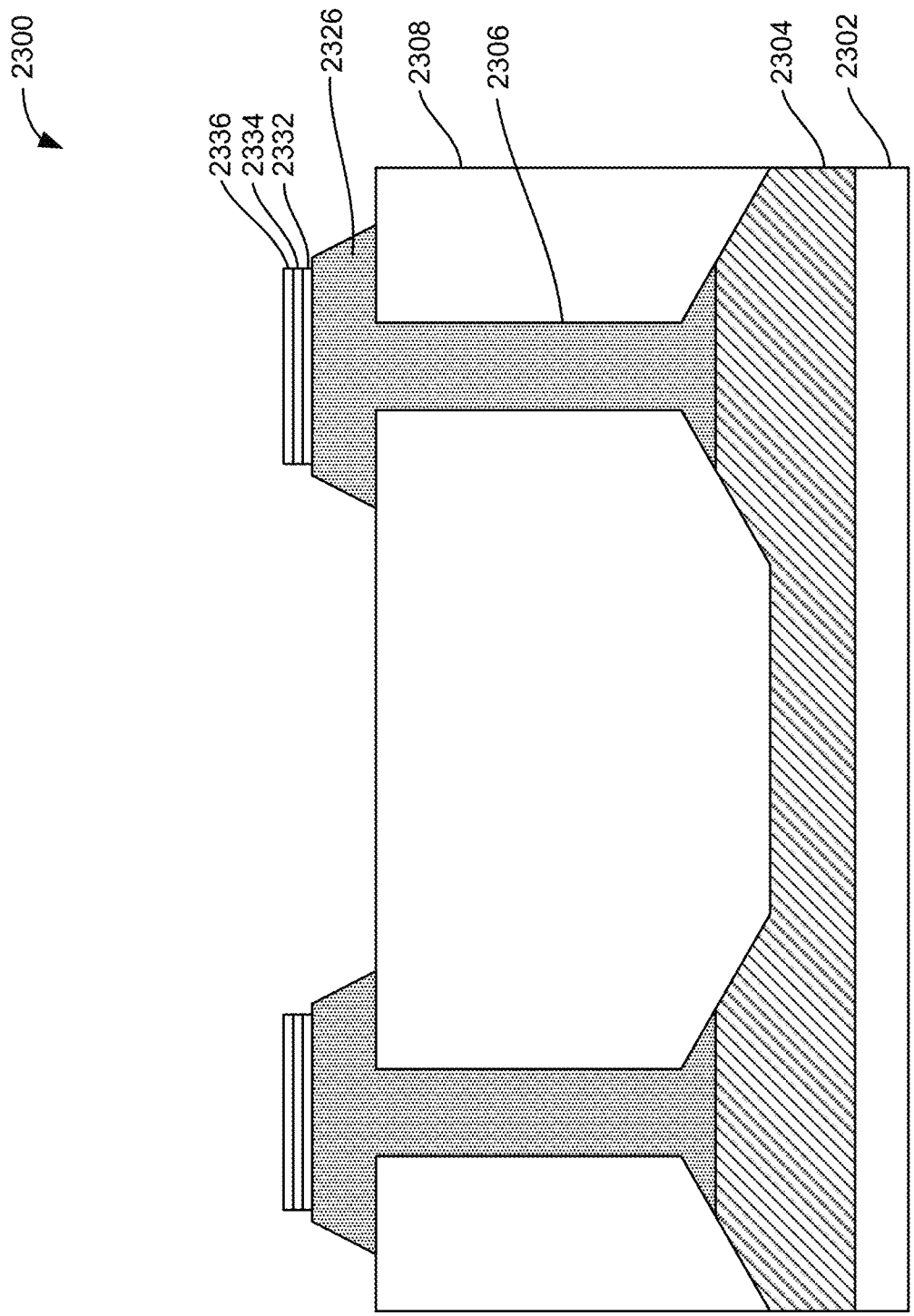

Referring to FIG. 23G, source metal mask layer 2328 (shown in FIG. 23F) is dissolved to lift off metal layers 2332, 2334 and 2336 deposited thereon, while metal layers 2332, 2334 and 2336 deposited on the upper surface of semiconductor source contact portion 2326 remain intact. In an embodiment, the source metal structure has a width of 0.6 μm. In an embodiment, a rapid temperature annealing (RTA) treatment may be performed in $N_2$ at 825° C. for 90 seconds. After the RTA treatment, the source metal structure will preferably have a specific resistance of less than about $10^{-5}$ ohm-cm.

Figure 24A:
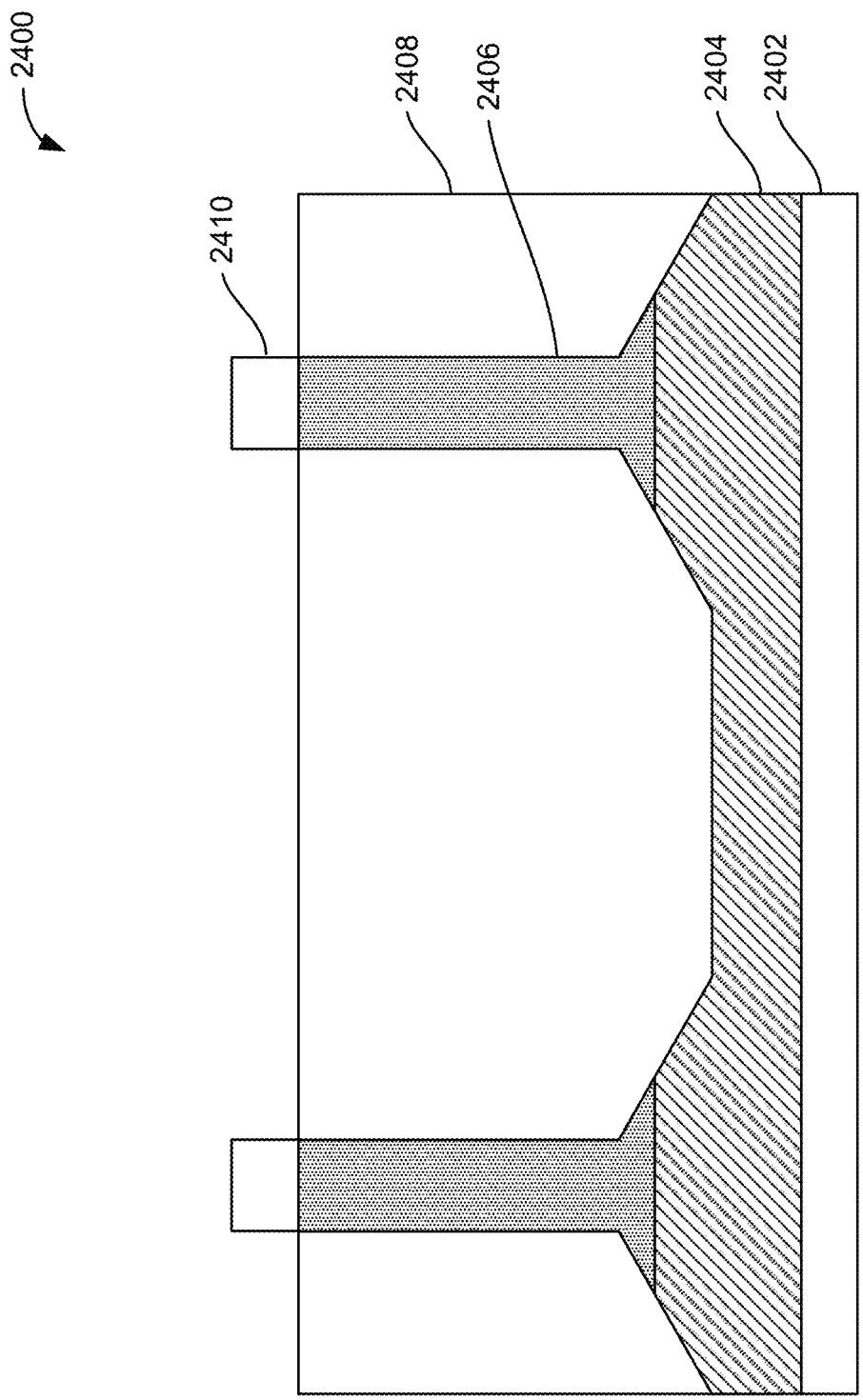
FIG. 24A through FIG. 24G are cross-sectional views showing intermediate stages of a method of fabricating a vertical-fin-based FET device according to an embodiment of the present disclosure.

Referring to FIGS. 24A-24E, another embodiment of fabricating a self-aligned source contact for the vertical fin-based FET device is illustrated. As described more fully below, similar processes to those illustrated with reference to FIGS. 22A-22B can be performed to achieve the process stage as shown in FIG. 24A. Specifically, the vertical fin-based FET device 2400 includes a semiconductor substrate 2402, for example, a n+ doped semiconductor substrate, a first semiconductor layer 2404 epitaxially grown on semiconductor substrate 2402, and a plurality of semiconductor fins 2406 formed on first semiconductor layer 2404. Each of the plurality of semiconductor fins 2406 is separated by one of a plurality of recess regions. A semiconductor gate layer 2408 is epitaxially formed in the plurality of recess regions. Like the embodiment shown in FIG. 22A, hardmask layer 2410 is present on top of each of the plurality of semiconductor fins 2406.

Figure 24B:
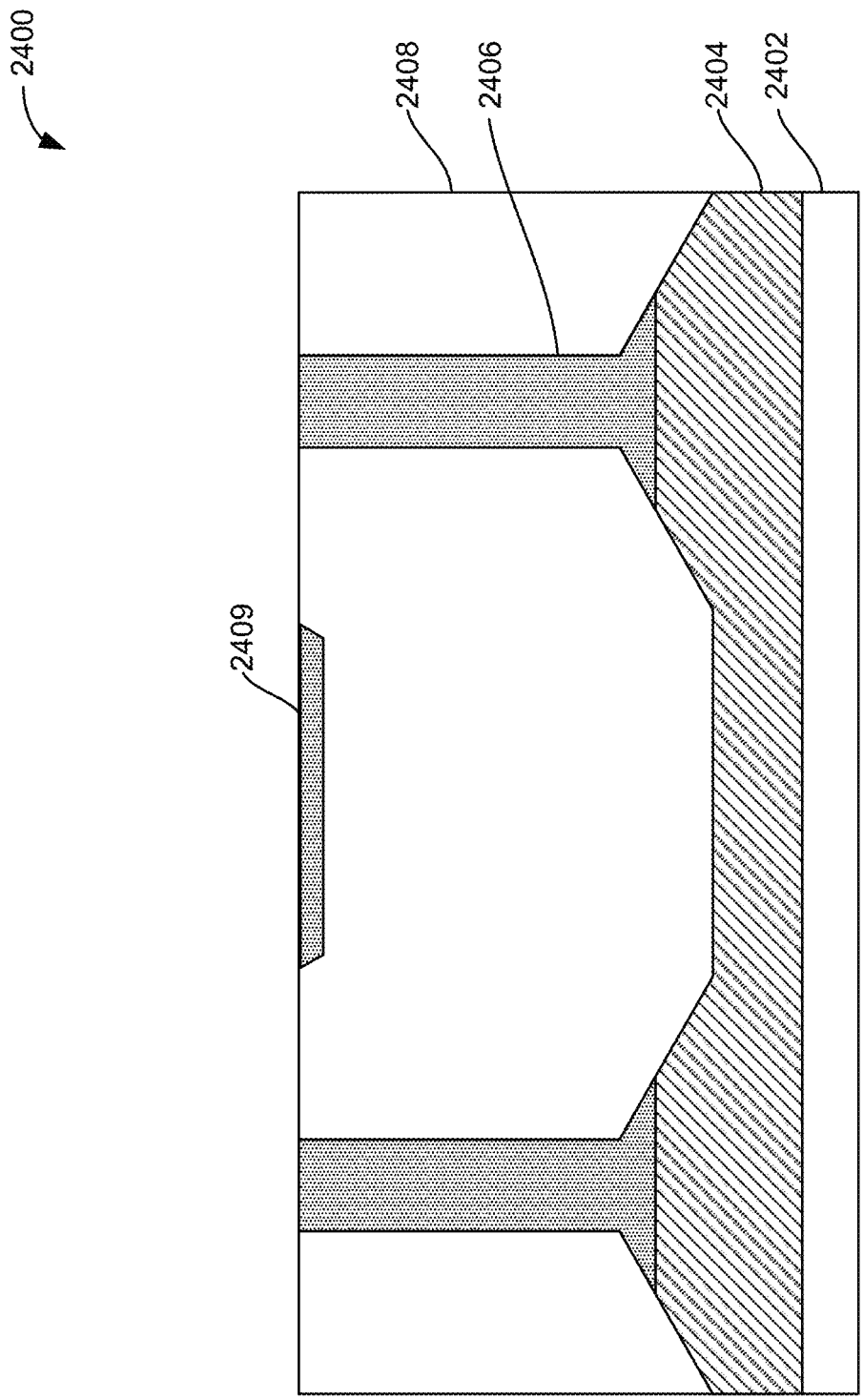

Thereafter, referring to FIG. 24B, hardmask layer 2410 is removed to exposed the upper surface of the plurality of semiconductor fins 2406. In an embodiment, an undoped semiconductor cap layer 2409 is epitaxially regrown in at least part of the upper portion of semiconductor gate layer 2408. In an embodiment, undoped semiconductor cap layer 2409 is epitaxially grown at substantially the central part in the upper portion of semiconductor gate layer 2408 between fins.

Figure 24C:
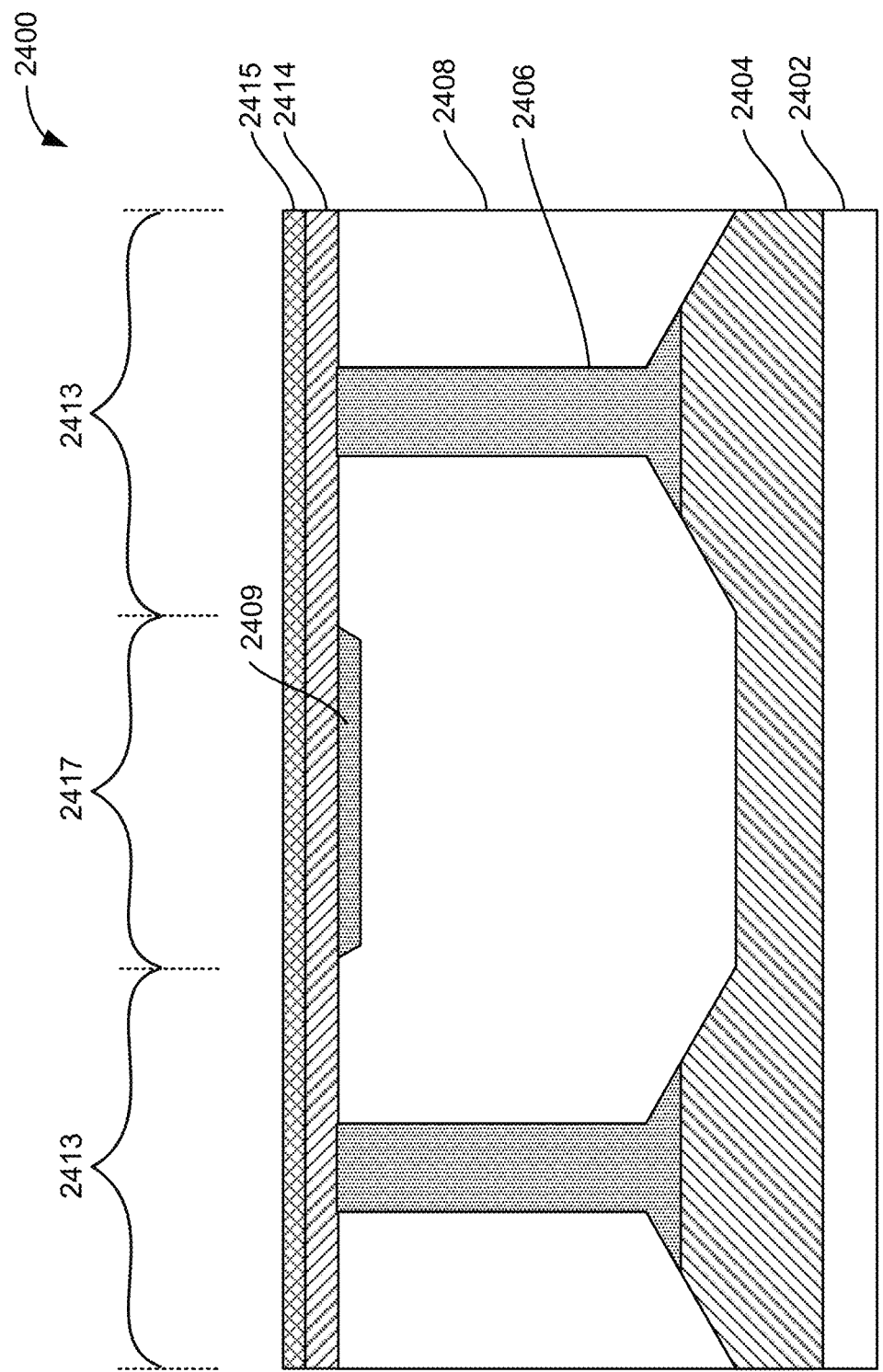

Referring to FIG. 24C, a second semiconductor layer 2414 is epitaxially grown overlying the plurality of semiconductor fins 2406 and semiconductor gate layer 2408. In an embodiment, second semiconductor layer 2414 includes a III-nitride material, such as n-type GaN having a first dopant concentration. Next, a third semiconductor layer 2415 is epitaxially grown on second semiconductor layer 2414. In an embodiment, third semiconductor layer 2415 includes a III-nitride compound, such as n-type GaN having a second dopant concentration greater than the first dopant concentration of second semiconductor layer 2414. For clarity of description, a region aligned with each of the plurality of semiconductor fins 2406 is designated as contact region 2413, and a region aligned with semiconductor gate layer 2408 is designated as gate region 2417. The width of contact region 2413 may be determined according to requirement of the vertical fin-based FET device 2400. In an embodiment, the width of gate region 2417 at least covers the width of undoped semiconductor cap layer 2409.

Figure 24D:
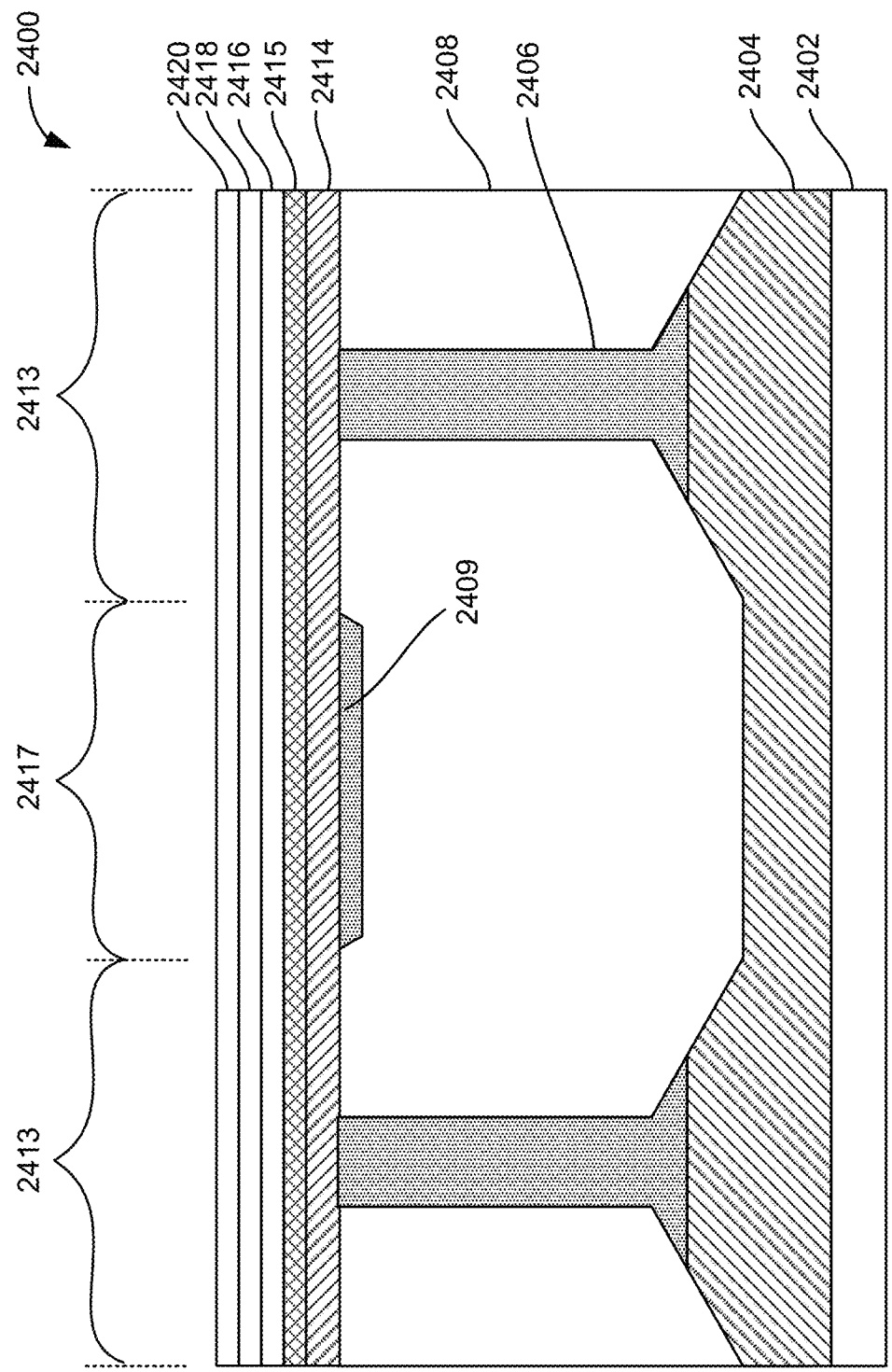

Referring to FIG. 24D, a source metal structure is formed. In some embodiments, the source metal structure contains multiple (two to four) metal or metal alloy layers. Specifically, a first source metal layer 2416 is formed on third semiconductor layer 2415. In an embodiment, first source metal layer 2416 may include titanium having a thickness of about 25 nm. Next, second source metal layer 2418 is formed on first source metal layer 2416 and coupled to first source metal layer 2416. In an embodiment, second source metal layer 2418 may include aluminum having a thickness of 100 nm. Thereafter, third source metal layer 2420 is formed on second source metal layer 2418 and coupled to second source metal layer 2418. In an embodiment, third source metal layer 2420 may include molybdenum having a thickness of about 40 nm. In another embodiment, second source metal layer 2418 may include titanium nitride and third source metal layer 2420 may include aluminum. In some embodiments, third source metal layer 2420 is omitted.

Figure 24E:
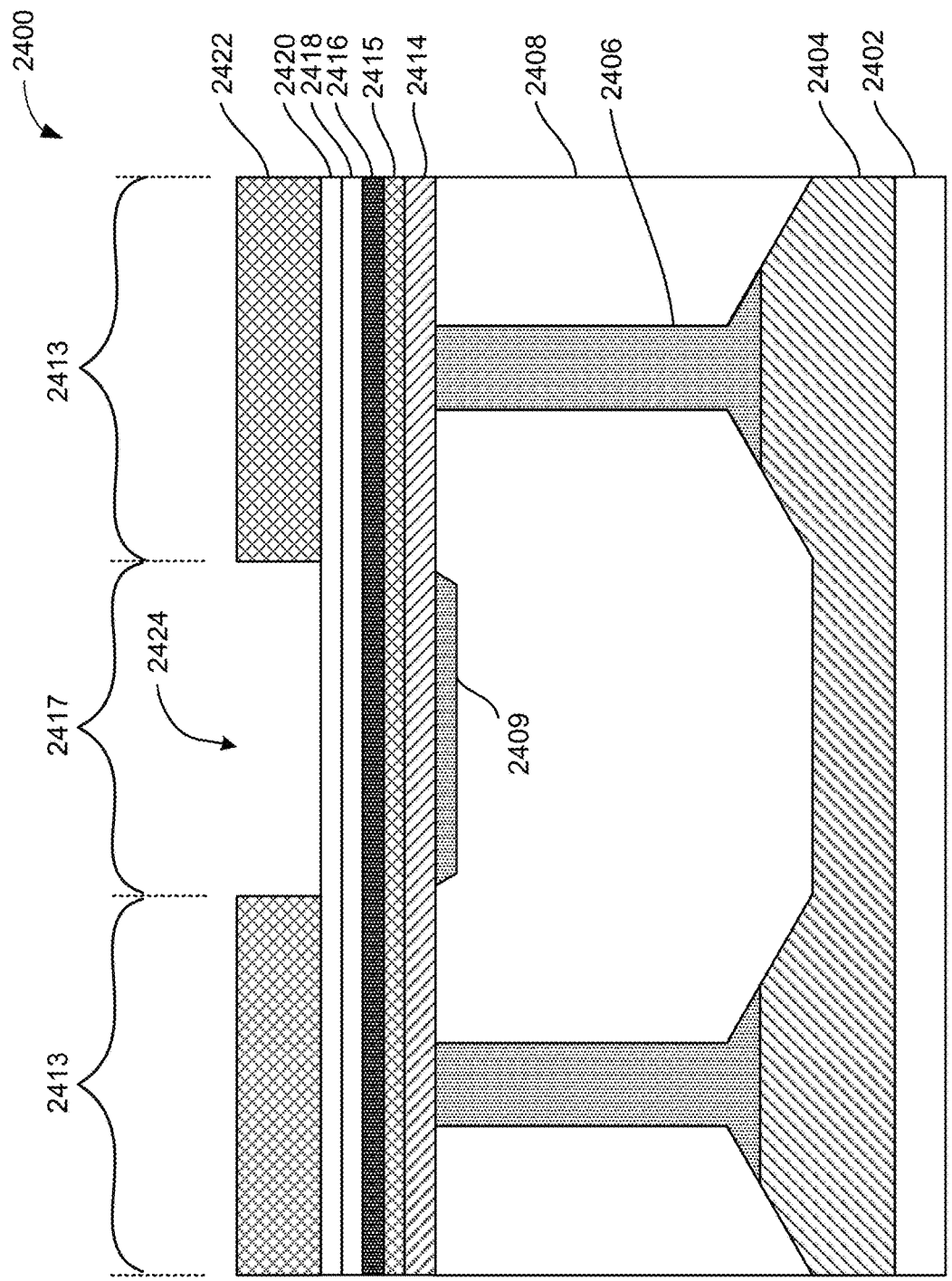
Figure 24F:
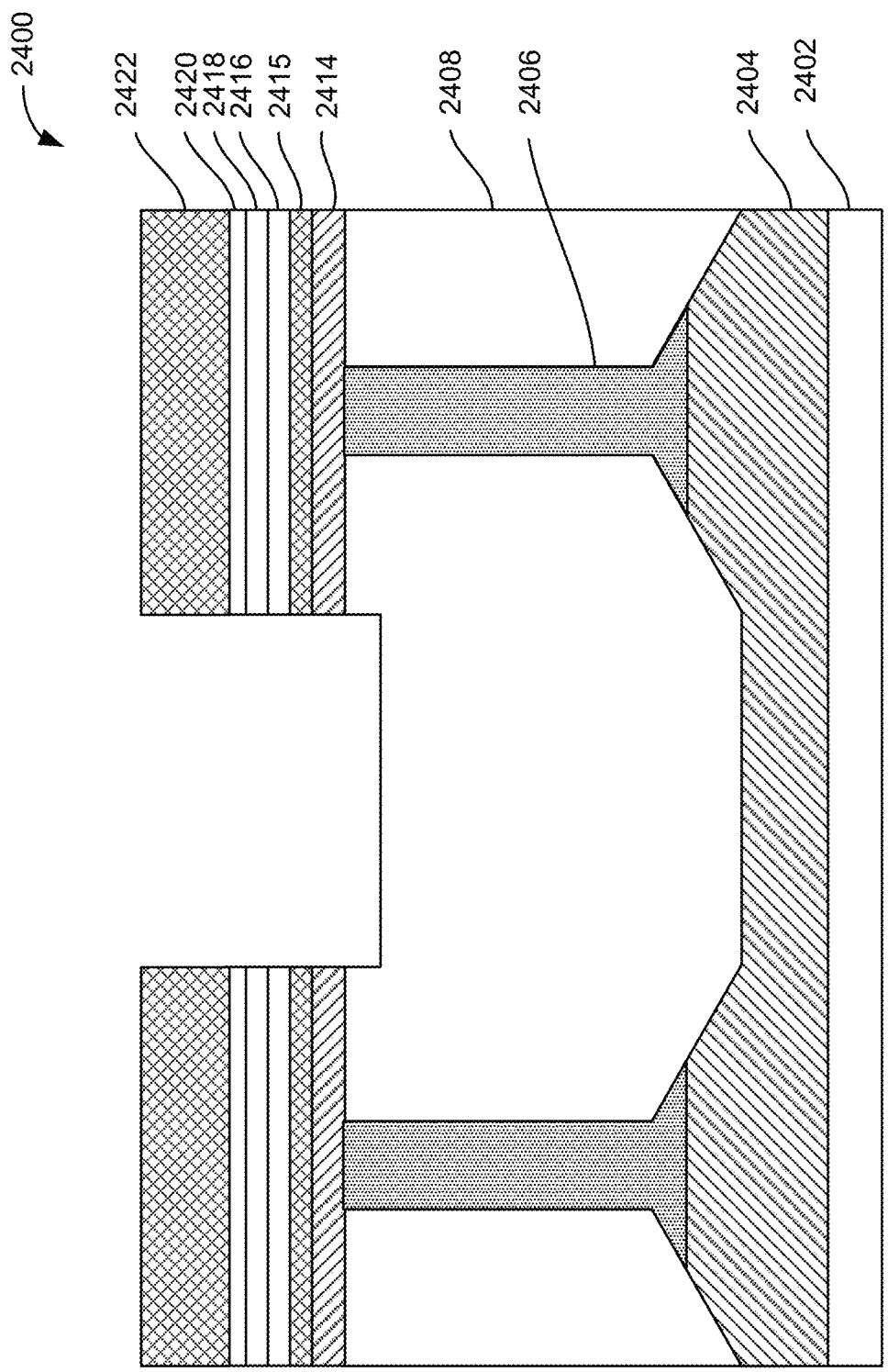

Referring to FIG. 24E, a source metal mask layer 2422 is formed on third source metal layer 2420. Source metal mask layer 2422 has opening 2424 substantially aligned with gate region 2417. Thereafter, referring to FIG. 24F, source metal layers 2420, 2418 and 2416 are etched using source metal mask layer 2422 as a mask to expose the upper surface of third semiconductor layer 2415. In an embodiment, the etch process may include Cl-based chemistry using ME. Next, third and second semiconductor layers 2415 and 2414 are etched using source metal mask layer 2422 as a mask to expose the upper surface of semiconductor gate layer 2408. In an embodiment, the etch process may include Cl-based chemistry using ME. Thereafter, a timed etch process is performed using source metal mask layer 2422 as a mask to extend into a predetermined depth in semiconductor gate layer 2408. In an embodiment, the timed etch process is performed to eliminate undoped semiconductor cap layer 2409 (shown in FIG. 24B).

Figure 24G:
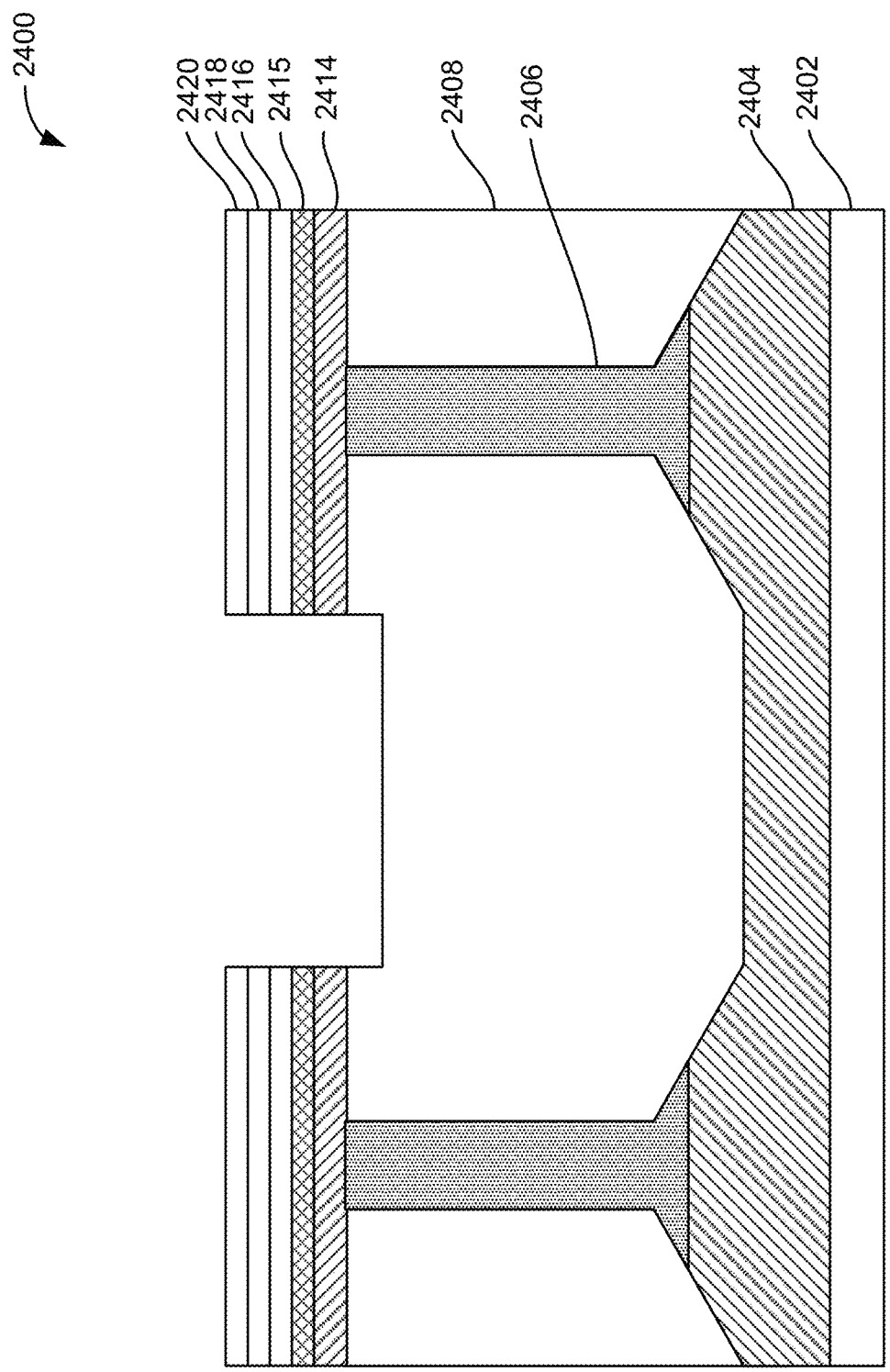

Referring to FIG. 24G, source metal mask layer 2422 (shown in FIG. 24F) is removed. In an embodiment, a thermal annealing process is performed to provide a stable, low contact resistance contact after removal of source metal mask layer 2422. In an embodiment, a rapid thermal annealing (RTA) treatment may be performed in Na at 825° C. for 90 seconds. After the RTA treatment, the source metal structure will have a specific resistance of less than about $10^{-5}$ ohm-cm.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the present disclosure are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the figures, and once an item is defined in one of the figures, it will not need to be explained further in the subsequent figures.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

What is claimed is:

1. A method for forming an alignment contact, the method comprising:
   providing a III-nitride substrate;
   epitaxially growing a first III-nitride layer on the III-nitride substrate, wherein the first III-nitride layer is characterized by a first conductivity type;
   forming a plurality of III-nitride fins on the first III-nitride layer, wherein each the plurality of III-nitride fins is separated by one of a plurality of first recess regions and characterized by a fin surface, wherein the plurality of III-nitride fins are characterized by the first conductivity type;
   forming a III-nitride gate layer disposed between adjacent III-nitride fins of the plurality of III-nitride fins, wherein a surface of the III-nitride gate layer is substantially coplanar with the fin surface;
   epitaxially regrowing a III-nitride source contact portion on each of the plurality of III-nitride fins; and
   forming a source contact structure on the III-nitride source contact portions.

2. The method of claim 1 wherein the III-nitride substrate comprises an n-GaN substrate.

3. The method of claim 1 wherein the first III-nitride layer and the plurality of III-nitride fins comprise an n-GaN epitaxial layer.

4. The method of claim 1, further comprising, prior to forming the plurality of III-nitride fins, forming a hardmask on the fin surface of each of the plurality of III-nitride fins.

5. The method of claim 1 wherein sidewalls of each of the plurality of III-nitride fins are aligned with an m-plane and the fin surface is aligned with a c-plane.

6. The method of claim 1 wherein epitaxially regrowing the III-nitride source contact portion comprises performing a self-limiting growth process on top of each of the plurality of III-nitride fins and the epitaxially regrown III-nitride source contact portion is characterized by an isosceles triangle shape having a base angle in a range between 58 degrees and 65 degrees in a cross-section view.

7. A method for forming an alignment contact, the method comprising:
   providing a III-nitride substrate;
   epitaxially growing a first III-nitride layer on the III-nitride substrate, wherein the first III-nitride layer is characterized by a first conductivity type;
   forming a first hardmask layer on the first III-nitride layer;
   forming a plurality of III-nitride fins on the first III-nitride layer using the first hardmask layer as a mask, wherein each of the plurality of III-nitride fins are separated by one of a plurality of first recess regions and characterized by a fin surface, wherein the plurality of III-nitride fins are characterized by the first conductivity type;
   epitaxially growing a III-nitride gate layer having a second conductivity type opposite to the first conductivity type in the plurality of first recess regions, wherein a surface of the III-nitride gate layer is substantially coplanar with the fin surface;
   forming a first dielectric layer on the first hardmask layer and the III-nitride gate layer, wherein the first dielectric layer comprises a contact region aligned with each of the plurality of III-nitride fins and a gate region aligned with the III-nitride gate layer;
   forming a photoresist layer on the gate region of the first dielectric layer;
   etching the contact region of the first dielectric layer using the photoresist layer as a mask to form a second recess region, wherein an upper surface of each of the plurality of the III-nitride fins and a portion of upper surface of the III-nitride gate layer surrounding each of the plurality of III-nitride fins are exposed from a bottom surface of the second recess region;
   removing the photoresist layer;
   epitaxially regrowing a III-nitride source contact portion in the second recess region; and
   removing the first dielectric layer.

8. The method of claim 7 wherein a width of the contact region is at least three times of that of a width of each of the plurality of III-nitride fins.

9. The method of claim 7, further comprising:
   forming a source metal mask layer having an opening aligned with the III-nitride source contact portion on each of the plurality of III-nitride fins;
   forming a first source metal layer coupled to the III-nitride source contact portion;
   forming a second source metal layer coupled to the first source metal layer;
   forming a third source metal layer coupled to the second source metal layer; and
   removing the source metal mask layer.

10. The method of claim 7 wherein epitaxially regrowing the III-nitride source contact portion comprises performing a self-limiting growth process on top of each of the plurality of III-nitride fins.

11. The method of claim 7 wherein the III-nitride source contact portion is characterized by an isosceles triangle shape having a base angle in a range between 58 degrees and 65 degrees in a cross-section view.

12. The method of claim 7 wherein the III-nitride gate layer is disposed in the plurality of first recess regions between adjacent III-nitride fins of the plurality of III-nitride fins.

* * * * *